United States Patent
Hung et al.

(10) Patent No.: US 12,087,639 B2
(45) Date of Patent: *Sep. 10, 2024

(54) FIN FIELD-EFFECT TRANSISTOR DEVICES AND METHODS OF FORMING THE SAME

(71) Applicant: Taiwan Semiconductor Manufacturing Co., Ltd., Hsinchu (TW)

(72) Inventors: Chih-Chang Hung, Hsinchu (TW); Chieh-Ning Feng, Taichung (TW); Chun-Liang Lai, Hsinchu (TW); Yih-Ann Lin, Jhudong Township (TW); Ryan Chia-Jen Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 101 days.

This patent is subject to a terminal disclaimer.

(21) Appl. No.: 17/883,898

(22) Filed: Aug. 9, 2022

(65) Prior Publication Data

US 2022/0384271 A1 Dec. 1, 2022

Related U.S. Application Data

(60) Continuation of application No. 17/169,060, filed on Feb. 5, 2021, now Pat. No. 11,495,501, which is a
(Continued)

(51) Int. Cl.
*H01L 21/8234* (2006.01)
*H01L 21/308* (2006.01)
(Continued)

(52) U.S. Cl.
CPC .. *H01L 21/823481* (2013.01); *H01L 21/3086* (2013.01); *H01L 21/823431* (2013.01);
(Continued)

(58) Field of Classification Search
CPC ......... H01L 21/823481; H01L 21/3086; H01L 21/823431; H01L 21/823437;
(Continued)

(56) References Cited

U.S. PATENT DOCUMENTS 8,487,378 B2 7/2013 Goto et al.
8,685,867 B1 4/2014 Danek et al.
(Continued)

FOREIGN PATENT DOCUMENTS

KR 20150128532 A 11/2015
KR 101785803 B1 10/2017
(Continued)

*Primary Examiner* — Julia Slutsker
(74) *Attorney, Agent, or Firm* — Slater Matsil, LLP

(57) ABSTRACT

A method of forming a semiconductor device includes forming a first fin and a second fin protruding above a substrate; forming isolation regions on opposing sides of the first fin and the second fin; forming a metal gate over the first fin and over the second fin, the metal gate being surrounded by a first dielectric layer; and forming a recess in the metal gate between the first fin and the second fin, where the recess extends from an upper surface of the metal gate distal the substrate into the metal gate, where the recess has an upper portion distal the substrate and a lower portion between the upper portion and the substrate, where the upper portion has a first width, and the lower portion has a second width larger than the first width, the first width and the second width measured along a longitudinal direction of the metal gate.

20 Claims, 33 Drawing Sheets

Related U.S. Application Data division of application No. 16/248,242, filed on Jan. 15, 2019, now Pat. No. 10,916,477.

(60) Provisional application No. 62/738,686, filed on Sep. 28, 2018.

(51) Int. Cl.
  *H01L 29/08* (2006.01)
  *H01L 29/66* (2006.01)
  *H01L 29/78* (2006.01)

(52) U.S. Cl.
  CPC ........ *H01L 21/823437* (2013.01); *H01L 21/823468* (2013.01); *H01L 29/0847* (2013.01); *H01L 29/66545* (2013.01); *H01L 29/6659* (2013.01); *H01L 29/6681* (2013.01); *H01L 29/7834* (2013.01); *H01L 29/7851* (2013.01)

(58) Field of Classification Search
  CPC ......... H01L 21/823468; H01L 29/0847; H01L 29/66545; H01L 29/6659; H01L 29/6681; H01L 29/7834; H01L 29/7851; H01L 2029/7858; H01L 27/0886; H01L 29/7853; H01L 29/165; H01L 29/7848
  See application file for complete search history.

(56) References Cited

U.S. PATENT DOCUMENTS

| | | | |
|---|---|---|---|
| 8,729,634 | B2 | 5/2014 | Shen et al. |
| 8,826,213 | B1 | 9/2014 | Ho et al. |
| 8,887,106 | B2 | 11/2014 | Ho et al. |
| 9,627,379 | B1 | 4/2017 | Chang et al. |
| 9,768,170 | B2 | 9/2017 | Chang et al. |
| 9,899,271 | B2 | 2/2018 | Chang et al. |
| 2014/0282326 | A1 | 9/2014 | Chen et al. |
| 2015/0325646 | A1 | 11/2015 | Lai et al. |
| 2016/0056181 | A1* | 2/2016 | Anderson ....... H01L 21/823821 438/157 |
| 2016/0351568 | A1* | 12/2016 | Chang ................ H01L 29/0653 |
| 2017/0278928 | A1 | 9/2017 | Tung |
| 2018/0233500 | A1 | 8/2018 | Cheng |
| 2019/0131428 | A1 | 5/2019 | Huang et al. |
| 2019/0198389 | A1 | 6/2019 | Ren et al. |
| 2019/0218103 | A1 | 7/2019 | Iwang et al. |

FOREIGN PATENT DOCUMENTS

| | | |
|---|---|---|
| TW | 201642326 A | 12/2016 |
| TW | 201727833 A | 8/2017 |
| TW | 201729264 A | 8/2017 |
| TW | 201733123 A | 9/2017 |

* cited by examiner

FIN FIELD-EFFECT TRANSISTOR DEVICES AND METHODS OF FORMING THE SAME

PRIORITY CLAIM AND CROSS-REFERENCE

This application is a continuation of Ser. No. 17/169,060, filed Feb. 5, 2021, entitled "Fin Field-Effect Transistor Devices and Methods of Forming the Same," which is divisional of U.S. patent application Ser. No. 16/248,242, filed Jan. 15, 2019 and entitled "Fin Field-Effect Transistor Devices and Methods of Forming the Same," now U.S. Pat. No. 10,916,477 issued Feb. 9, 2021, which claims priority to U.S. Provisional Patent Application No. 62/738,686, filed Sep. 28, 2018 and entitled "Fin Field-Effect Transistor Devices and Methods of Forming the Same," which applications are hereby incorporated by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
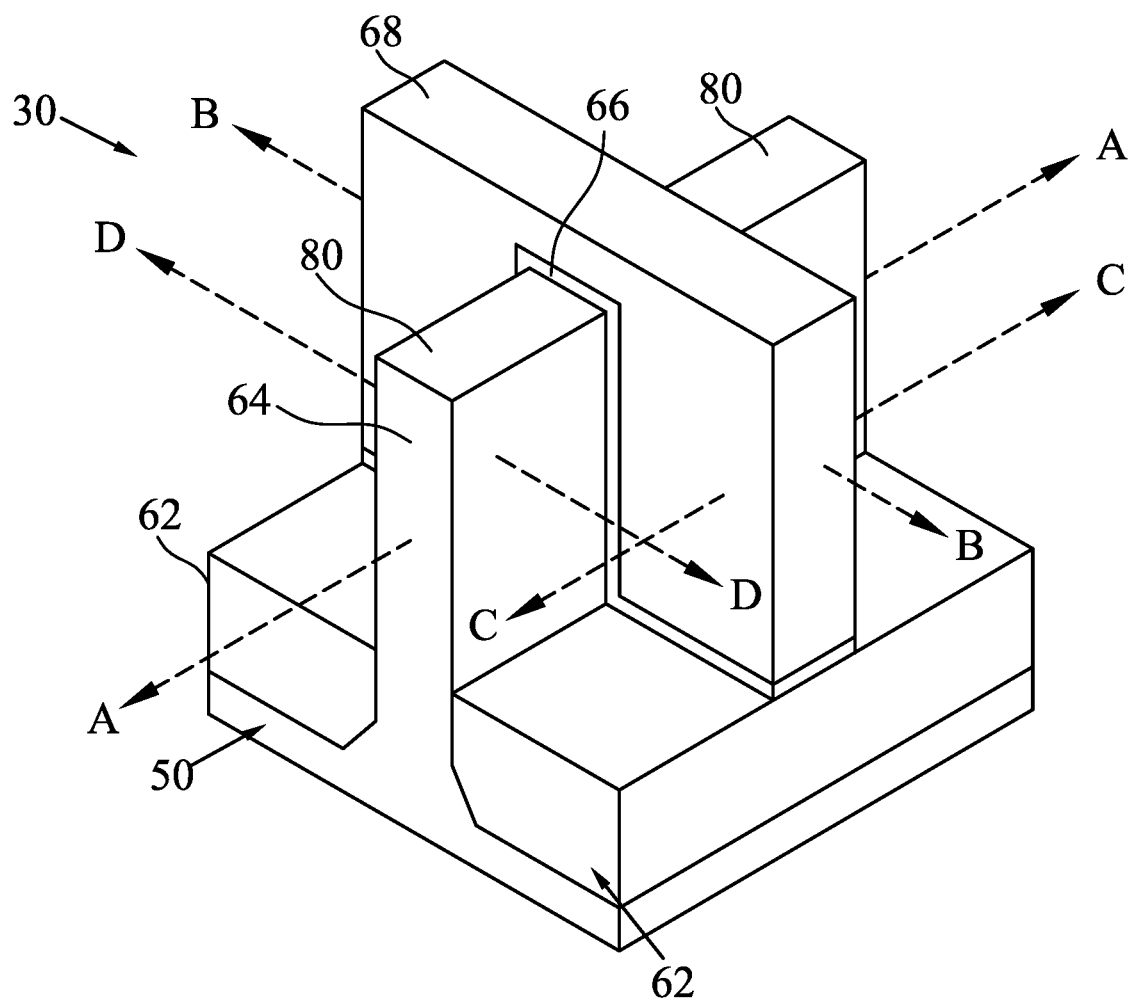
FIG. 1 is a perspective view of a Fin Field-Effect Transistor (FinFET), in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the description herein, unless otherwise stated, the same reference numeral in different figures refer to the same or similar element formed by a same or similar method using a same or similar material(s).

Embodiments of the present disclosure are discussed in the context of forming a semiconductor device, and in particular, in the context of a cut metal gate process used in forming Fin Field-Effect Transistor (FinFET) devices during semiconductor fabrication. In some embodiments, in a cut metal gate process, the recess formed in the metal gate has an enlarged lower portion. The enlarged lower portion allows better removal of the materials of the metal gate in the cut metal gate process, thus avoiding or reducing the likelihood of electrical short between metal gates formed by the cut metal gate process.

FIG. 1 illustrates an example of a FinFET 30 in a perspective view. The FinFET 30 includes a substrate 50 and a fin 64 protruding above the substrate 50. The substrate 50 has isolation regions 62 formed thereon, and the fin 64 protrudes above and between neighboring isolation regions 62. A gate dielectric 66 is along sidewalls and over a top surface of the fin 64, and a gate electrode 68 (also referred to as a gate) is over the gate dielectric 66. Source/drain regions 80 are in the fin 64 on opposing sides of the gate dielectric 66 and gate electrode 68. FIG. 1 further illustrates reference cross-sections that are used in later figures. Cross-section B-B extends along a longitudinal axis of the gate electrode 68 of the FinFET 30. Cross-section A-A is perpendicular to cross-section B-B and is along a longitudinal axis of the fin 64 and in a direction of, for example, a current flow between the source/drain regions 80. Cross-section C-C is parallel to cross-section A-A and outside the fin 64 in FIG. 1, and may be along a longitudinal axis of another fin (not shown in FIG. 1) adjacent to the fin 64 in FIG. 1. Cross-section D-D is parallel to cross-section B-B and is through the source/drain regions 80. Cross-sections A-A, B-B, and C-C are also illustrated in the plan views of FIGS. 9 and 22. Subsequent figures refer to these reference cross-sections for clarity.

FIGS. 2-6, 7A-7C, 8A-8C, 9-11, 12A, 12B, 13A, 13B, 14A, 14B, 15A-15C, and 16A-16C illustrate various views (e.g., cross-sectional view, plan view) of a FinFET device 100 at various stages of fabrication, in accordance with an embodiment. The FinFET device 100 is similar to the FinFET 30 in FIG. 1, but with multiple fins and multiple gates. Throughout the description herein, figures with the same numeral but different letters (e.g., 12A and 12B) illustrate cross-sectional views of the FinFET device (e.g., 100, 200, 300, or 400) at a same stage of processing, but along different cross-sections.

Figure 4:
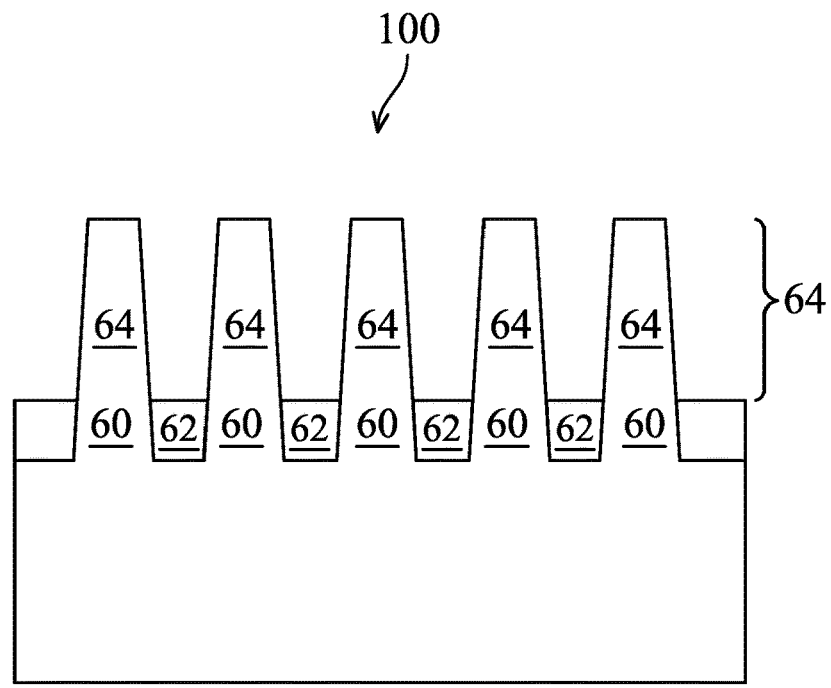
Figure 5:
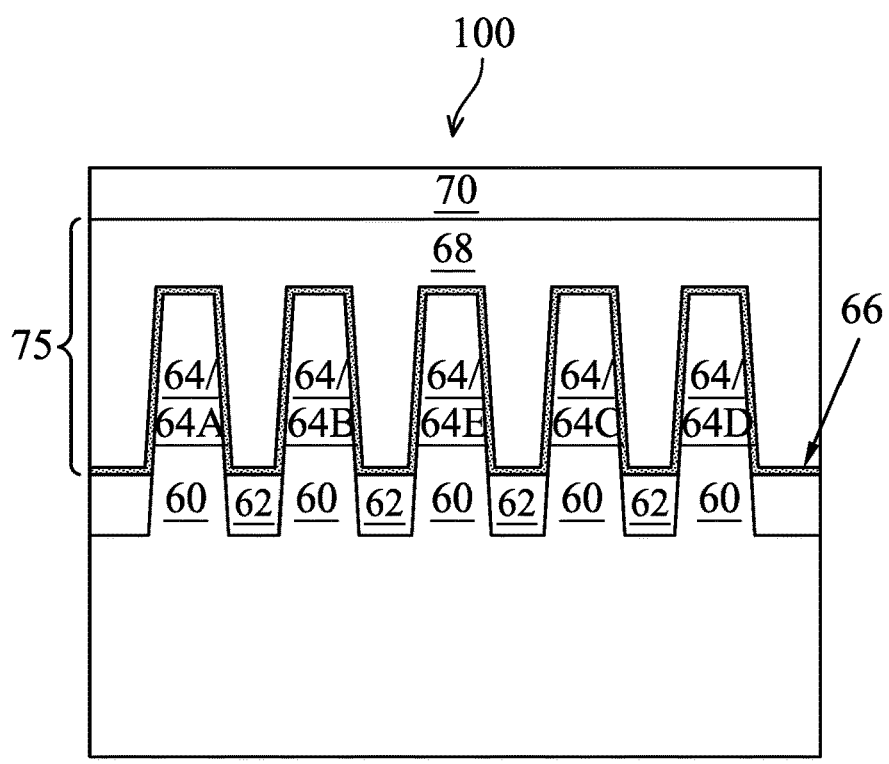
Figure 6:
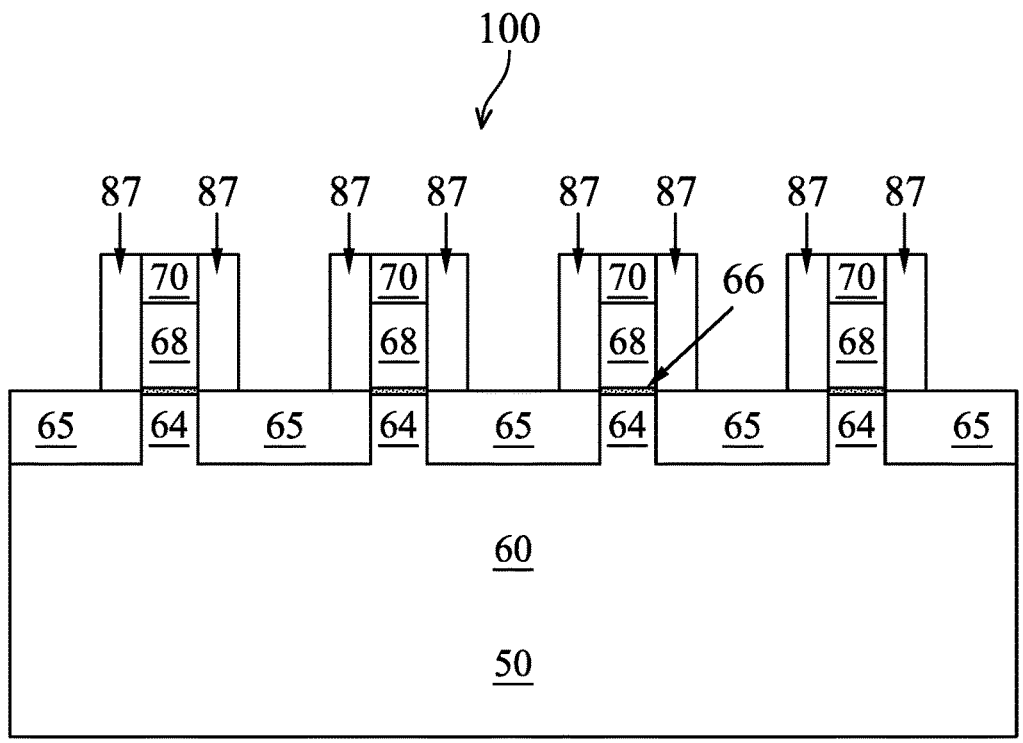
Figure 7A:
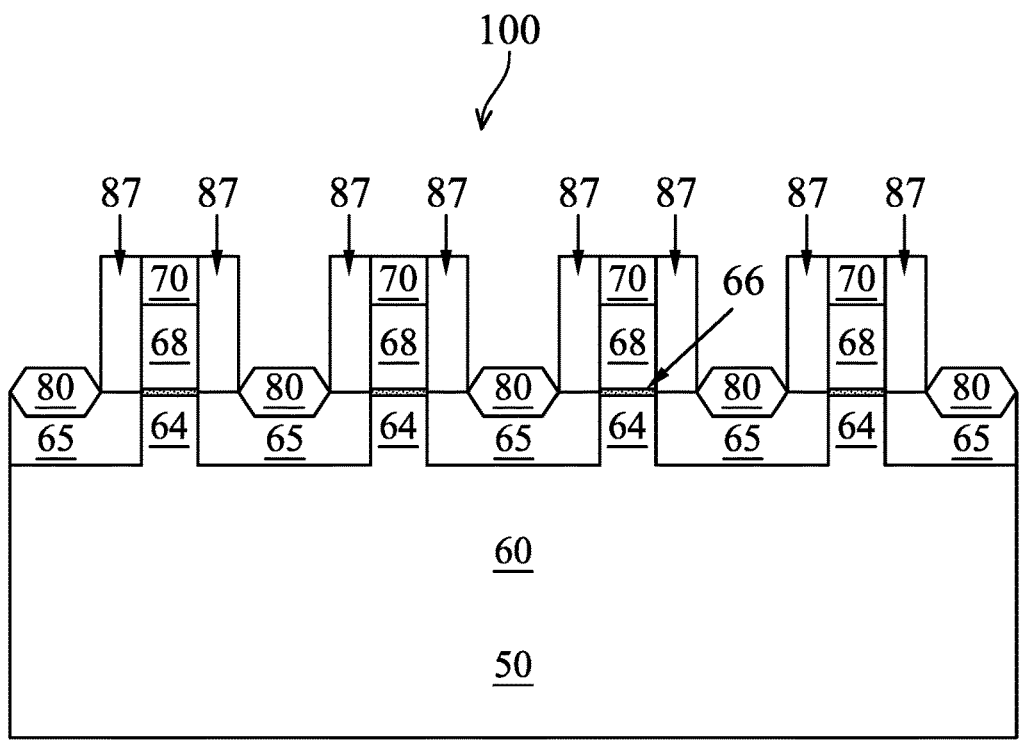
Figure 7B:
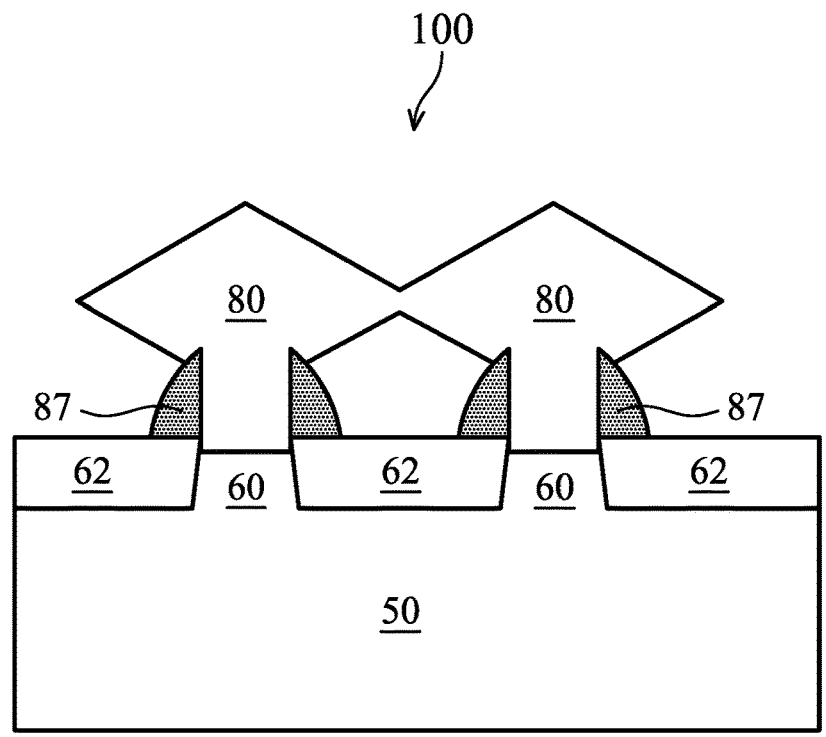
Figure 7C:
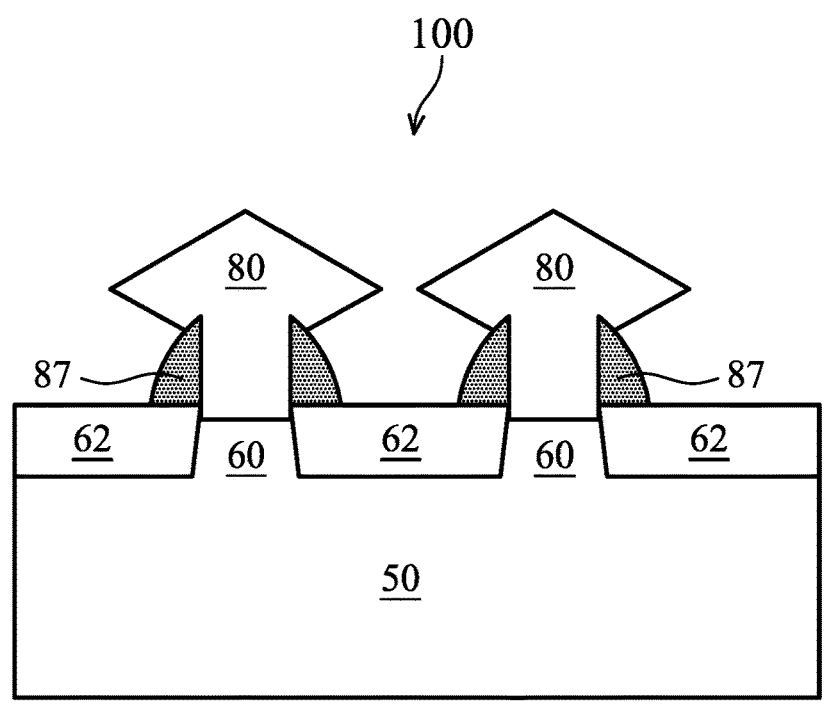
Figure 8A:
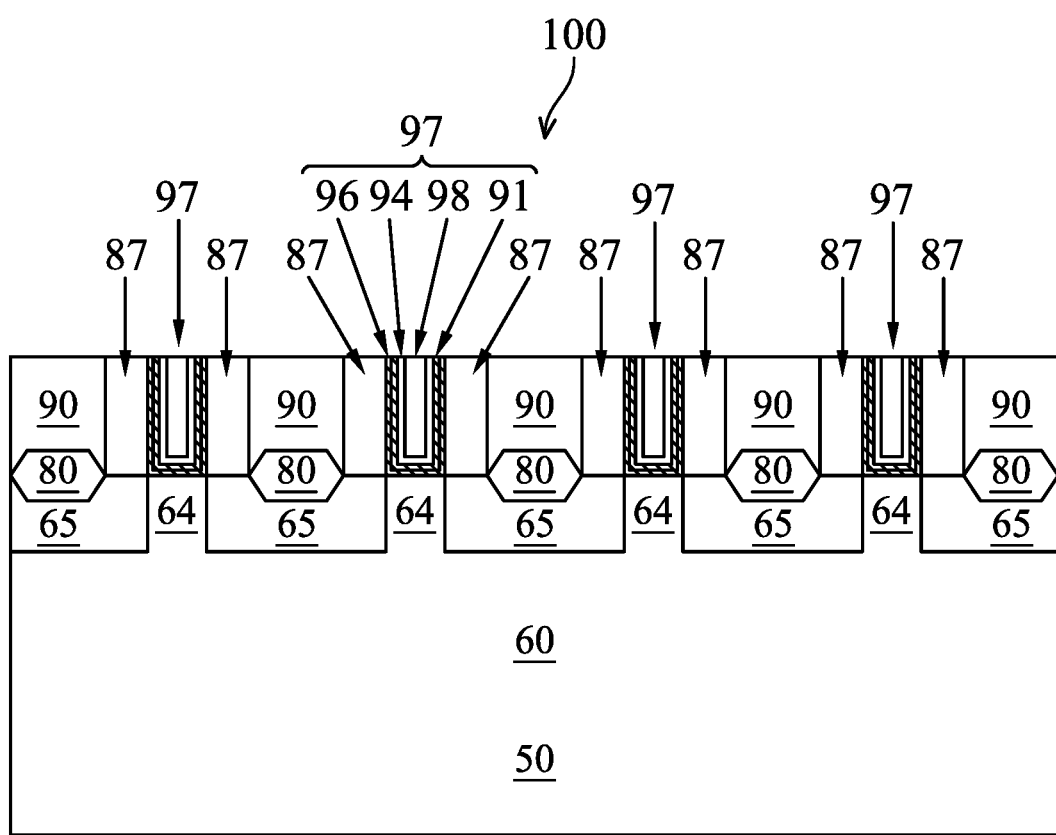
Figure 8B:
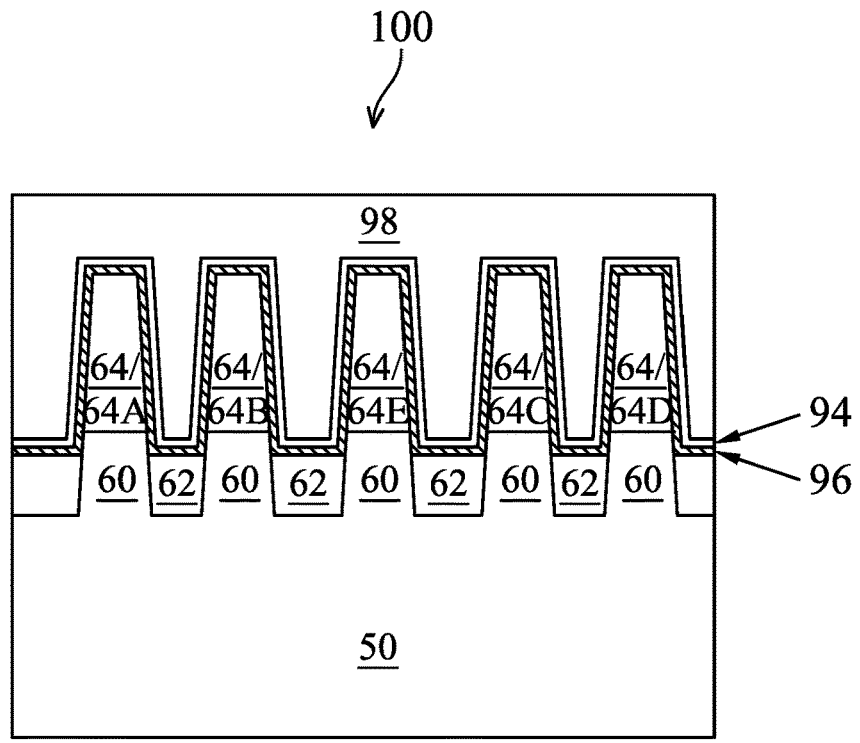
Figure 8C:
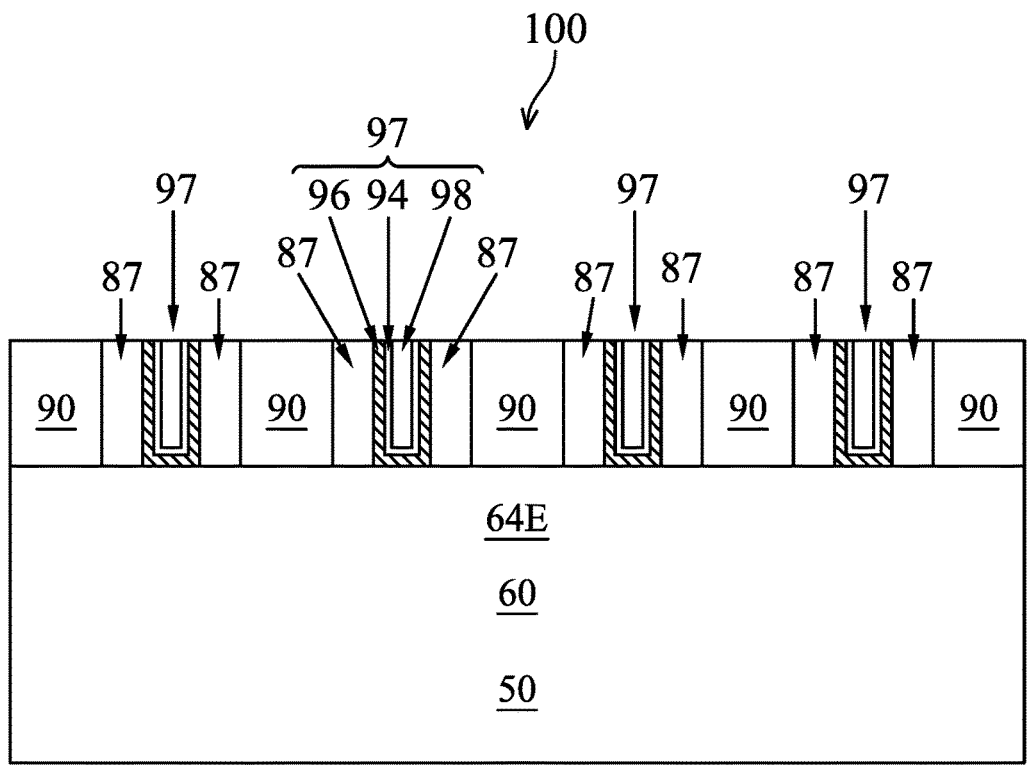
Figure 9:
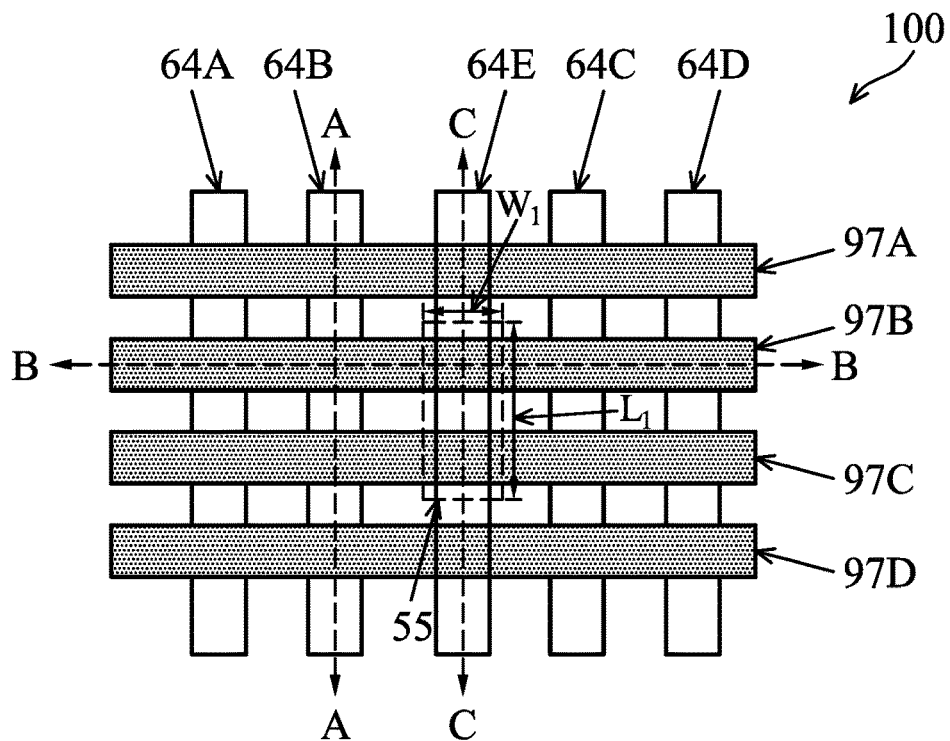
Figure 15A:
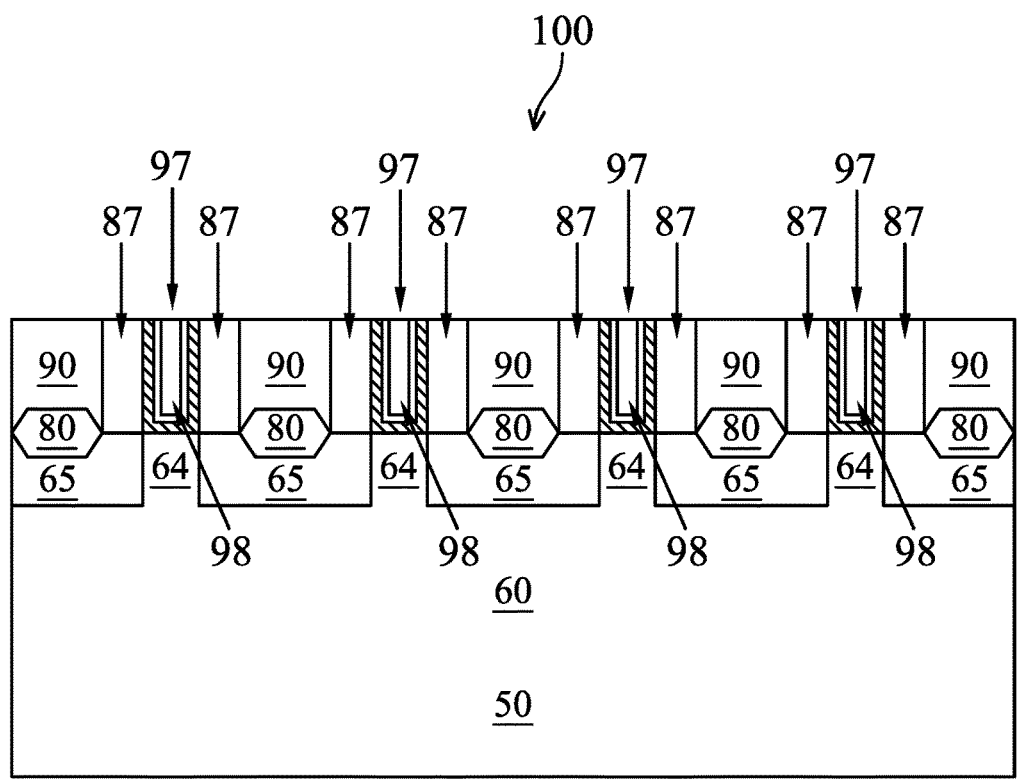
Figure 15B:
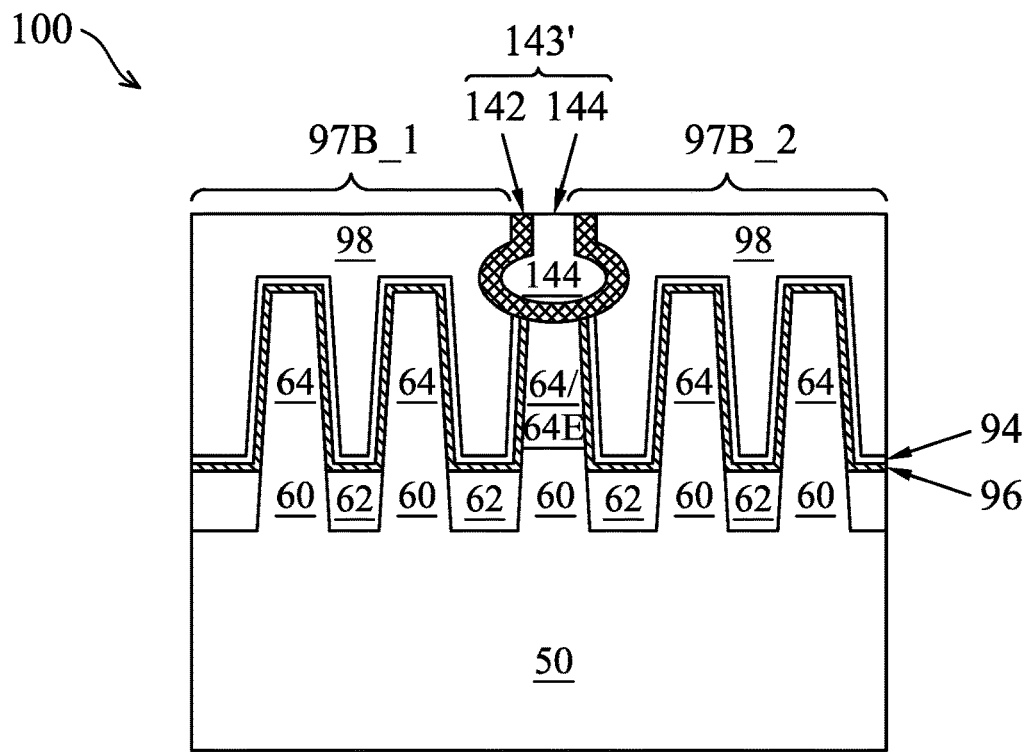
Figure 15C:
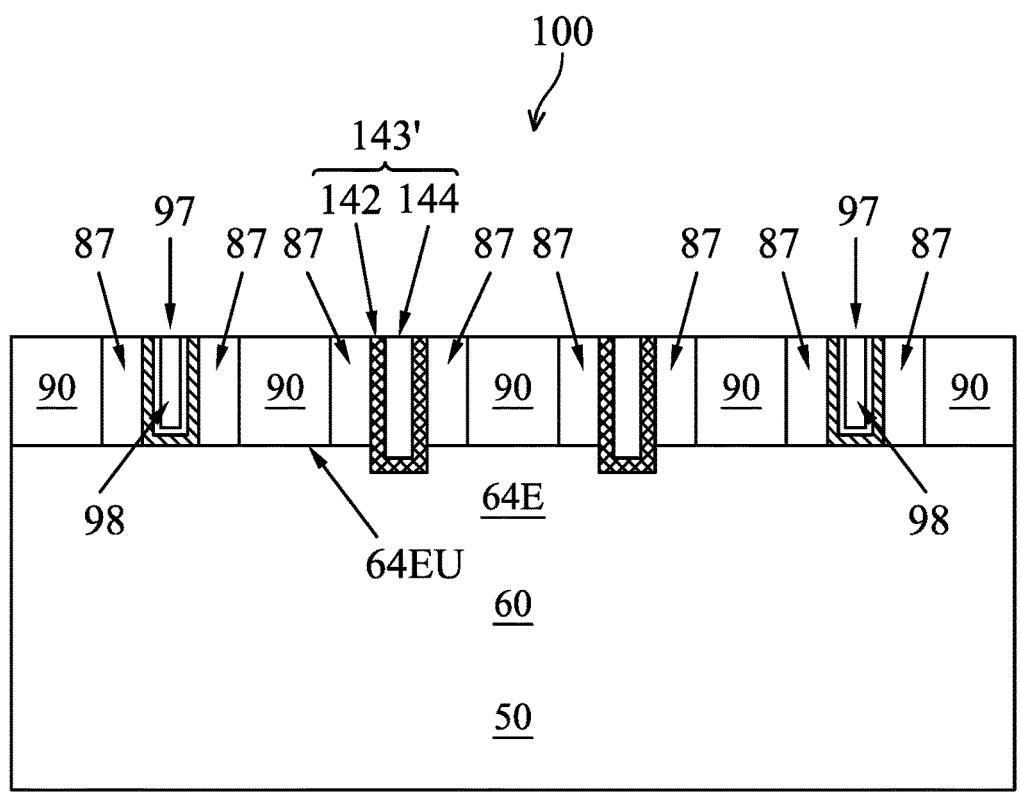
Figure 16A:
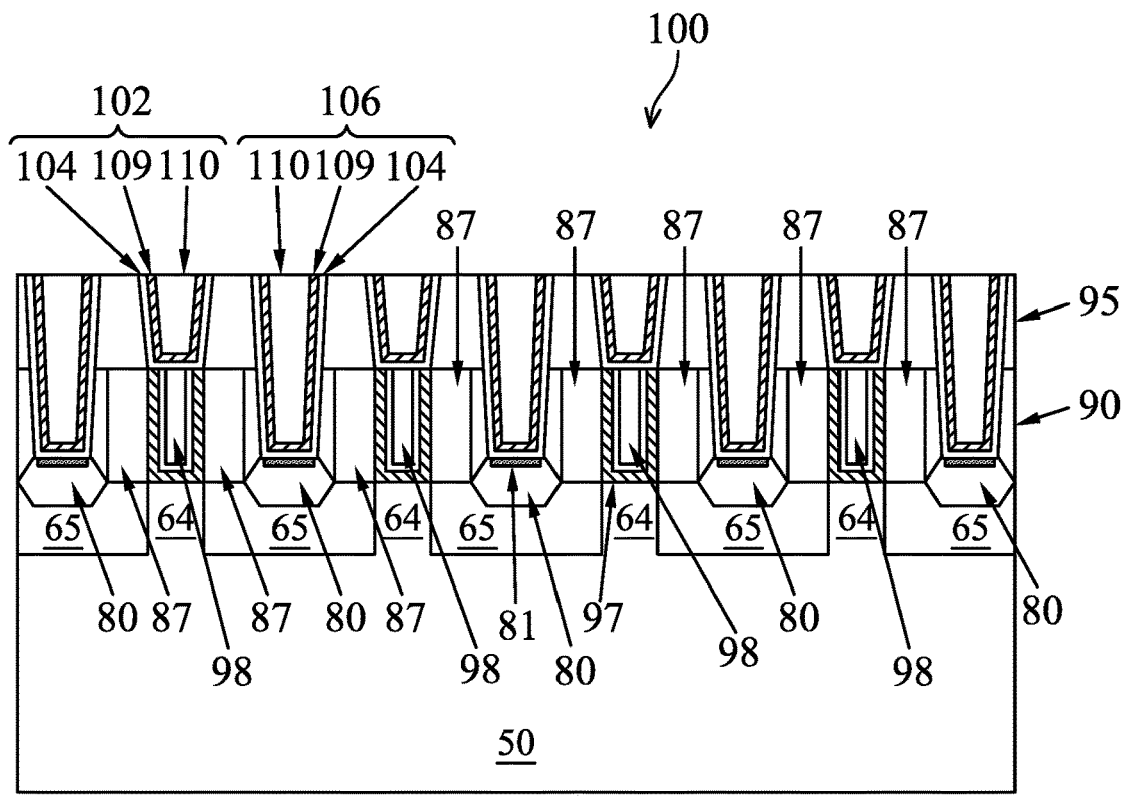
Figure 16B:
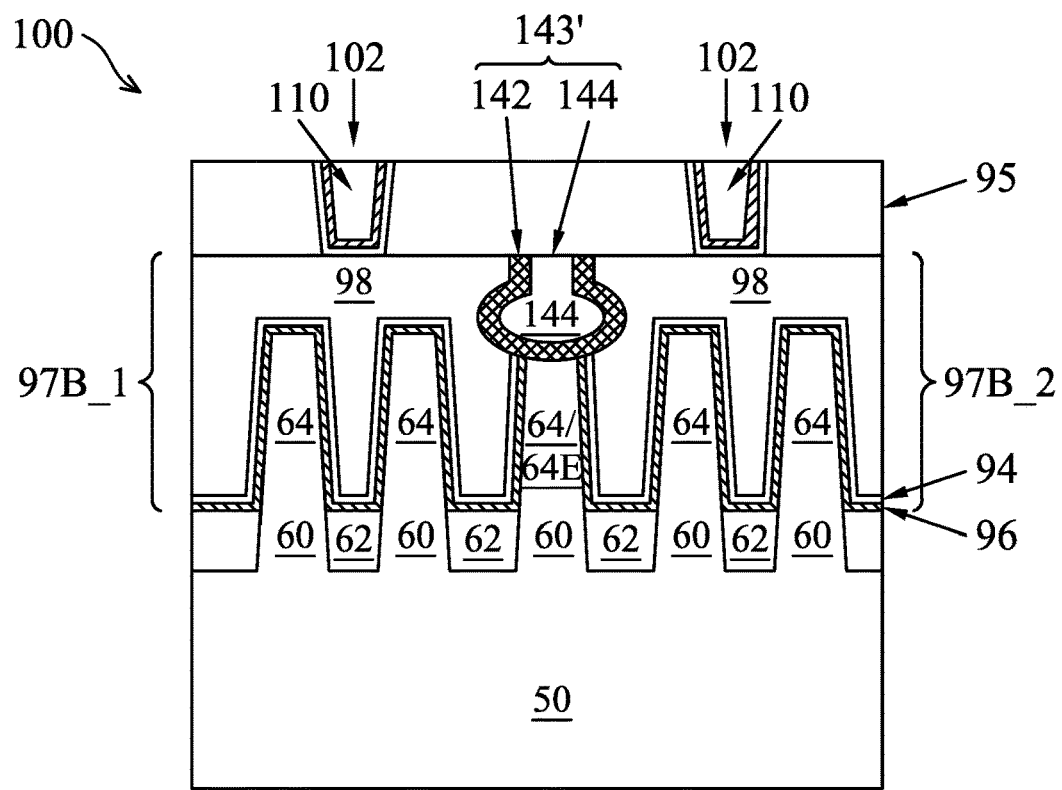
Figure 16C:
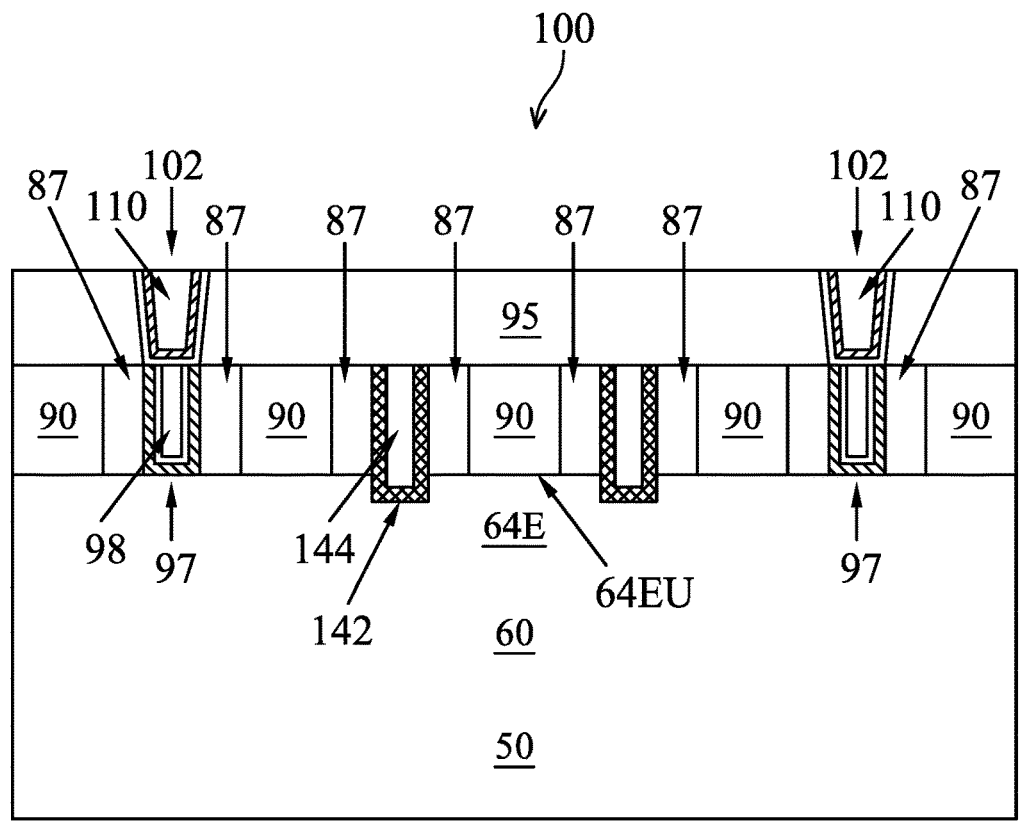

FIGS. 2-5 illustrate cross-sectional views of the FinFET device 100 along cross-section B-B, and FIGS. 6, 7A, 8A illustrate cross-sectional views of the FinFET device 100 along cross-section A-A. FIGS. 7B and 7C illustrate various embodiment cross-sectional views of the FinFET device 100 along cross-section D-D. FIGS. 8B and 8C illustrate the FinFET device 100 of FIG. 8A, but along cross-sections B-B and C-C, respectively. FIG. 9 is a plan view of the FinFET device 100. FIGS. 10, 11, 12A, 13A, and 14A illustrate cross-sectional views of the FinFET device 100 along cross-sections C-C, and FIGS. 12B, 13B, and 14B illustrate cross-sectional views of the FinFET device 100 along cross-sections B-B. FIGS. 15A, 15B, and 15C illustrate cross-sectional views of the FinFET device 100 along cross-sections A-A, B-B, and C-C, respectively. FIGS. 16A, 16B, and 16C illustrate cross-sectional views of the FinFET device 100 along cross-sections A-A, B-B, and C-C, respectively.

Figure 2:
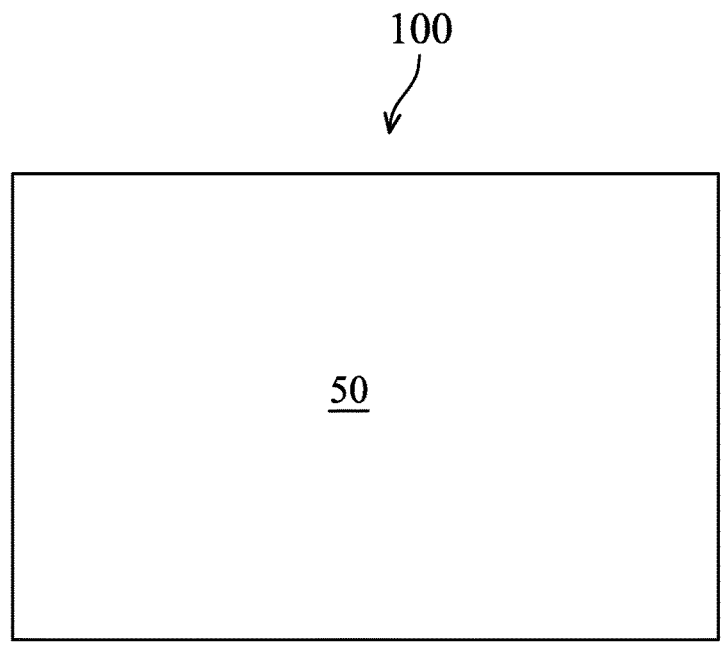
FIGS. 2-6, 7A-7C, 8A-8C, 9-11, 12A, 12B, 13A, 13B, 14A, 14B, 15A-15C, and 16A-16C illustrate various views (e.g., cross-sectional view, plan view) of a FinFET device at various stages of fabrication, in accordance with an embodiment.

FIG. 2 illustrates a cross-sectional view of a substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 3:
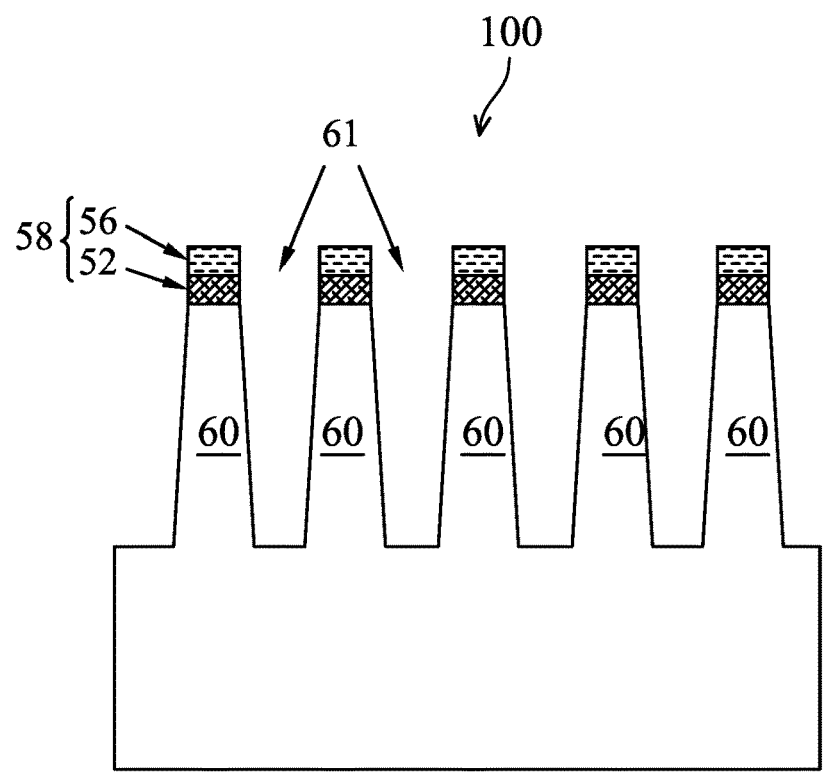

Referring next to FIG. 3, the substrate 50 shown in FIG. 2 is patterned using, for example, photolithography and etching techniques. For example, a mask layer, such as a pad oxide layer 52 and an overlying pad nitride layer 56, is formed over the substrate 50. The pad oxide layer 52 may be a thin film comprising silicon oxide formed, for example, using a thermal oxidation process. The pad oxide layer 52 may act as an adhesion layer between the substrate 50 and the overlying pad nitride layer 56 and may act as an etch stop layer for etching the pad nitride layer 56. In some embodiments, the pad nitride layer 56 is formed of silicon nitride, silicon oxynitride, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride layer 56 to form a patterned mask 58, as illustrated in FIG. 3.

The patterned mask 58 is subsequently used to pattern exposed portions of the substrate 50 to form trenches 61, thereby defining semiconductor strips 60 between adjacent trenches 61 as illustrated in FIG. 3. In some embodiments, the semiconductor strips 60 are formed by etching trenches in the substrate 50 using, for example, reactive ion etch (RIE), neutral beam etch (NBE), the like, or a combination thereof. The etch may be anisotropic. In some embodiments, the trenches 61 may be strips (viewed from in the top) parallel to each other, and closely spaced with respect to each other. In some embodiments, the trenches 61 may be continuous and surround the semiconductor strips 60. After semiconductor strips 60 are formed, the patterned mask 58 may be removed by etching or other suitable method.

FIG. 4 illustrates the formation of an insulation material between neighboring semiconductor strips 60 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material (and, if present, the patterned mask 58) and form top surfaces of the isolation regions 62 and top surfaces of the semiconductor strips 60 that are coplanar (not shown).

In some embodiments, the isolation regions 62 include a liner, e.g., a liner oxide (not shown), at the interface between the isolation region 62 and the substrate 50/semiconductor strip 60. In some embodiments, the liner oxide is formed to reduce crystalline defects at the interface between the substrate 50 and the isolation region 62. Similarly, the liner oxide may also be used to reduce crystalline defects at the interface between the semiconductor strip 60 and the isolation region 62. The liner oxide (e.g., silicon oxide) may be a thermal oxide formed through a thermal oxidation of a surface layer of substrate 50, although other suitable method may also be used to form the liner oxide.

Next, the isolation regions 62 are recessed to form shallow trench isolation (STI) regions. The isolation regions 62 are recessed such that the upper portions of the semiconductor strips 60 protrude from between neighboring isolation regions 62 and form semiconductor fins 64 (also referred to as fins 64). The top surfaces of the isolation regions 62 may have a flat surface (as illustrated), a convex surface, a concave surface (such as dishing), or a combination thereof. The top surfaces of the isolation regions 62 may be formed flat, convex, and/or concave by an appropriate etch. The isolation regions 62 may be recessed using an acceptable etching process, such as one that is selective to the material of the isolation regions 62. For example, a dry etch or a wet etch using dilute hydrofluoric (dHF) acid may be performed to recess the isolation regions 62.

FIGS. 2 through 4 illustrate an embodiment of forming fins 64, but fins may be formed in various different processes. In one example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins. In another example, heteroepitaxial structures can be used for the fins. For example, the semiconductor strips can be recessed, and a material different from the semiconductor strips may be epitaxially grown in their place.

In an even further example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins.

In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins may comprise silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

FIG. 5 illustrates the formation of a dummy gate structure 75 over the semiconductor fins 64. The dummy gate structure 75 includes gate dielectric 66 and gate 68, in some embodiments. The dummy gate structure 75 may be formed by patterning a mask layer, a gate layer and a gate dielectric layer, where the mask layer, the gate layer and the gate dielectric layer comprise a same material as the mask 70, the gate 68, and the gate dielectric 66, respectively. To form the dummy gate structure 75, the gate dielectric layer is formed on the semiconductor fins 64 and the isolation regions 62 in the example of FIG. 5. The gate dielectric layer may be, for example, silicon oxide, silicon nitride, multilayers thereof, or the like, and may be deposited or thermally grown using a suitable formation method.

The gate layer is formed over the gate dielectric layer, and the mask layer is formed over the gate layer. The gate layer may be deposited over the gate dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the gate dielectric layer, the gate layer, and the mask layer are formed, the mask layer may be patterned using acceptable photolithography and etching techniques to form mask 70. The pattern of the mask 70 then may be transferred to the gate layer and the gate dielectric layer by a suitable etching technique to form gate 68 and gate dielectric 66, respectively. The gate 68 and the gate dielectric 66 cover respective channel regions of the semiconductor fins 64. The gate 68 may also have a lengthwise direction (may also be referred to as a longitudinal direction) substantially perpendicular to the lengthwise direction of respective semiconductor fins 64. Although one dummy gate structure 75 is illustrated in FIG. 5, more than one dummy gate structures 75 may be formed over the semiconductor fins 64. For example, the plan view in FIG. 9 illustrates four metal gates 97 over the semiconductor fins 64, where each of the metal gates 97 is formed by replacing a respective dummy gate structure 75 in a replacement gate process. Details of the replacement gate process are as discussed hereinafter.

In some embodiments, the fin 64 in the middle (also labeled as 64E) of FIG. 5 is a dummy fin. In the illustrated embodiment, the dummy fin 64E is formed of a different material (e.g., a dielectric material such as silicon oxide or silicon nitride) from the other fins 64. For example, to form the dummy fin 64, a portion of the substrate 50 (e.g., at locations where the dummy fin 64E is to be formed) is replaced with a dielectric material, such as silicon oxide or silicon nitride, before the patterning process is performed to form the fins. Next, the pattering process described above is performed, and the dummy fin 64 is formed in a same processing step (e.g., patterning) as the other fins 64. After the dummy fin 64E is formed, it may have a same shape and a same size as the other fins 64. In some embodiments, in subsequent processing, no source/drain region 80 is formed on the dummy fin 64E, and/or no contact (e.g., source/drain contact, or gate contact) is formed to electrically couple with the dummy fin 64E. Therefore, the dummy fin 64E is electrically isolated (e.g., not electrically connected to other electrically conductive features). The number and the location of the dummy fin 64E illustrated herein are merely examples and non-limiting, other numbers and other locations of the dummy fin 64E are also possible and are fully intended to be included within the scope of the present disclosure.

FIGS. 6, 7A, and 8A illustrate the cross-section views of further processing of the FinFET device 100 along cross-section A-A (along a longitudinal axis of the fin 64). As illustrated in FIG. 6, lightly doped drain (LDD) regions 65 are formed in the fins 64. The LDD regions 65 may be formed by an implantation process. The implantation process may implant N-type or P-type impurities in the fins 64 to form the LDD regions 65. In some embodiments, the LDD regions 65 abut the channel region of the FinFET device 100. Portions of the LDD regions 65 may extend under gate 68 and into the channel region of the FinFET device 100. FIG. 6 illustrates a non-limiting example of the LDD regions 65. Other configurations, shapes, and formation methods of the LDD regions 65 are also possible and are fully intended to be included within the scope of the present disclosure. For example, LDD regions 65 may be formed after gate spacers 87 are formed.

Still referring to FIG. 6, after the LDD regions 65 are formed, gate spacers 87 are formed on the gate structure. In the example of FIG. 6, the gate spacers 87 are formed on opposing sidewalls of the gate 68 and on opposing sidewalls of the gate dielectric 66. The gate spacers 87 may be formed of a nitride, such as silicon nitride, silicon oxynitride, silicon carbonitride, the like, or a combination thereof, and may be formed using, e.g., a thermal oxidation, CVD, or other suitable deposition process. The gate spacers 87 may also extend over the upper surface of the semiconductor fins 64 and the upper surface of the isolation region 62.

The shapes and formation methods of the gate spacers 87 as illustrated in FIG. 6 are merely non-limiting examples, and other shapes and formation methods are possible. For example, the gate spacers 87 may include first gate spacers (not shown) and second gate spacers (not shown). The first gate spacers may be formed on the opposing sidewalls of the dummy gate structure 75. The second gate spacers may be formed on the first gate spacers, with the first gate spacers disposed between a respective gate structure and the respective second gate spacers. The first gate spacers may have an L-shape in a cross-sectional view. As another example, the gate spacers 87 may be formed after the epitaxial source/drain regions 80 (see FIG. 7) are formed. In some embodiments, dummy gate spacers are formed on the first gate spacers (not shown) before the epitaxial process of the epitaxial source/drain regions 80 illustrated in FIG. 7, and the dummy gate spacers are removed and replaced with the second gate spacers after the epitaxial source/drain regions 80 are formed. All such embodiments are fully intended to be included in the scope of the present disclosure.

Next, as illustrated in FIG. 7A, source/drain regions 80 are formed. The source/drain regions 80 are formed by etching the fins 64 to form recesses, and epitaxially growing a material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 7A, the epitaxial source/drain regions 80 may have surfaces raised from respective surfaces of the fins 64 (e.g. raised above the non-recessed portions of the fins 64) and may have facets. The source/drain regions 80 of the adjacent fins 64 may merge to form a continuous epitaxial source/drain region 80, as illustrated in FIG. 7B. In some embodiments, the source/drain regions 80 of adjacent fins 64 do not merge together and remain separate source/drain regions 80, as illustrated in FIG. 7C. Note that for simplicity, only two semiconductor strips 60 are illustrated in FIGS. 7B and 7C. In addition, in the example of FIGS. 7B and 7C, lower surfaces of the source/drain regions 80 extend below upper surfaces of the isolation regions 62. In other embodiments, lower surfaces of the source/drain regions 80 extend above upper surfaces of the isolation regions 62. In some embodiments in which the resulting FinFET is an n-type FinFET, source/drain regions 80 comprise silicon carbide (SiC), silicon phosphorous (SiP), phosphorous-doped silicon carbon (SiCP), or the like. In embodiments in which the resulting FinFET is a p-type FinFET, source/drain regions 80 comprise SiGe, and a p-type impurity such as boron or indium.

The epitaxial source/drain regions 80 may be implanted with dopants followed by an anneal process. The implanting process may include forming and patterning masks such as a photoresist to cover the regions of the FinFET that are to be protected from the implanting process. The source/drain regions 80 may have an impurity (e.g., dopant) concentration in a range from about $1E19$ $cm^{-3}$ to about $1E21$ $cm^{-3}$. In some embodiments, the epitaxial source/drain regions may be in situ doped during growth.

In some embodiments, the LDD regions 65 and the source/drain regions 80 are not formed in the dummy fin 64E. For example, a mask layer, such as a patterned photoresist, is formed to shield the dummy fin 64E during the formation process for the LDD regions 65 and the formation process for the source/drain regions 80. The patterned mask layer may then be removed after the source/drain regions 80 are formed.

Next, as illustrated in FIG. 8A, a first interlayer dielectric (ILD) 90 is formed over the structure illustrated in FIG. 7A, and a gate-last process (sometimes referred to as replacement gate process) is performed. In a gate-last process, the gate 68 and the gate dielectric 66 (see FIG. 7A) are considered dummy structures and are removed and replaced with an active gate and active gate dielectric, which may be collectively referred to as a replacement gate structure or as a metal gate structure.

In some embodiments, the first ILD 90 is formed of a dielectric material such as silicon oxide (SiO), phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as a CMP process, may be performed to remove the mask 70 and to planarize the top surface of the first ILD 90, such that the top surface of the first ILD 90 is level with the top surface of the gate 68 (see FIG. 7A) after the CMP process. Therefore, after the CMP process, the top surface of the gate 68 is exposed, in some embodiments.

In accordance with some embodiments, the gate 68 and the gate dielectric 66 directly under the gate 68 are removed in an etching step(s), so that recesses (not shown) are formed. Each recess exposes a channel region of a respective fin 64. Each channel region may be disposed between neighboring pairs of epitaxial source/drain regions 80. During the dummy gate removal, the gate dielectric 66 may be used as an etch stop layer when the gate 68 is etched. The gate dielectric 66 may then be removed after the removal of the gate 68.

Next, in FIG. 8A, metal gates 97 are formed in the recesses by forming a gate dielectric layer 96, a work function layer 91, a barrier layer 94, and a gate electrode 98 successively in each of the recesses. As illustrated in FIG. 8A, the gate dielectric layer 96 is deposited conformally in the recesses. The work function layer 91 is formed conformally over the gate dielectric layer 96, the barrier layer 94 is formed conformally over the work function layer 91, and the gate electrode 98 fills the recesses.

In accordance with some embodiments, the gate dielectric layer 96 comprises silicon oxide, silicon nitride, or multilayers thereof. In other embodiments, the gate dielectric layer 96 includes a high-k dielectric material, and in these embodiments, the gate dielectric layers 96 may have a k value greater than about 7.0, and may include a metal oxide or a silicate of Hf, Al, Zr, La, Mg, Ba, Ti, Pb, and combinations thereof. The formation methods of gate dielectric layer 96 may include MBD, ALD, PECVD, and the like.

Next, the work function layer 91 is formed conformally over the gate dielectric layer 96. The work function layer 91 comprises any suitable material for a work function layer. Exemplary p-type work function metals that may be included in the metal gate 97 include TiN, TaN, Ru, Mo, Al, WN, ZrSi$_2$, MoSi$_2$, TaSi$_2$, NiSi$_2$, WN, other suitable p-type work function materials, or combinations thereof. Exemplary n-type work function metals that may be included in the metal gate 97 include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage Vt is achieved in the device that is to be formed. The work function layer 91 may be deposited by CVD, PVD, ALD, and/or other suitable process. For simplicity, the work function layer 91 is not illustrated in subsequent figures, with the understanding that the work function layer 91 may be formed.

Next, the barrier layer 94 is formed conformally over the work function layer 91. The barrier layer 94 may comprise an electrically conductive material such as titanium nitride, although other materials, such as tantalum nitride, titanium, tantalum, or the like, may alternatively be utilized. The barrier layer 94 may be formed using a CVD process, such as PECVD. However, other alternative processes, such as sputtering or MOCVD, ALD, may alternatively be used.

Next, the gate electrode 98 is formed over the barrier layer 94. The gate electrode 98 may be made of a metal-containing material such as Cu, Al, W, the like, combinations thereof, or multi-layers thereof, and may be formed by, e.g., electroplating, electroless plating, PVD, CVD, or other suitable method. A planarization process, such as a CMP, may be performed to remove the excess portions of the gate dielectric layer 96, the work function layer, the barrier layer 94, and the material of the gate electrode 98, which excess portions are over the top surface of the first ILD 90. The resulting remaining portions of material of the gate electrode 98, the barrier layer 94, the work function layer (not shown), and the gate dielectric layer 96 thus form metal gates 97 of the resulting FinFET device 100. Four metal gates 97 are illustrated in the example of FIG. 8A. However, more or less than four metal gates 97 may be used to form the FinFET device 100, as skilled artisans readily appreciate.

FIGS. 8B and 8C illustrate the cross-sectional view of the FinFET device along cross-section B-B and C-C, respectively. Note that in the example of FIG. 8C, the cross-section C-C is through the dummy fin 64E (see also FIG. 9), and therefore, no source/drain region 80 is formed over the dummy fin 64E.

Referring now to FIG. 9, a plan view of the FinFET device 100 after the processing step of FIGS. 8A-8C is illustrated. For simplicity, not all features of the FinFET device 100 are illustrated. For example, the gate spacers 87, the isolation regions 62, and the source/drain regions 80 are not illustrated in FIG. 9.

As illustrated in FIG. 9, the metal gates 97 (e.g., 97A/97B/97C/97D) straddle the semiconductor fins 64 (e.g., 64A/64B/64C/64D/64E), where the fins 64A and 64B correspond to the fins 64 on the left side of the dummy fin 64E (see FIG. 8B), and the fins 64C and 64D correspond to the fins 64 on the right side of the dummy fin 64E (see FIG. 8B). In subsequent processing, a cut metal gate process is performed to cut the metal gate 97B into two separate metal gates 97B_1 and 97B_2 (see, e.g., FIG. 15B), and to cut the metal gate 97C into two separate metal gates.

In the illustrated embodiment, a portion of the metal gate 97B in a cut area 55 is removed, thereby separating the metal gate 97B into two separate metal gates. In particular, after the cut metal gate process, portions of the metal gate 97B over the semiconductor fins 64A and 64B form a first metal gate, and portions of the metal gate 97B over the semiconductor fins 64C and 64D form a second metal gate. The first metal gate and the second metal gate may be controlled independently, e.g., by applying different control voltages to the first metal gate and the second metal gate. The metal gate 97C is cut into two separate gates similarly. The cut area 55 is defined by a cut pattern (e.g., an opening, see 137 in FIGS. 12A and 12B) in a mask layer over the metal gate 97 and over the first ILD 90, details of which are described hereinafter. As an example, the cut area 55 may have a length L1 between about 100 nm and about 220 nm, and a width W1 between about 30 nm and about 70 nm, although other dimensions are also possible.

FIG. 9 illustrates a non-limiting example of the cut area 55, which cut area 55 is over (e.g., directly over) the dummy fin 64E and the metal gates 97B and 97C. The number of cut areas 55, the size of cut areas 55, and the location of cut areas 55 may be varied to achieve different cutting patterns and to from metal gates with different sizes and patterns. For example, the size of the cut area 55 may be adjusted (e.g., reduced or enlarged) along cross-section C-C to cut one metal gate, two metal gates, three metal gates, or all of the metal gates 97A/97B/97C/97D in one step. As another example, a second cut area may be used along cross-section B-B, e.g., between semiconductor fins 64A and 64B, to cut the metal gates 97B into three separate metal gates that can be controlled independently from each other. These and other variations of the cut areas 55 are fully intended to be included within the scope of the present disclosure. Discussions below use the example of one cut area 55 as illustrated in FIG. 9, with the understanding that any number of cut areas may be used in the fabrication of the FinFET device 100.

Figure 10:
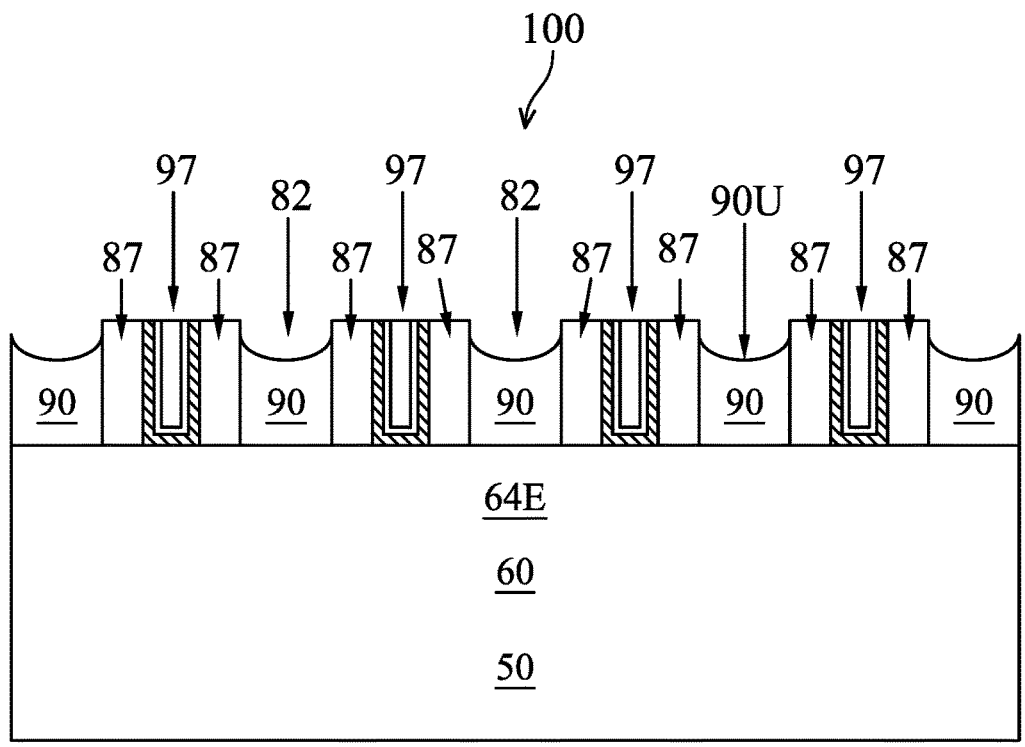

Details of an embodiment cut metal gate process are illustrated in FIGS. 10, 11, 12A, 12B, 13A, 13B, 14A, 14B, 15A-15C, and 16A-16C. FIG. 10 illustrates the cross-sectional view of the FinFET device 100 along cross-section C-C after the processing shown in FIG. 8. Note that source/drain regions 80 and LDD regions 65 are not formed in/on the dummy fin 64E in the illustrated example.

Next, in FIG. 10, top portions of the first ILD 90 are removed to form recesses 82. In some embodiments, a suitable mask layer (not shown), such as a silicon nitride layer or a photoresist, may be formed over the first ILD 90, the gate spacers 87 and the metal gates 97 and patterned to form openings to expose the first ILD 90. Next, a suitable etching process, such as a dry etch process or a wet etch process, may be performed to remove the top portions of the first ILD 90 to form the recesses 82. After forming the recesses, the mask layer may be removed using, e.g., a CMP process. In other embodiments, no mask layer is used for forming the recesses. Instead, an etch process using an etchant with a high etch selectivity to the first ILD 90 (e.g., having a high etch rate for the first ILD 90) is performed to form the recesses 82 without substantially attacking the gate spacers 87 and the metal gates 97. In the illustrated example, after the recesses 82 are formed in the first ILD 90, an upper surface 90U of the first ILD 90 comprises one or more concave shapes.

Figure 11:
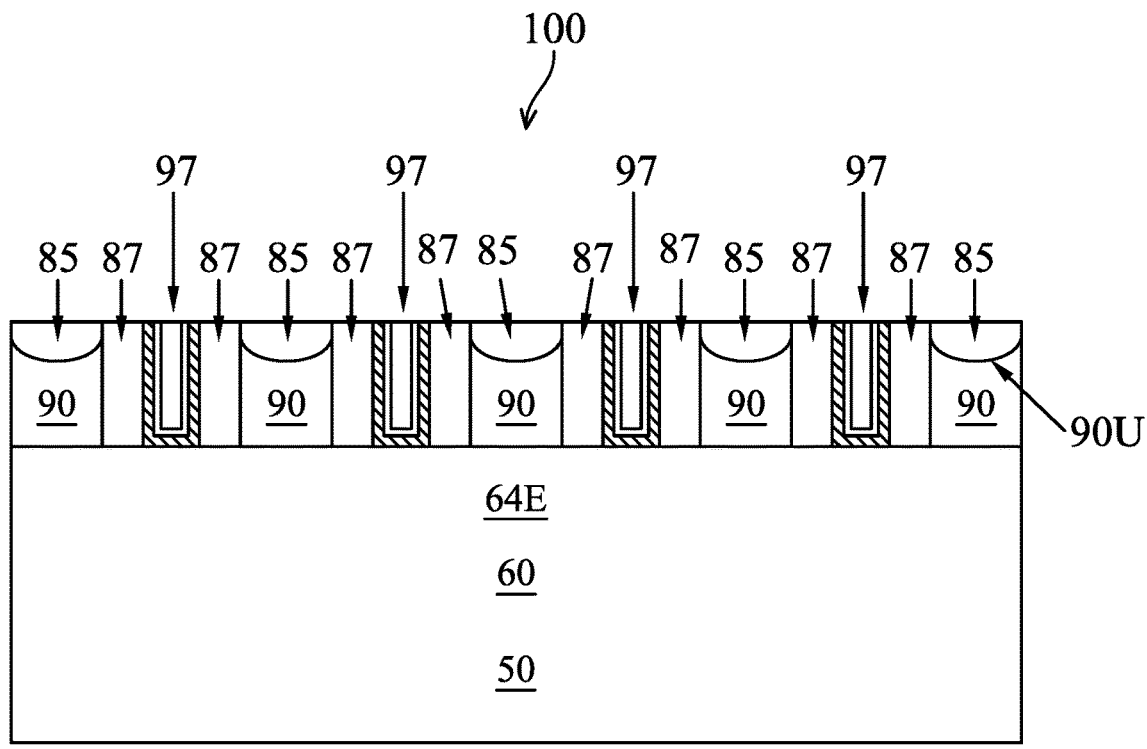

Next, in FIG. 11, a dielectric material 85 (may also be referred to as a capping layer for the first ILD 90) is formed to fill the recesses 82. The dielectric material 85 comprises a different material than the first ILD 90 to provide etching selectivity and to protect the first ILD 90 in a subsequent etching process, such that the loss of first ILD 90 is prevented or reduced. The dielectric material 85 may include a suitable material such as silicon nitride, silicon carbide, silicon oxynitride, combinations thereof, or the like, and may be formed by any suitable methods such as PVD, CVD, ALD. A planarization process, such as CMP, may be performed to remove excess portions of the dielectric material 85 from the upper surface of the metal gates 97. After the planarization process, the upper surfaces of the metal gates 97 are exposed. In some embodiments, the above processing steps illustrated in FIGS. 10 and 11 to form the dielectric material 85 are omitted.

Figure 12A:
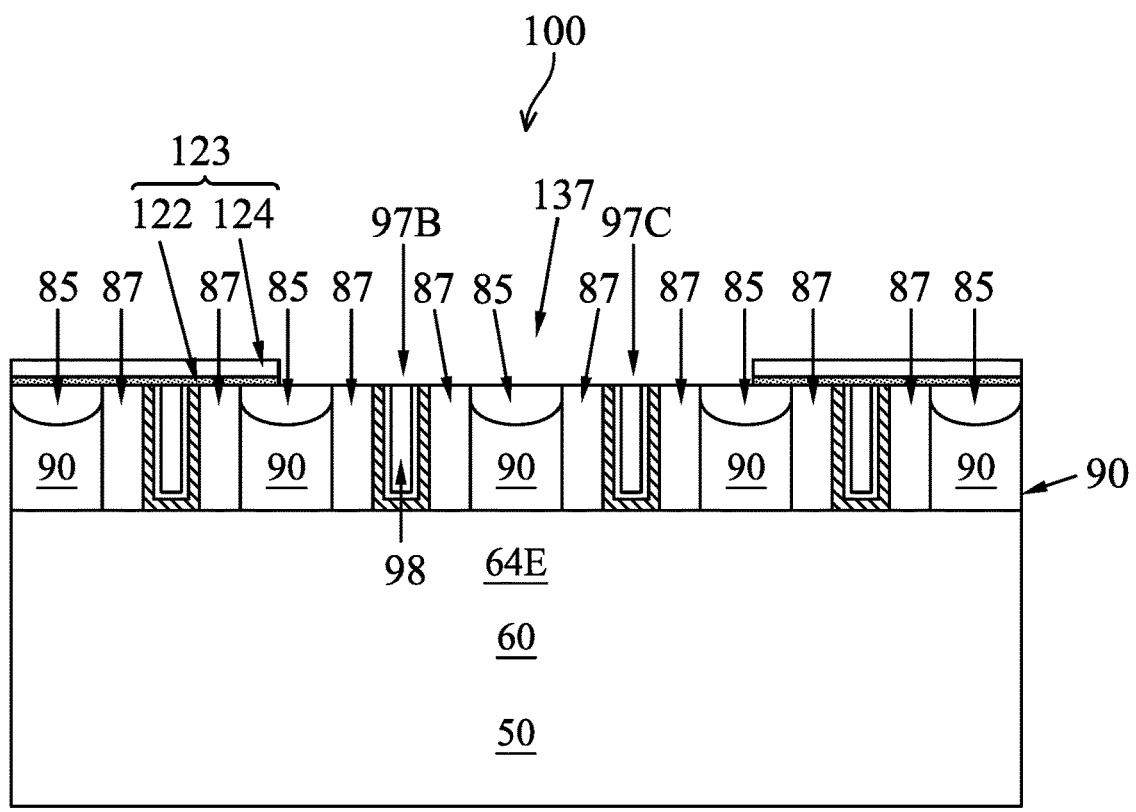
Figure 12B:
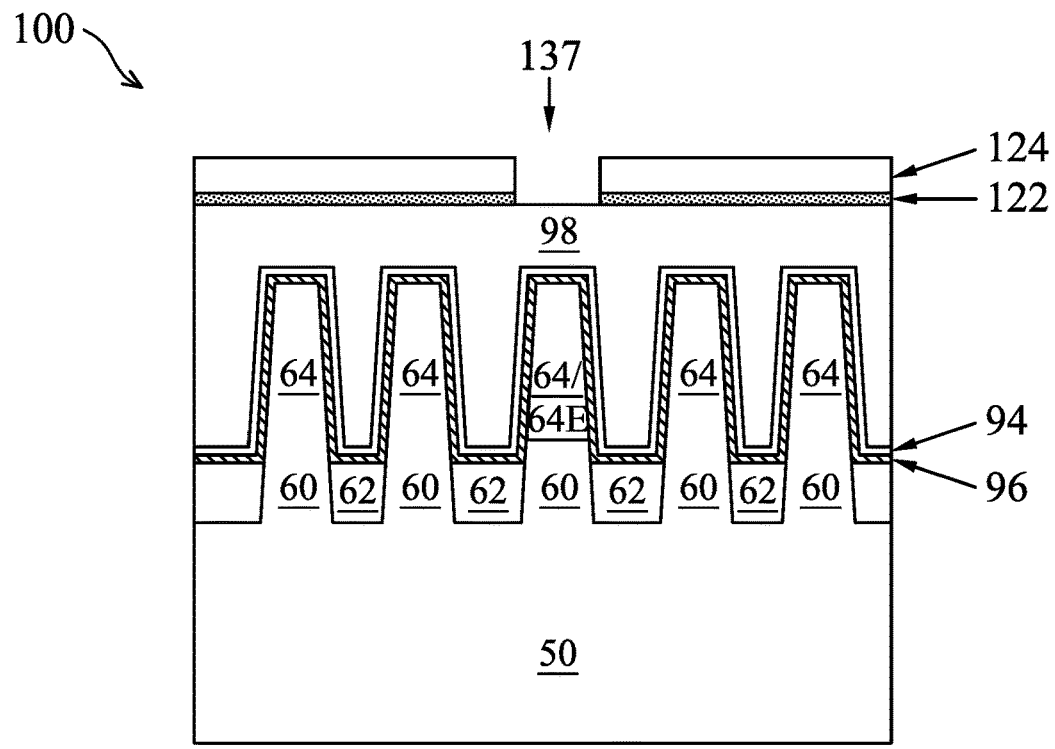

Next, in FIGS. 12A and 12B, a hard mask layer 123 is formed over the FinFET device 100, and an opening 137 is formed in the hard mask layer 123. The opening 137 defines the cut area 55 in FIG. 9, in the illustrated embodiment.

In the illustrated embodiment, the hard mask layer 123 includes a first hard mask layer 122 and a second hard mask layer 124 formed consecutively over the FinFET device 100. In some embodiments, the first hard mask layer 122 is a metal hard mask layer and the second hard mask layer 124 is a dielectric hard mask layer. The first hard mask layer 122 may be a masking material such as titanium nitride, titanium oxide, the like, or a combination thereof, and may be formed using a process such as ALD, CVD, PVD, the like, or a combination thereof. The second hard mask layer 124 may be a masking material such as silicon nitride, silicon oxide, tetraethyl orthosilicate (TEOS), SiOxCy, the like, or a combination thereof, and may be formed using a process such as CVD, ALD, the like, or a combination thereof.

To form the opening 137, a patterned mask, such as a patterned photoresist, is formed over the hard mask layer 123. The pattern of the patterned mask is then transferred to the second hard mask layer 124 and the first hard mask layer 122 using, e.g., suitable etching techniques. As a result, the opening 137 is formed in the hard mask layer 123.

As illustrated in FIG. 12A, the opening 137 exposes underlying metal gates 97B and 97C, e.g., portions of the metal gates 97B/97C within the cut area 55 (see FIG. 9). As illustrated in FIG. 12A, the opening 137 also exposes the gate spacers 87 around the metal gates 97B/97C, and portions of the dielectric material 85 around the metal gates 97B/97C. In some embodiments, the etching process used to form the opening 137 also recesses top portions of the metal gates 97B/97C, top portions of the gate spacers 87 exposed by the opening 137, and top portions of the dielectric material 85 exposed by the opening 137 below a lower surface of the first hard mask layer 122. The openings 137 is formed directly over the dummy fin 64E, as illustrated in FIG. 12B.

Figure 13A:
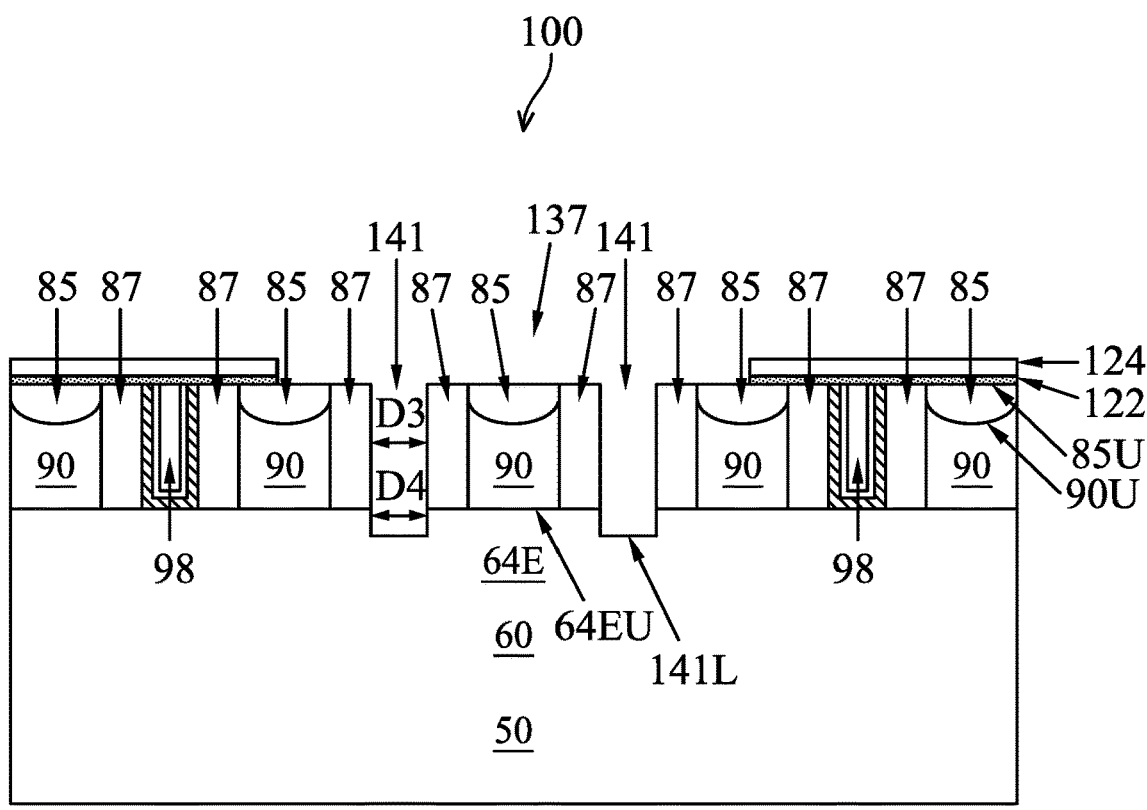
Figure 13B:
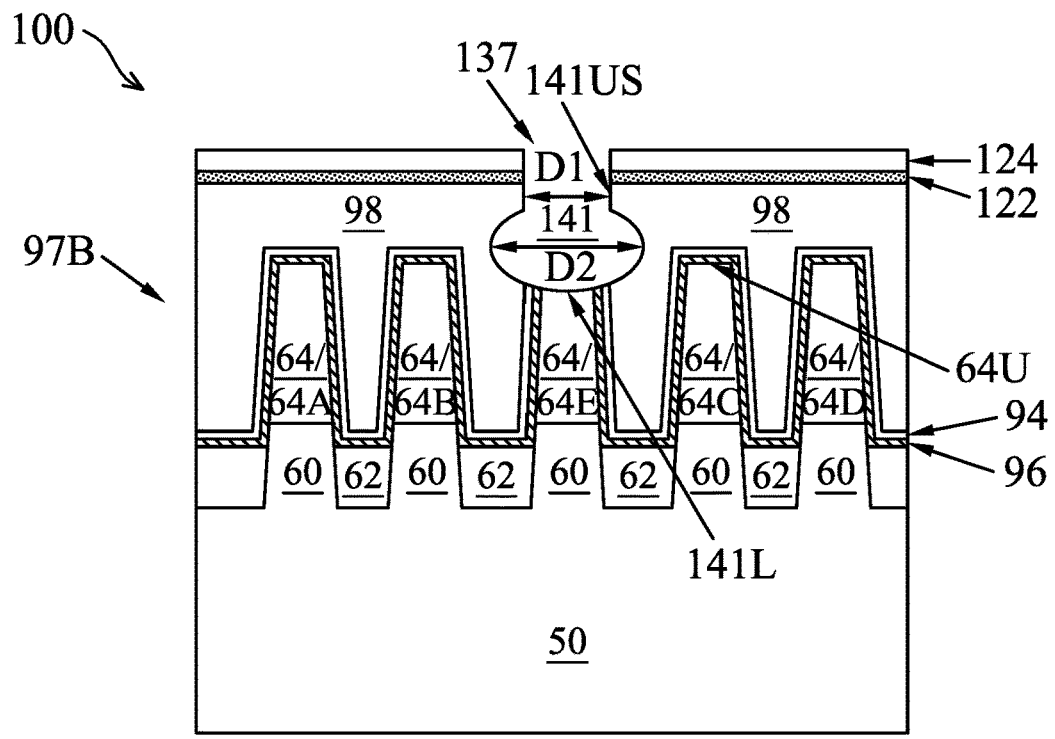

Next, as illustrated in FIGS. 13A and 13B, portions of the metal gates 97B/97C within the cut area 55 (see FIG. 9) and exposed by (e.g., directly under) the opening 137 are removed by an etching process, and recesses 141 are formed in the metal gates 97B/97C. FIG. 13B illustrates the cross-sectional view of the FinFET device 100 along cross-section B-B, which is along the longitudinal direction of the metal gate 97B (see FIG. 9). As illustrated in FIG. 13B, the recesses 141 is formed over (e.g., directly over) the dummy fin 64E, and extend from an upper surface of the metal gate 97B into the metal gate 97B. The recess 141 has an upper portion with a width D1 and a lower portion with a width D2, where D2 is larger than D1. In other words, the recess 141 has an enlarged lower portion. In some embodiments, the width D2 is larger than the width D1 by about 2 nm to about 15 nm. The width D2 and the width D1 are chosen to ensure a thorough cleaning (e.g., removal) of metal residues from the recess 141 (e.g., along sidewalls of the spacers 87 in FIG. 13A) after the etching process to form the recess 141. If D2 is too small (e.g., less than 2 nm wider than D1) compared with D1, metal residues from the metal gate 97 may not be thoroughly removed by the etching process, and may be left in the recess 141 and may cause electrical shorts between subsequently formed metal gates 97B_1 and 97B_2 (see, e.g., FIG. 15B). On the other hand, if the D2 is too large (e.g., is larger than D1 by 15 nm) compared to D1, the recess 141 may extends to and damage neighboring fins 64. In some embodiments, D1 is between about 12 nm and about 30 nm, and D2 is about 14 nm and about 45 nm. Note that in the cross-section view of FIG. 13A, the upper portion of the recess 141 has a width D3 and the lower portion of the recess 141 has a width D4, where D3 is equal to D4 (e.g., equal within the limitations of manufacturing). In other words, the lower portion of the recess 141 is wider than the upper portion of the recess 141 along cross-section B-B (e.g., a longitudinal direction of the metal gate), but has a same width as the upper portion along cross-section C-C (e.g., a longitudinal direction of the dummy fin 64E). In some embodiments, the etching process used to remove the portions of the metal gate 97B is selectively to the material(s) of the metal gate (e.g., 97B and 97C), and therefore, does not substantially attack the gate spacers 87, the dielectric material 85, and/or the first ILD 90, thus the widths D3 and D4 of the recess 141 in the cross-sectional view of FIG. 13A is defined by the distance between the gate spacers 87.

As illustrated in FIG. 13B, the etching process used to remove portions of the metal gate 97 removes portions of the gate electrode 98, portions of the gate dielectric layer 96, and portions of the barrier layer 94 underlying the opening 137. The lower portion of the recess 141 reaches, and thus, exposes the dummy fin 64E, the gate dielectric layer 96, and the barrier layer 94. In the example of FIG. 13B, an upper portion of the dummy fin 64E is also removed by the etching process. Accordingly, a lower surface 141L (e.g., a lower-most surface) of the recess 141 is closer to the substrate 50 than an upper surface 64U of the other fins 64 (non-dummy fins), as illustrated in FIG. 13B. Since the dummy fin 64E may have a same height as the other fins 64, the lower surface 141L of the recess 141 is also closer to the substrate 50 than an upper surface 64EU of un-recessed portions of the dummy fin 64E, as illustrated in FIG. 13A.

In some embodiments, to form the recess 141 with the enlarged lower portion (see FIG. 13B), an etching process comprising multiple etching cycles is performed, where each etching cycle extends (e.g., deepens) the recess 141 deeper into the metal gate 97B. The etching process stops when a target depth of the recess 141 is achieved. In some embodiments, each etching cycle includes a deposition step followed by an etching step. In the deposition step, a protection layer is formed along sidewalls and a bottom of the recess 141, the protection layer helps to control the profile of the recess 141, details of which are discussed hereinafter. In the etching step, a suitable etching process, such as a plasma etching process, is performed to remove the portions of the metal gate 97B. Parameters of the etching process are controlled such that the upper portion of the recess 141 has substantially straight sidewalls 141US, and the lower portion of the recess 141 is enlarged compared to the upper portion.

Details of the deposition step and the etching step in an etching cycle are now described. In the deposition step, the protection layer, which may be a dielectric layer (e.g., a silicon oxide layer, a silicon nitride layer, or the like), is formed along the sidewalls and the bottom of the recess 141. The protection layer may be formed by CVD, PVD, ALD, combinations thereof, or the like. In an exemplary embodiment, the protection layer is a silicon oxide layer, and is formed by a CVD deposition process using a silicon-containing gas (e.g., silane) and an oxygen-containing gas (e.g., oxygen). For example, during the deposition process, a flow rate of the silicon containing gas (e.g., silane) may be between about 25 standard cubic centimeters per minute (sccm) and about 150 sccm, and a flow rate of the oxygen-containing gas (e.g., oxygen) may be between about 50 sccm and about 350 sccm. A carrier gas, such as helium, may be used to carry the gases (e.g., silane and oxygen) into the deposition chamber. A pressure of the deposition process may be between about 5 mTorr and about 30 mTorr.

In the etching step, a suitable etching process, such as plasma etching, is performed to extend the recess 141 deeper into the metal gate 97B. The etching gas used in the etching step is selective to the material(s) of the metal gate 97B, and does not substantially attack the gate spacers 87, the dielectric material 85, and the first ILD 90. In some embodiments, the first ILD 90 comprises silicon oxide, the gate spacers 87 and the dielectric material 85 comprise silicon nitride, and the plasma etching uses an etching gas comprising boron trichloride ($BCl_3$). In some embodiments, a plasma etching using boron trichloride is performed as the etching step, where a flow rate of boron trichloride is between about 50 sccm and about 400 sccm. Carrier gases, such as argon and helium, are used in the etching step to carry boron trichloride, where a flow rate for argon may be between about 30 sccm and about 400 sccm, and a flow rate for helium may be between about 30 sccm and about 400 sccm. A temperature of the plasma etching process may be between about 50° C. and about 120° C., and a pressure of the plasma etching process may be between about 2 mTorr and about 25 mTorr. A bias voltage of the plasma etching may be between about 0 V and about 400 V. In the illustrated embodiment, the etching step and the deposition step are performed in a same chamber.

In some embodiments, the etching process has about eight etching cycles, at the beginning phase (e.g., the first 4 etching cycles) of the etching process, the recess 141 is shallow, and it is easy to form the protection layer in the recess 141. For example, the protection layer formed in each etching cycle may have a substantially uniform thickness along the sidewalls and the bottom of the recess 141. During the etching step of the etching cycle, the plasma etching, which is anisotropic (e.g., due to the bias voltage applied), removes the protection layer at the bottom of the recess 141 and the material(s) of the metal gate underlying the recess 141. Due to the anisotropicity of the plasma etching, the protection layer along the sidewalls of the recess 141 is removed at a slower rate than the protection layer at the bottom of the recess 141. The protection layer protects (e.g., shields) the sidewall portions of the metal gate 97B exposed by the recess 141 until the protection layer is consumed (e.g., etched away) by the plasma etching process. In some embodiments, when the protection layer is being etched by the plasma etching process, by-product of the plasma etching process, such as polymer, are generated and are attached to the sidewall portions of the metal gate 97B, which polymer by-product further helps to protect the sidewall portions of the metal gate 97B and helps to maintain the straight sidewall profile of the recess 141. The etching step may be controlled to stop when the protection layer on the sidewalls of the recess 141 is consumed (e.g., etched away) by the plasma etching process. As a result, at the beginning phase of the etching process, the recess 141 is extended downwards toward the substrate 50 with substantially straight sidewalls. In other words, the recess 141 at the beginning phase of the etching process does not have an enlarged lower portion.

As the recess 141 extends deeper into the metal gate 97B, the aspect ratio of the recess 141 increases, and it may become difficult to form the protection layer at the lower portion (e.g., lower sidewalls and the bottom) of the recess 141. The etching process enters an end phase (e.g., the last 4 etching cycles). Due to the high aspect ratio of the recess 141, the protection layer formed in the deposition step of the etching cycle now may have a non-uniform thickness, with the protection layer along upper sidewalls of the recess 141 being thicker than the protection layer along lower sidewalls and the bottom of the recess 141. In other words, the protection layer provides less protection for material(s) of the metal gate 97B proximate the bottom of the recess 141. As a result, during the etching step of the etching cycle, the material(s) of the metal gate 97B proximate the bottom of the recess 141 is removed at a faster rate than the material(s) of the metal gate 97B proximate the upper portion of the recess 141, thereby creating an enlarged lower portion of the recess 141. The etching step may be controlled to stop when the protection layer along upper sidewalls of the recess 141 is consumed by the plasma etching.

In some embodiments, the bias voltage of the plasma etching in the etching step is tuned within a target range (e.g., between about 0 V and about 400 V, such as between about 50 V and about 100 V) to control the profile of the recess 141 formed. The bias voltage of the plasma etching is tuned to be high enough to maintain the anisotropicity of the plasma etching process, but not too high to avoid turning the plasma etching into a mostly physical etching process, where the plasma, being accelerated by a high bias voltage, would bombard the material(s) of the metal gate 97B and cause the recess 141 to have a substantially straight sidewalls from top to bottom (e.g., not having an enlarged bottom portion). In other words, if the bias voltage is too low (e.g., smaller than about 50 V), the plasma etching process losses its aniostropicity, and if the bias voltage is too high (e.g., higher than about 100 V), the recess 141 will not have an enlarged lower portion. The disclosed range for the bias voltage allows the etching process to be anisotropic, and at the same, to maintain certain properties of chemical etching for the plasma etching process, so that boron trichloride reacts and etches away the material(s) of the metal gate 97B. As a result, the recess 141 with the enlarged lower portion is formed. In the example of FIG. 13B, the upper portion of the recess 141 has substantially straight sidewalls 141US, and the lower portion of the recess 141 is enlarged and has curved sidewalls which resemble portions of a circle, an oval, or the like. The shape of the lower portion of the recess 141 illustrated in FIG. 13B is merely a non-limiting example, other shapes are also possible (see, e.g., FIGS. 17 and 19) and are fully intended to be included within the scope of the present disclosure.

During the etching process to form the recess 141, residues of the material(s) of the metal gate 97B tend to stick to the sidewalls of the gate spacers 87 (see FIG. 13A). As the feature size of semiconductor devices continues to shrink, the shrinking size (e.g., width) of the recess 141 may make it more difficult for the etching process to remove material(s) of the metal gate 97B, and therefore, there is increased possibility that residues of the material(s) of the metal gate 97B are left on the sidewalls of the gate spacer 87. These residues may cause electrical short between the two separate gates (see, e.g., 97B_1 and 97B_2 in FIG. 15B) formed after the cut metal gate process. The current disclosed methods, by forming the enlarged lower portion of the recess 141, allow better removal of the material(s) of the metal gate 97B in the cut metal gate process, thereby reducing or prevent electrical short of the separate metal gates formed.

Figure 14A:
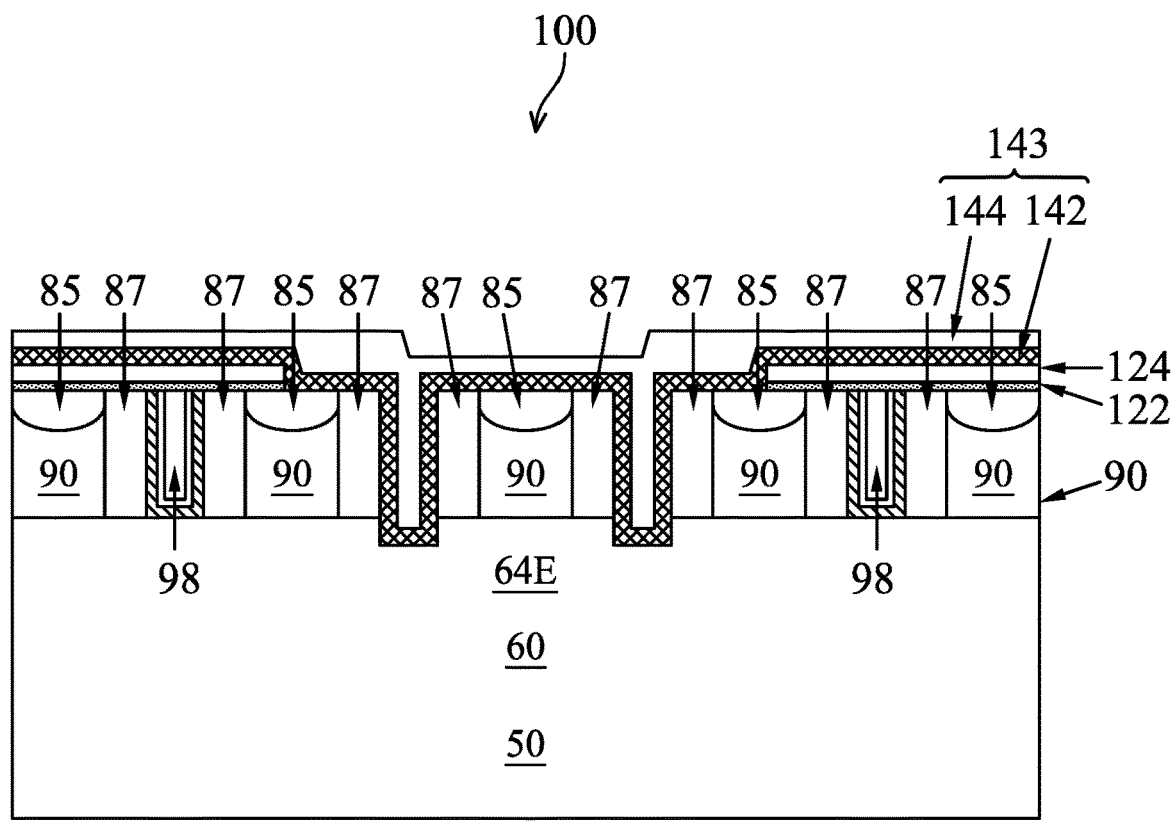
Figure 14B:
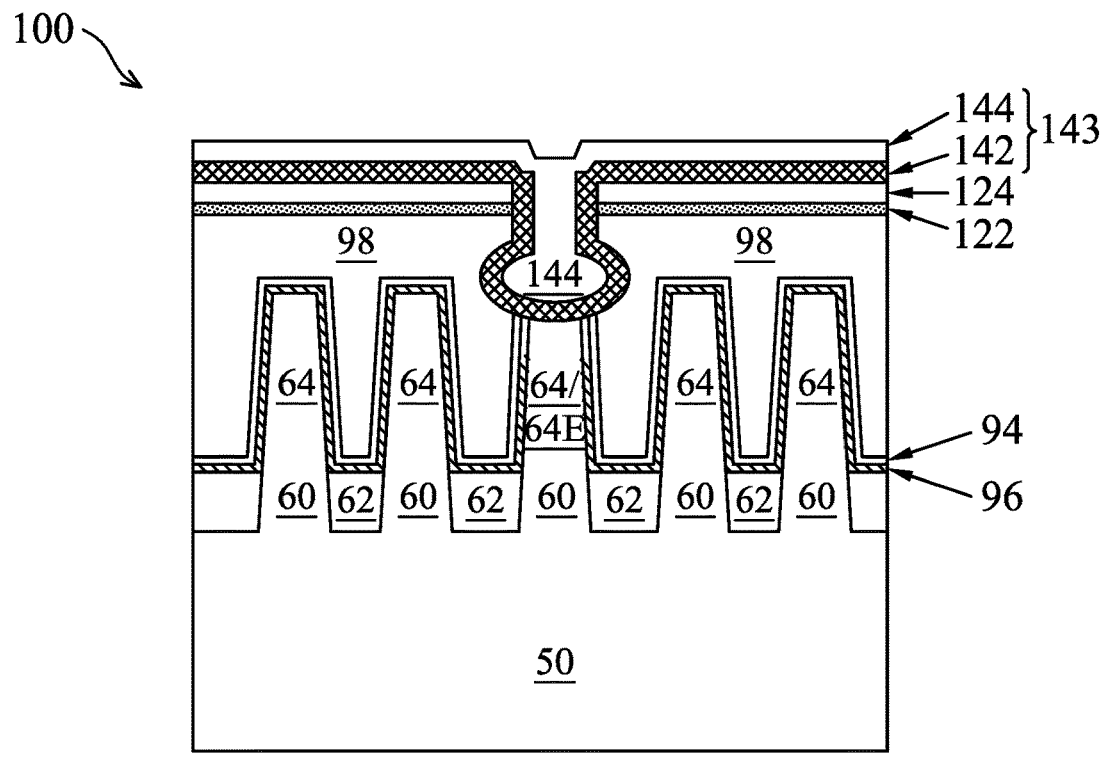

Next, as illustrated in FIGS. 14A and 14B, the recesses 141 are filled by one or more dielectric material 143. In the illustrated example, the one or more dielectric material 143 includes a first dielectric layer 142 and a second dielectric layer 144, which may or may not comprise a same dielectric material as the first dielectric layer 142. Suitable materials for the first dielectric layer 142 and the second dielectric layer 144 may include silicon nitride, silicon oxynitride, silicon carbide, and the like, formed by PVD, CVD, ALD, or other suitable deposition method.

In some embodiments, the first dielectric layer 142 and the second dielectric layer 144 comprise a same material formed by different deposition methods. For example, the first dielectric layer 142 comprises silicon nitride formed by an ALD process, and the second dielectric layer 144 comprises silicon nitride formed by a PECVD process. Since a material (e.g., silicon nitride) formed by the ALD process may have a higher density than the material formed by the PECVD process, silicon nitride formed by the ALD process may have different physical properties (e.g., harder, slower etch rate) than silicon nitride formed by the PECVD process. On the other hand, PECVD process may have a higher deposition rate than the ALD process, thus may deposit materials faster than the ALD process. By using both the ALD process and the PECVD process in filling the recess 141, a higher quality first dielectric layer 142 is formed to insulate the metal gates (e.g., 97B_1 and 97B_2 in FIG. 15B) formed by the cut metal gate process, and the second dielectric layer 144 is formed quickly to fill the recess 141, thus shortening the processing time.

Next, as illustrated in FIGS. 15A-15C, a planarization process, such as a CMP process, is performed to remove the first hard mask layer 122, the second hard mask layer 124, and portions of the first dielectric layer 142/second dielectric layer 144 disposed over the upper surface of the second hard mask layer 124. In some embodiment, the planarization process continues until the dielectric material 85 over the first ILD 90 is removed, as illustrated in FIGS. 15A-15C. Note that the cross-sectional view of FIG. 15A is along cross-section A-A.

As illustrated in FIG. 15B, the metal gate 97B is now separated into two separate metal gates 97B_1 and 97B_2 that may be controlled separately with different gate voltages. The remaining portion of the one or more dielectric material 143 may be referred to as a dielectric structure 143'. For example, in the cross-sectional view of FIG. 15B, an upper portion of the dielectric structure 143' has a width that is narrower than that of a lower portion of the dielectric structure 143'. In other words, the lower portion of the dielectric structure 143' extends beyond lateral extents (e.g., beyond opposing sidewalls) of the upper portion of the dielectric structure 143' in the longitudinal direction of the metal gates 97B_1 and 97B_2. In addition, in the cross-sectional view of FIG. 15C, the upper portion of the dielectric structure 143' and the lower portion of the dielectric structure 143' have a same width. In some embodiments, in the cross-sectional view of FIG. 15B, the upper portion of the dielectric structure 143' with straight sidewalls has a height (measured along a first direction perpendicular to an upper major surface of the substrate 50) between about 5 nm and about 35 nm, and the lower portion of the dielectric structure 143' (the enlarged portion) has a height (measured along the first direction) between about 5 nm and about 35 nm.

Next, as illustrated in FIGS. 16A-16C, contacts 102 (also referred to as gate contacts) and contacts 106 (also referred to as source/drain contacts) are formed over and electrically connected to the metal gates 97 and the source/drain regions 80, respectively. To form the contacts 102/106, a second ILD 95 is formed over the first ILD 90. In some embodiments, the second ILD 95 is a flowable film formed by a flowable CVD method. In some embodiments, the second ILD 95 is formed of a dielectric material such as PSG, BSG, BPSG, USG, or the like, and may be deposited by any suitable method, such as CVD and PECVD. Next, contact openings are formed through the first ILD 90 and/or the second ILD 95 to expose the metal gates 97 and the source/drain regions 80, which contact openings are then filled with electrically conductive material(s) to form the contacts 102/106. In some embodiments, silicide regions 81 are formed over the source/drain regions 80 before the contact openings are filled. Details of forming the contacts 102 are discussed hereinafter.

In some embodiments, silicide regions 81 are formed over the source/drain regions 80. Silicide regions 81 may be formed by first depositing a metal capable of reacting with semiconductor materials (e.g., silicon, germanium) to form silicide or germanide regions, such as nickel, cobalt, titanium, tantalum, platinum, tungsten, other noble metals, other refractory metals, rare earth metals or their alloys, over the source/drain regions 80, then performing a thermal anneal process to form the silicide regions 81. The unreacted portions of the deposited metal are then removed, e.g., by an etching process. Although regions 81 are referred to as silicide regions, regions 81 may also be germanide regions, or silicon germanide regions (e.g., regions comprising silicide and germanide).

Next, a barrier layer 104 is formed lining sidewalls and bottoms of the contact openings, and over the upper surface of the second ILD 95. The barrier layer 104 may comprise titanium nitride, tantalum nitride, titanium, tantalum, the like, and may be formed by ALD, PVD, CVD, or other suitable deposition method. Next, a seed layer 109 is formed over the barrier layer 104. The seed layer 109 may be deposited by PVD, ALD or CVD, and may be formed of tungsten, copper, or copper alloys, although other suitable methods and materials may alternatively be used. Once the seed layer 109 has been formed, a conductive material 110 may be formed onto the seed layer 109, filling and overfilling the contact openings. The conductive material 110 may comprise tungsten, although other suitable materials such as aluminum, copper, tungsten nitride, rhuthenium, silver, gold, rhodium, molybdenum, nickel, cobalt, cadmium, zinc, alloys of these, combinations thereof, and the like, may alternatively be utilized. Any suitable deposition method, such as PVD, CVD, ALD, plating (e.g., electroplating), and reflow, may be used to form the conductive material 110.

Once the contact openings have been filled, excess portions of the barrier layer 104, seed layer 109, and conductive material 110 outside of the contact openings may be removed through a planarization process such as CMP, although any suitable removal process may be used. Contacts 102/106 are thus formed in the contact openings. The contacts 102/106 are illustrated in a single cross-section as an example, the contacts 102/106 could be in different cross-sections. In addition, in FIG. 16B, a contact 102 is shown connected to each of the two metal gates 97B_1 and 97B_2 as an example. The number and the location of the contacts 102 connected to each of the metal gates 97B_1 and 97B_2 may be changed without departing from the spirit of the present disclosure, these and other modifications are fully intended to be included within the scope of the present disclosure.

As discussed above with reference to FIG. 13B, the enlarged lower portion of the recess 141 may have different shapes, depending on, e.g., the etching condition of the etching process. Additional examples are illustrated in FIGS. 17-20.

Figure 17:
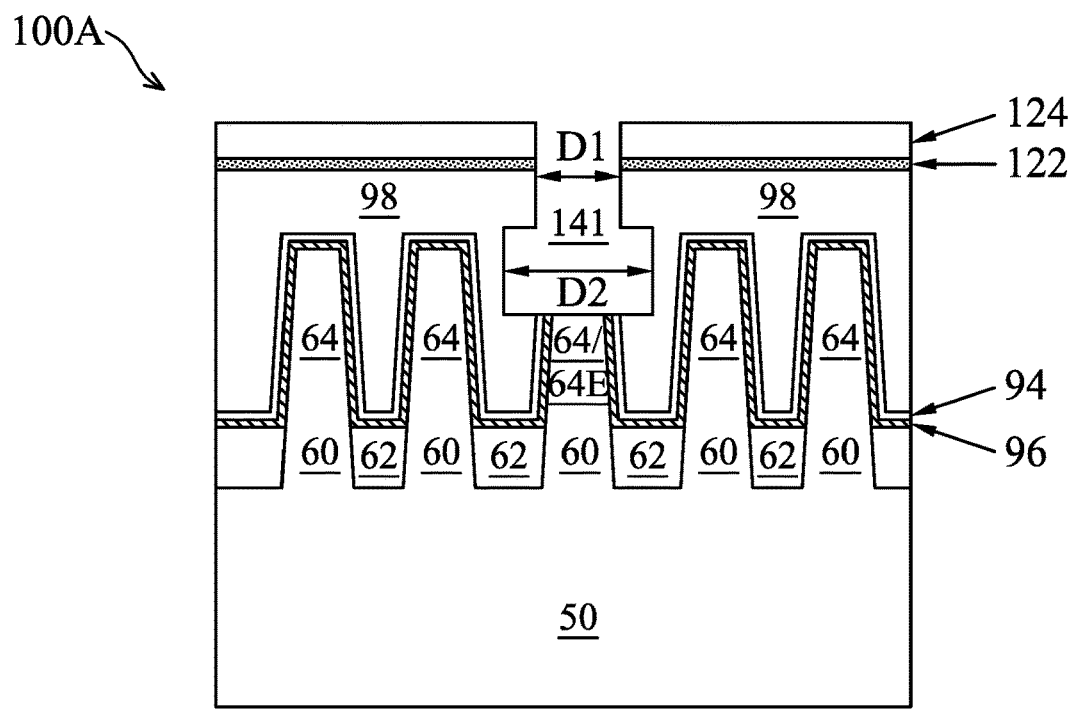
FIGS. 17-18 illustrate cross-sectional views of a FinFET device at various stages of fabrication, in accordance with an embodiment.
Figure 18:
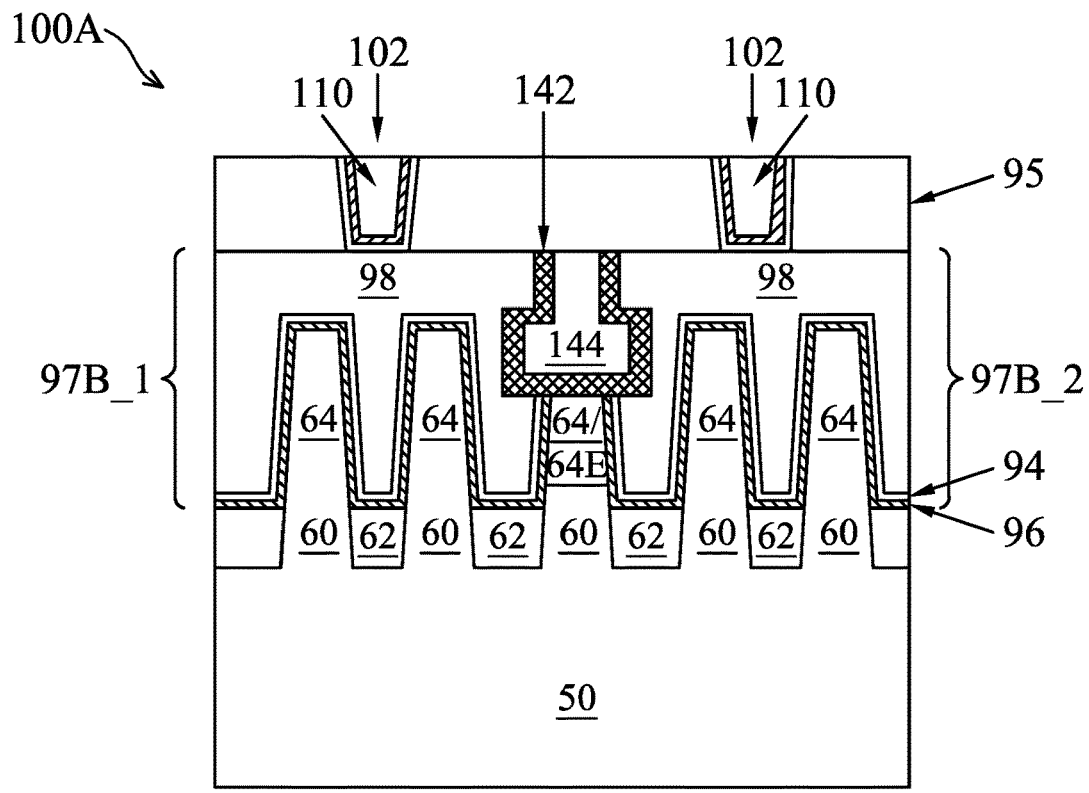

FIGS. 17-18 illustrate cross-sectional views of a FinFET device 100A at various stages of fabrication, in accordance with an embodiment. The FinFET device 100A is similar to the FinFET device 100, but with a different shape for the recess 141. In particular, the recess 141 in FIG. 17 has an upper portion with a rectangular cross-section, and a lower portion with another rectangular cross-section. The upper portion of the recess 141 has a with D1, and the lower portion of the recess 141 has a width D2 larger than D1. In some embodiments, D2 is larger than D1 by about 2 nm to about 15 nm. Note that FIG. 17 shows the cross-sectional view of recess 141 along cross-section B-B, the corresponding cross-sectional view of the recess 141 along cross-section C-C is the same as FIG. 13A, in some embodiments. FIG. 18 illustrates the FinFET device 100A after the second ILD 95 and the contacts 102/106 are formed. Note that FIG. 18 shows the cross-sectional view of the FinFET device 100A along cross-section B-B, the corresponding cross-sectional views of the FinFET device 100A along cross-sections A-A and C-C are the same as FIGS. 16A and 16C, respectively, in some embodiments.

Figure 19:
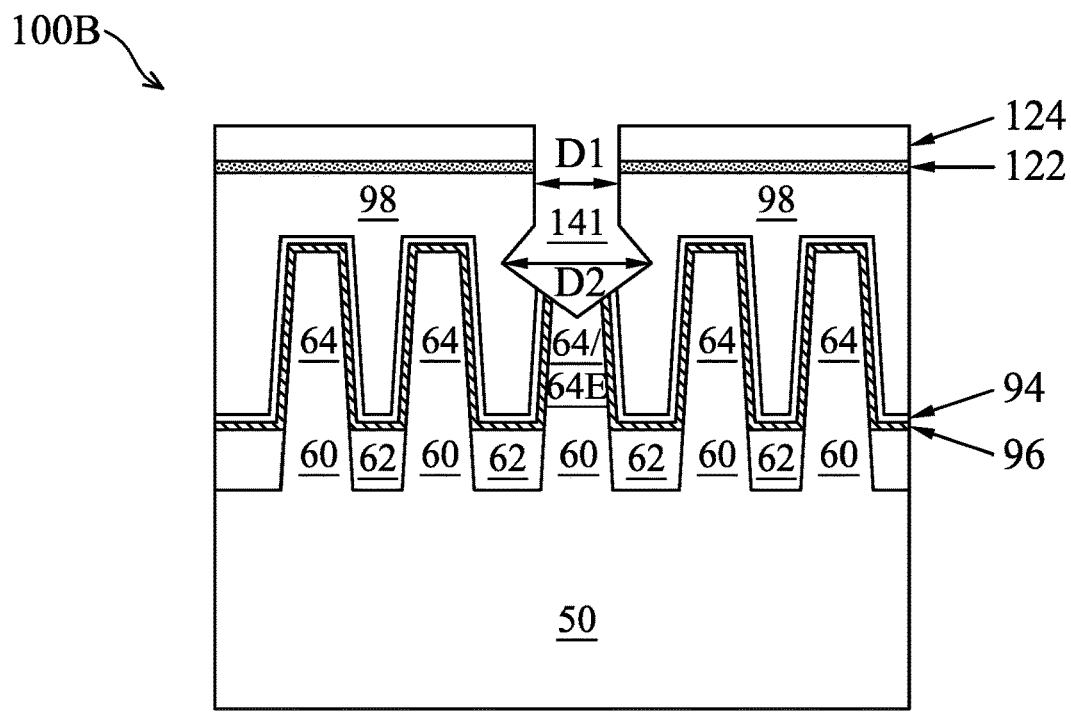
FIGS. 19-20 illustrate cross-sectional views of a FinFET device at various stages of fabrication, in accordance with an embodiment.
Figure 20:
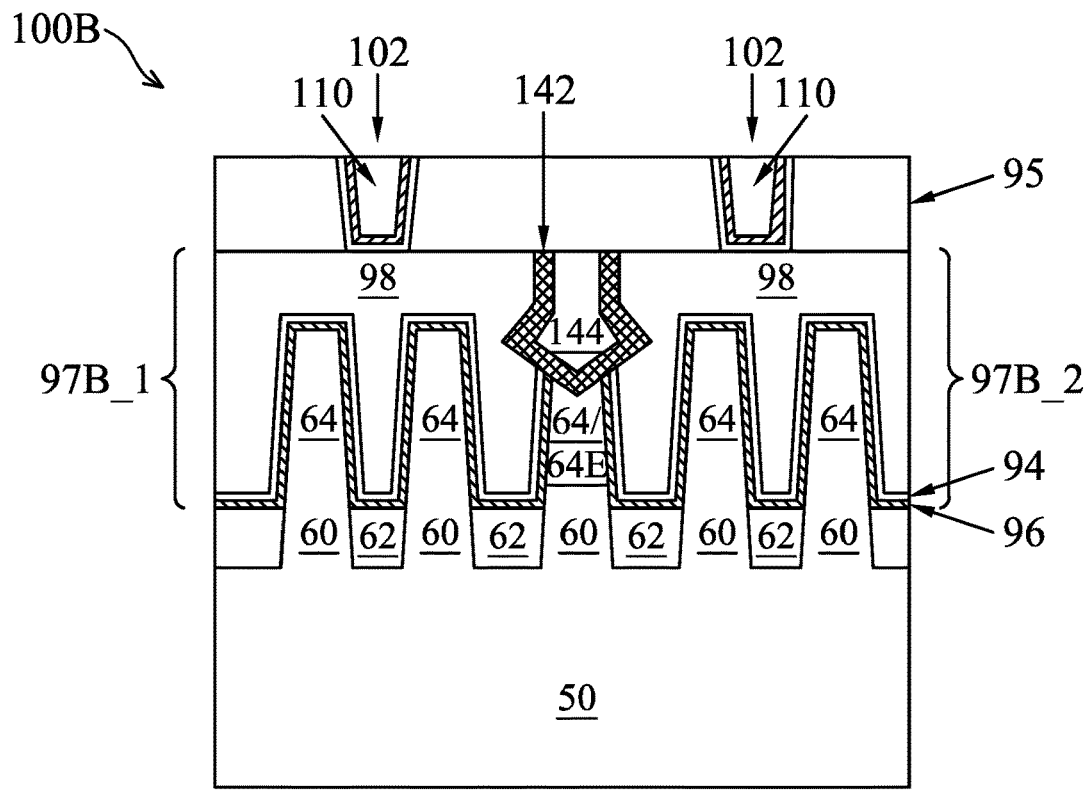

FIGS. 19-20 illustrate cross-sectional views of a FinFET device 100B at various stages of fabrication, in accordance with an embodiment. The FinFET device 100B is similar to the FinFET device 100, but with a different shape for the recess 141. In particular, the recess 141 in FIG. 19 has an upper portion with a rectangular cross-section, and a lower portion with (portions of) a diamond-shaped cross-section. The upper portion of the recess 141 has a with D1, and the lower portion of the recess 141 has a width D2 larger than D1. In some embodiments, D2 is larger than D1 by about 2 nm to about 15 nm. Note that FIG. 19 shows the cross-sectional view of the recess 141 along cross-section B-B, the corresponding cross-sectional view of the recess 141 along cross-section C-C is the same as FIG. 13A, in some embodiments. FIG. 20 illustrates the FinFET device 100B after the second ILD 95 and the contacts 102/106 are formed. Note that FIG. 20 shows the cross-sectional view of the FinFET device 100B along cross-section B-B, the corresponding cross-sectional views of the FinFET device 100B along cross-sections A-A and C-C are the same as FIGS. 16A and 16C, respectively, in some embodiments.

FIGS. 21A-21C, 22, 23, 24A, 24B, 25A and 25B illustrate various views (e.g., cross-sectional view, plan view) of a FinFET device 200 at various stages of fabrication, in accordance with an embodiment. The FinFET device 200 is similar to the FinFET device 100, but without the dummy fin 64E formed. The formation process of the FinFET device 200 is discussed hereinafter. Throughout the discussion herein, unless otherwise stated, the same reference numeral in different figures refers to the same or similar element formed by a same or similar method using a same or similar material(s), thus details may not be repeated.

Figure 21A:
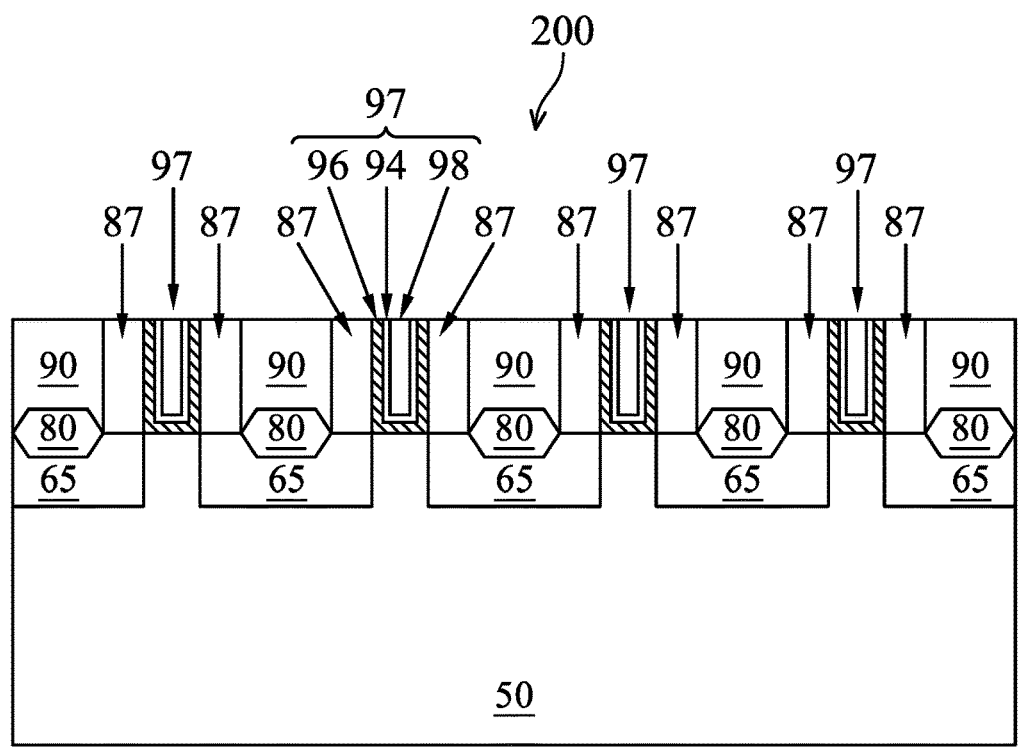
FIGS. 21A-21C, 22, 23, 24A, 24B, 25A and 25B illustrate various views (e.g., cross-sectional view, plan view) of a FinFET device at various stages of fabrication, in accordance with an embodiment.
Figure 21B:
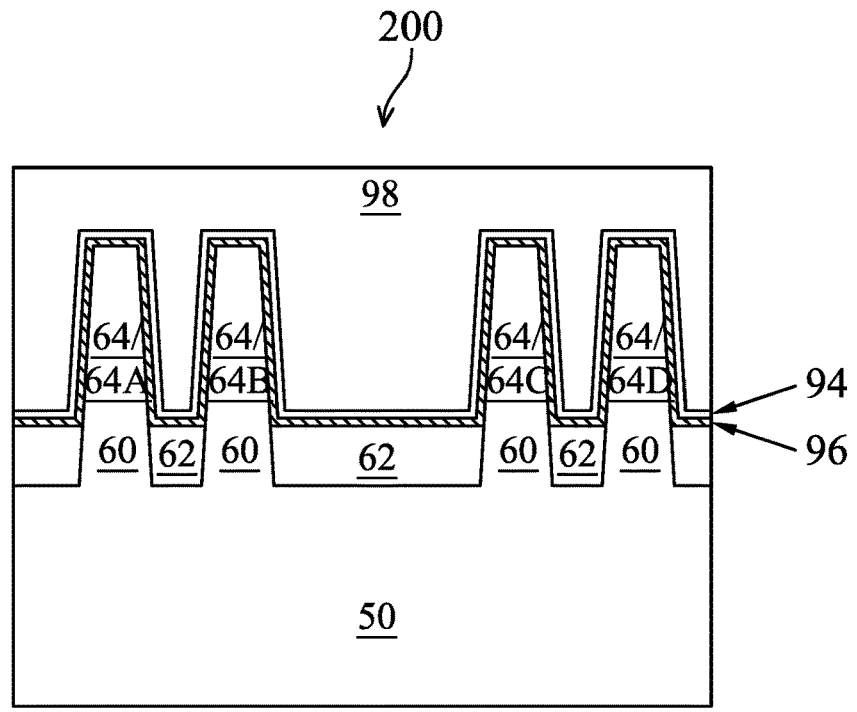
Figure 21C:
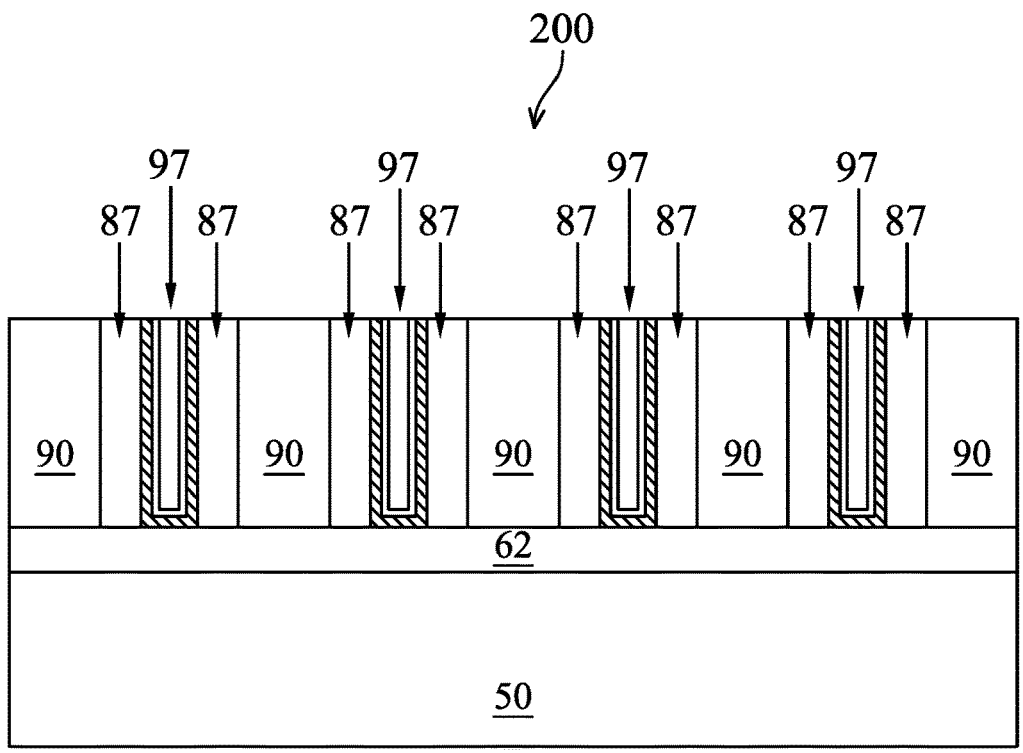

FIGS. 21A-21C illustrate cross-sectional views of the FinFET device 200 after the metal gates 97 are formed, following the same or similar processing steps as illustrated in FIGS. 2-6, 7A-7C, and 8A-8C, but without the dummy fin 64E formed. In particular, referring to FIG. 21B, the FinFET device 200 has four fins 64 (e.g., functional, non-dummy fins) formed protruding above the substrate 50, and each of the fins 64 has source/drain regions 80 formed on opposing sides of the metal gate 97 (see FIG. 21A). Note that the cross-sectional view of FIG. 21C is along cross-section C-C illustrated in FIG. 22, which cross-section C-C is between the fin 64B and the fin 64C.

Figure 22:
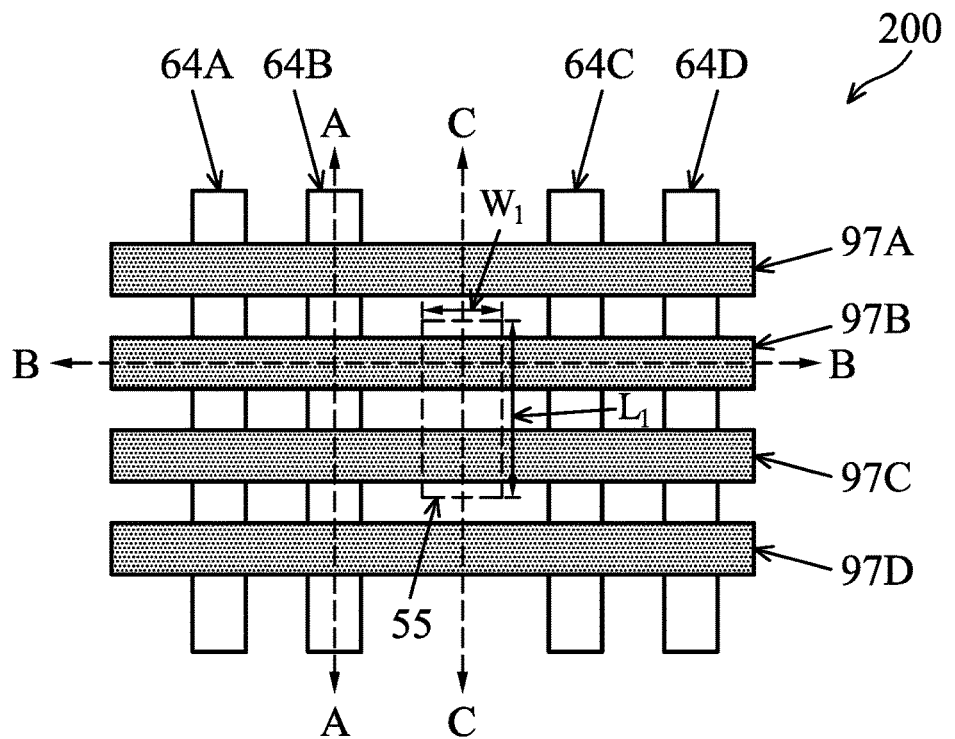

FIG. 22 illustrates the plan view of the FinFET device 200 after the processing illustrated in FIGS. 21A-21C, which is similar to that in FIG. 9, but with no dummy fin 64E (see FIG. 9) under the cutting area 55.

Figure 23:
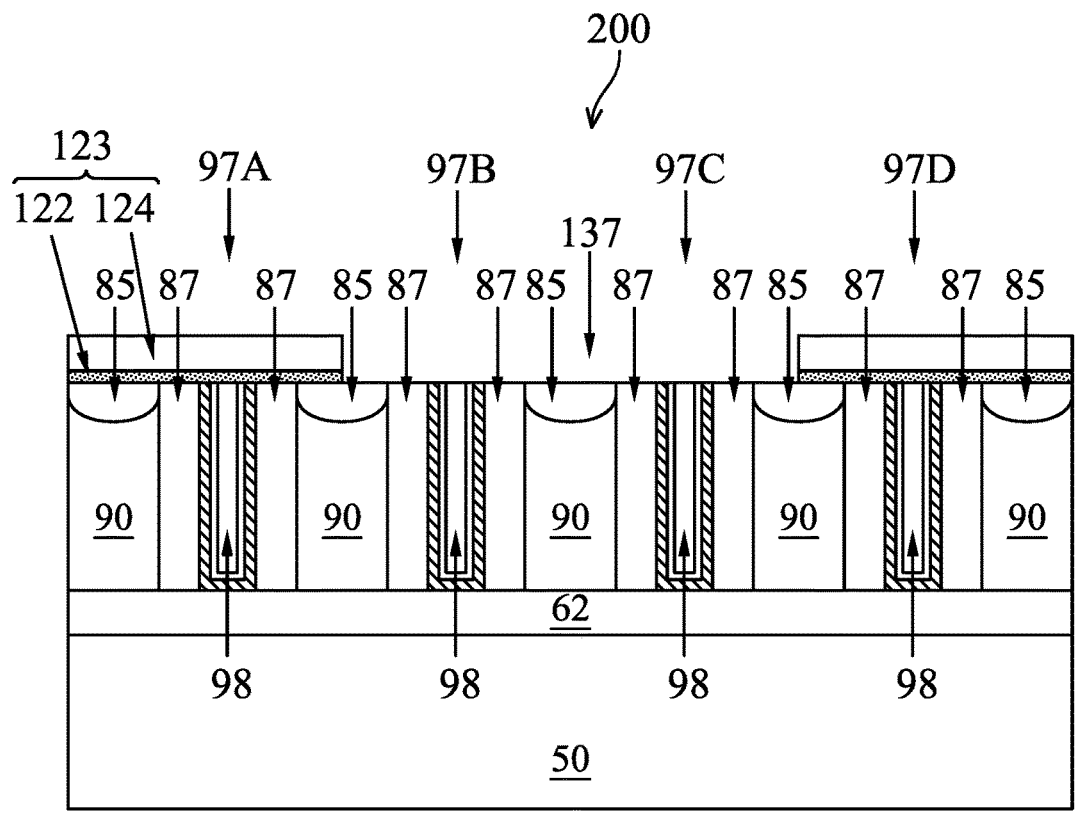

Next, in FIG. 23, upper portions of the first ILD 90 are replaced by a dielectric material 85, and a hard mask layer 123, which may include a first hard mask layer 122 and a second hard mask layer 124, is formed over the FinFET device 200. Next, an opening 137 is formed in the hard mask layer 123. The opening 137 defines the cut area 55 in FIG. 22.

Figure 24A:
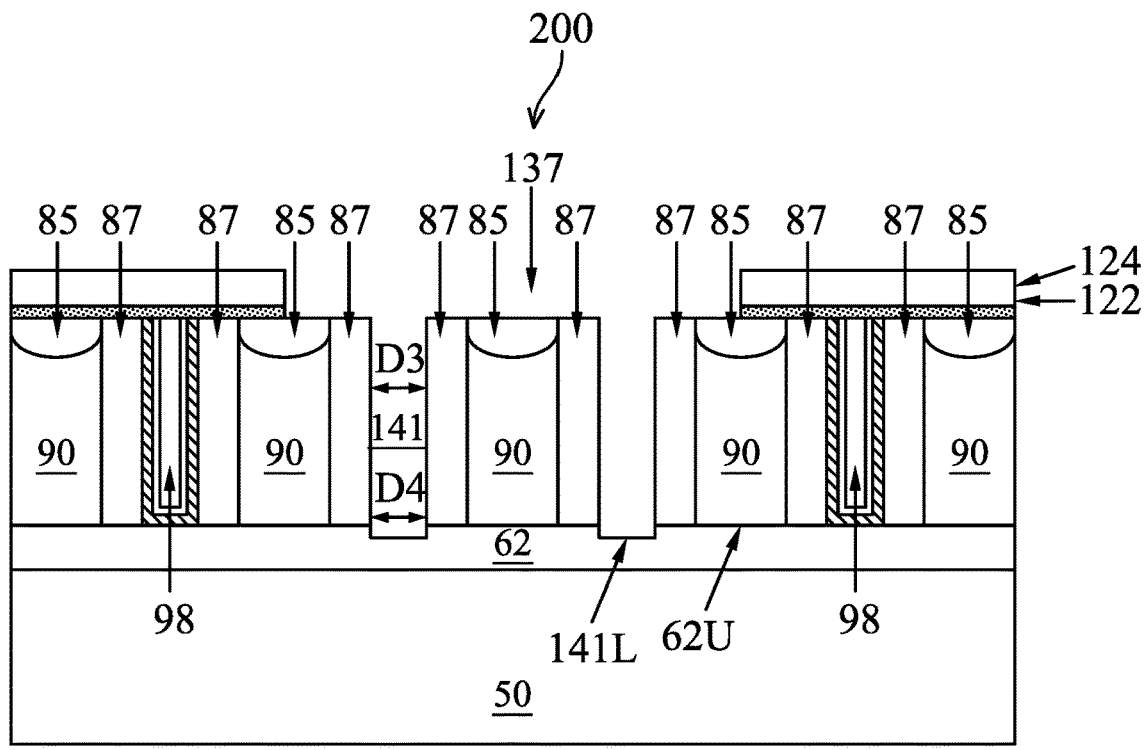
Figure 24B:
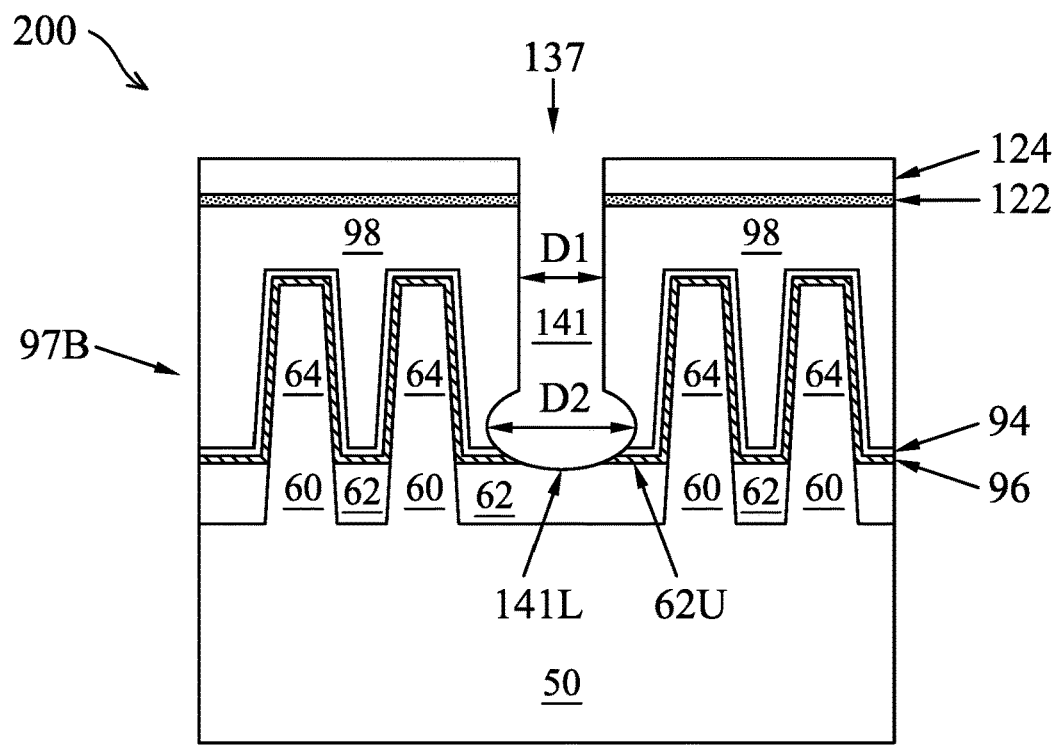

Next, as illustrated in FIGS. 24A and 24B, portions of the metal gates 97B/97C within the cut area 55 (see FIG. 22) and exposed by (e.g., directly under) the opening 137 are removed by an etching process, and recesses 141 are formed in the metal gates 97B/97C. FIG. 24B illustrates the cross-sectional view of the FinFET device 200 along cross-section B-B, which is along the longitudinal direction of the metal gate 97B (see FIG. 22). As illustrated in FIG. 24B, the recesses 141 is formed between fins 64, and extend from the upper surface of the metal gate 97B to a lower surface of the metal gate 97B. The recess 141 exposes at least a portion of the isolation region 62, and may extend into the isolation region 62. In some embodiments, the etching process used to form the recess 141 in FIGS. 24A and 24B is the same as the etching process used to form the recess 141 in FIGS. 13A and 13B, thus details are not repeated. As skilled artisans readily appreciate, in order to separate the metal gate 97B into two separate metal gates, the etching process in FIGS. 24A and 24B should continue until the recess 141 reaches the isolation regions 62. In the illustrated embodiment of FIG. 24A, the etching process may remove top portions of the isolation region 62, such that a lower surface 141L (e.g., a lowest surface) of the recess 141 is below the upper surface 62U of (un-recessed portions of) the isolation region 62.

The recess 141 has an upper portion with a width D1 and a lower portion with a width D2, where D2 is larger than D1. In other words, the recess 141 has an enlarged lower portion. In some embodiments, the width D2 is larger than the width D1 by about 2 nm to about 15 nm. Note that in the cross-section view of FIG. 24A, the upper portion of the recess 141 has a width D3 and the lower portion of the recess 141 has a width D4, where D3 is equal to D4 (e.g., equal within the limitations of manufacturing). In other words, the lower portion of the recess 141 is wider than the upper portion of the recess 141 along cross-section B-B, but has a same width as the upper portion along cross-section C-C.

Figure 25A:
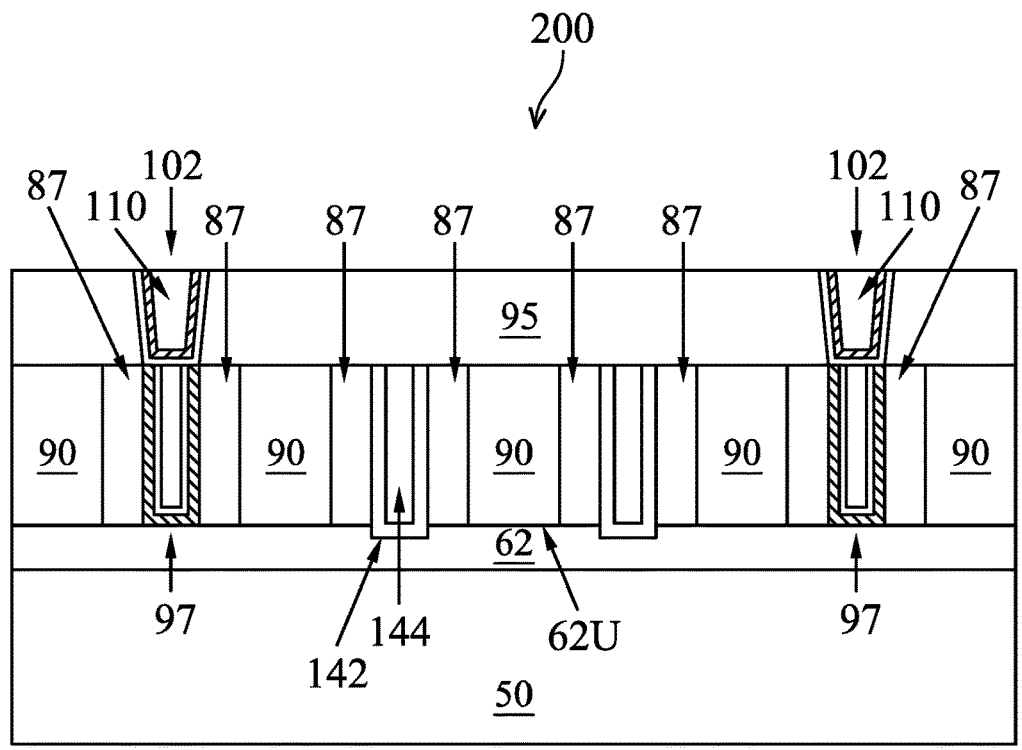
Figure 25B:
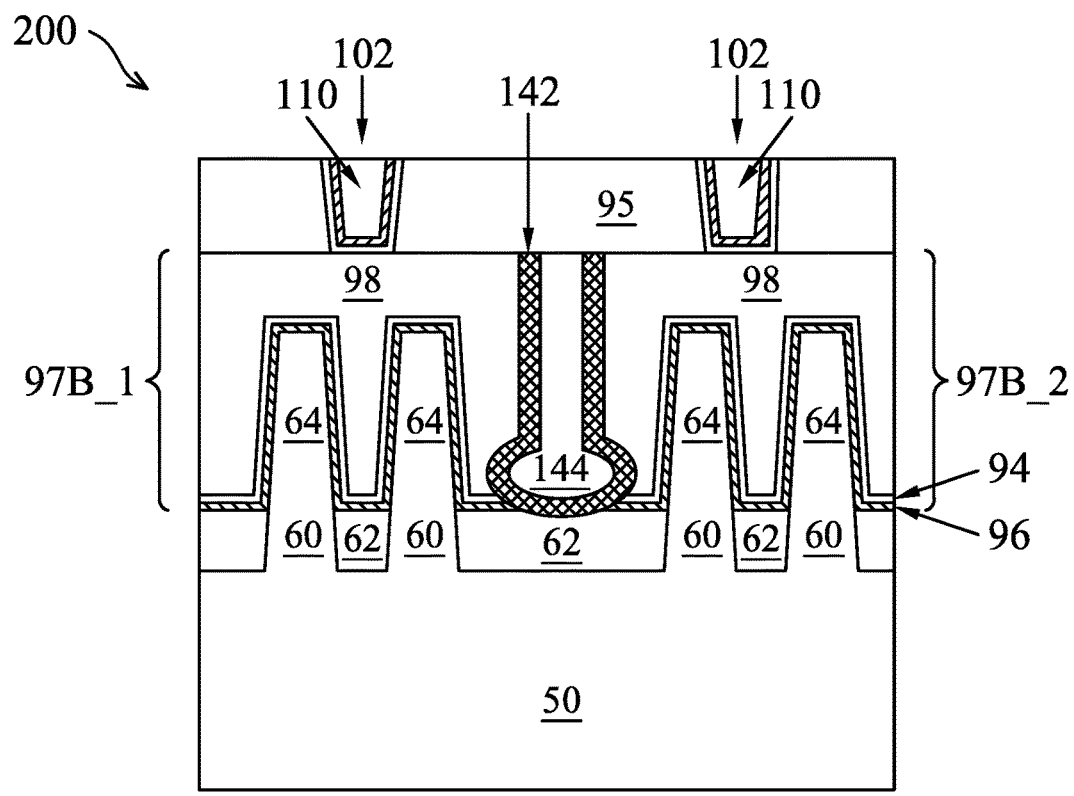

FIGS. 25A and 25B illustrate cross-sectional views of the FinFET device 200, after the recesses 141 are filled with one or more dielectric materials (e.g., 142, 144), and after the second ILD 95 and the contacts 102/106 are formed. Details are similar to those discussed above with the FinFET device 100, thus are not repeated. The corresponding cross-sectional view of the FinFET device 200 in FIGS. 25A and 25B along cross-section A-A is the same as that in FIG. 16A, in some embodiments.

Figure 26:
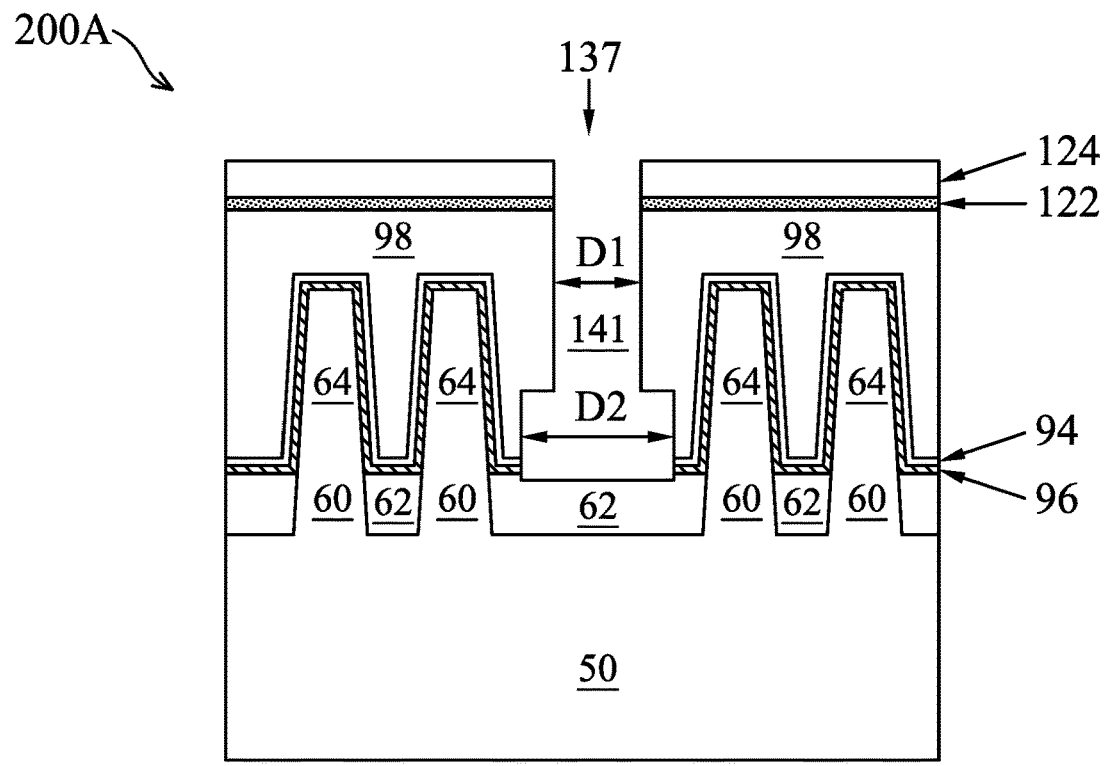
FIGS. 26-27 illustrate cross-sectional views of a FinFET device at various stages of fabrication, in accordance with an embodiment.
Figure 27:
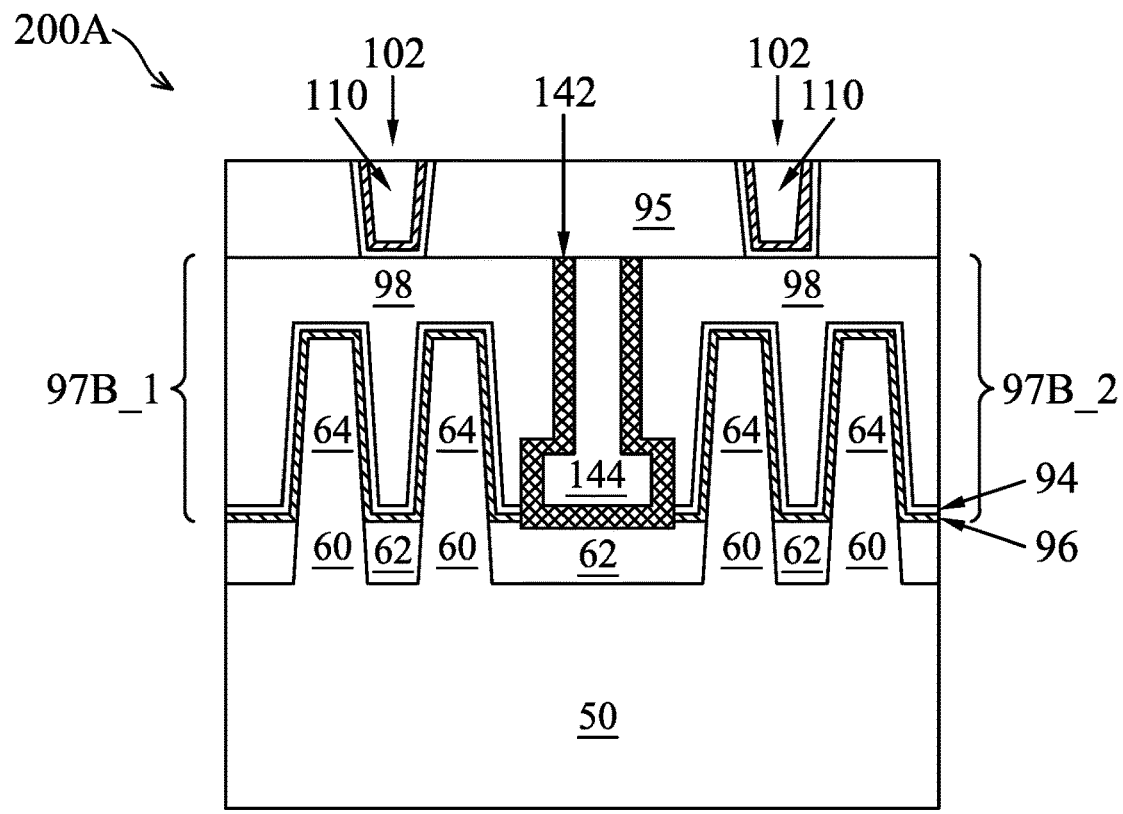
Figure 28:
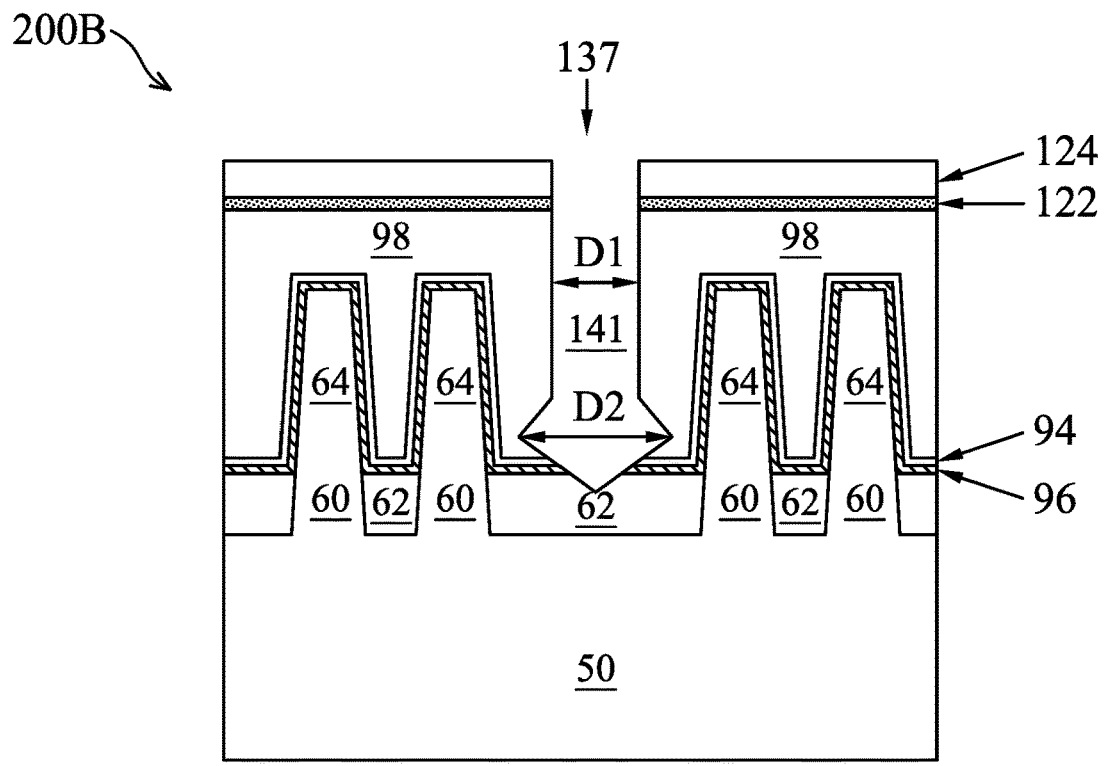
FIGS. 28-29 illustrate cross-sectional views of a FinFET device at various stages of fabrication, in accordance with an embodiment.
Figure 29:
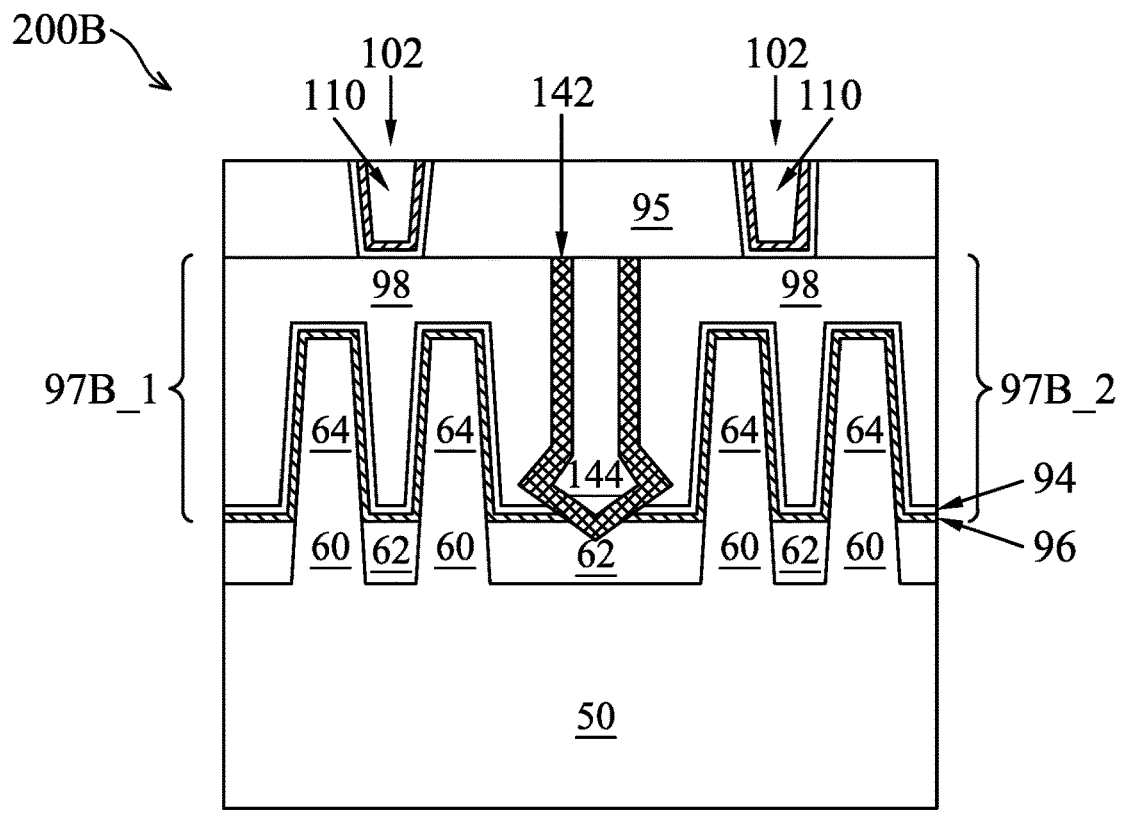

The shape of the recess 141 as illustrated in FIGS. 24A and 24B is a non-limiting example. Additional examples are illustrated in FIGS. 26-29. In particular, FIGS. 26-27 illustrate cross-sectional views of a FinFET device 200A at various stages of fabrication, in accordance with an embodiment. FIGS. 28-29 illustrate cross-sectional views of a FinFET device 200B at various stages of fabrication, in accordance with an embodiment. The FinFET devices 200A and 200B are similar to the FinFET device 200, but with the lower portion of the recess 141 (see FIGS. 26 and 28) having a rectangular cross-section and a (partial) diamond-shaped cross-section, respectively. FIGS. 27 and 29 shows the FinFET devices 200A and 200B after the cut metal gate process is finished.

FIGS. 30, 31A, 31B, 32A, 32B, and 33 illustrate various views (e.g., cross-sectional view, plan view) of a FinFET device 300 at various stages of fabrication, in accordance with an embodiment. The formation process of the FinFET device 300 is similar to that of the FinFET device 100, but with a sacrificial layer 99 formed over the metal gates 97, and with the etching process to form the recess 141 modified, details of which are discussed hereinafter.

Figure 30:
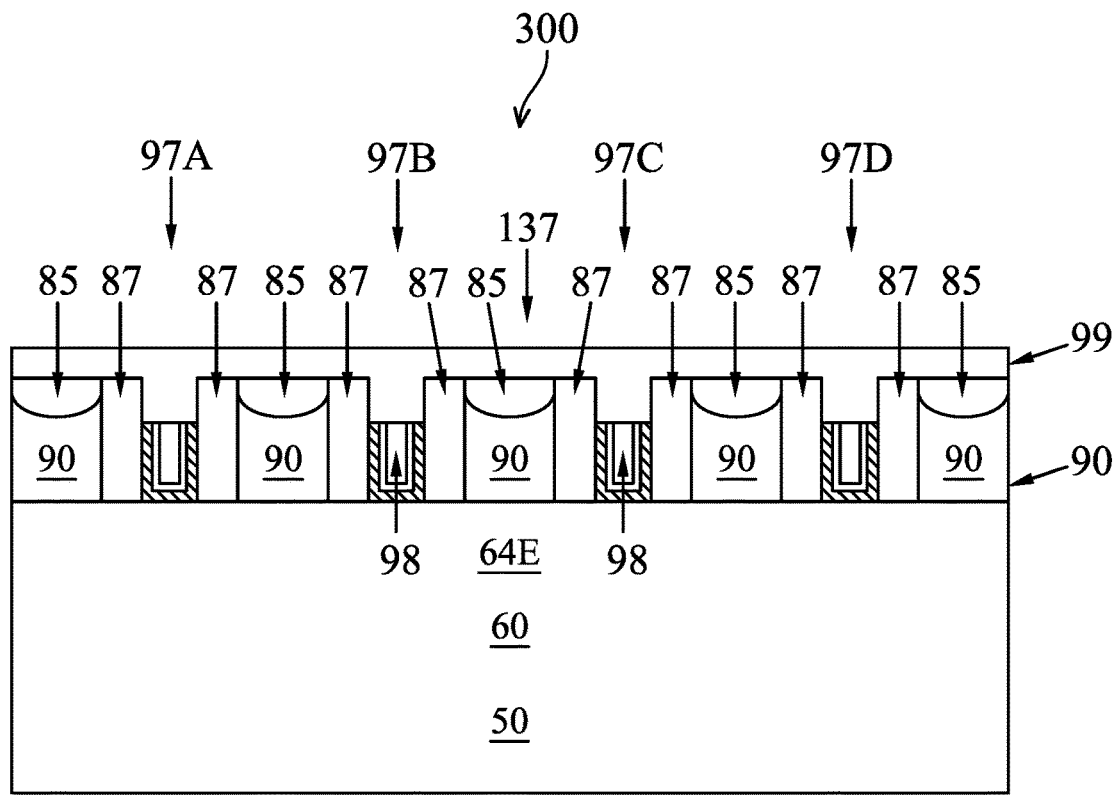
FIGS. 30, 31A, 31B, 32A, 32B, and 33 illustrate various views (e.g., cross-sectional view, plan view) of a FinFET device at various stages of fabrication, in accordance with an embodiment.

FIG. 30 illustrates a cross-sectional view of the FinFET device 300, which may be formed by following the processing step illustrated in FIG. 11. In particular, after the processing illustrated in FIG. 11, the metal gates 97 (e.g., 97A/97B/97C/97D) are recessed by, e.g., an etching process using an etchant that is selective to the material(s) of the metal gates 97. Recesses are formed between the gate spacers 87 after the metal gates 97 are recessed. Next, a sacrificial layer 99 is formed over the recessed metal gates 97 and fills the recesses. The sacrificial layer 99 may also be formed over the upper surfaces of the gate spacers 87 and over the upper surfaces of the dielectric material 85. In an exemplary embodiment, the sacrificial layer 99 comprises amorphous silicon formed using a suitable formation method such as CVD, PECVD, sputtering, combinations thereof, or the like. Next, a planarization process, such as CMP, may be performed to achieve a level upper surface for the sacrificial layer 99.

Figure 31A:
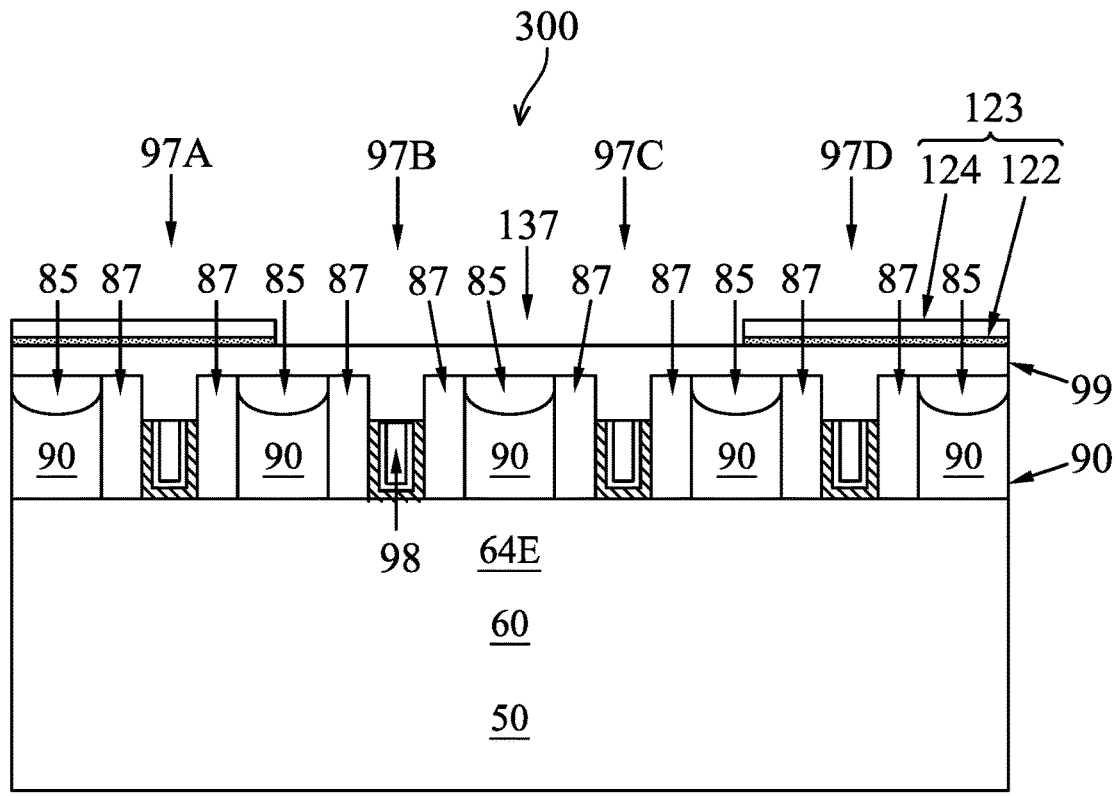
Figure 31B:
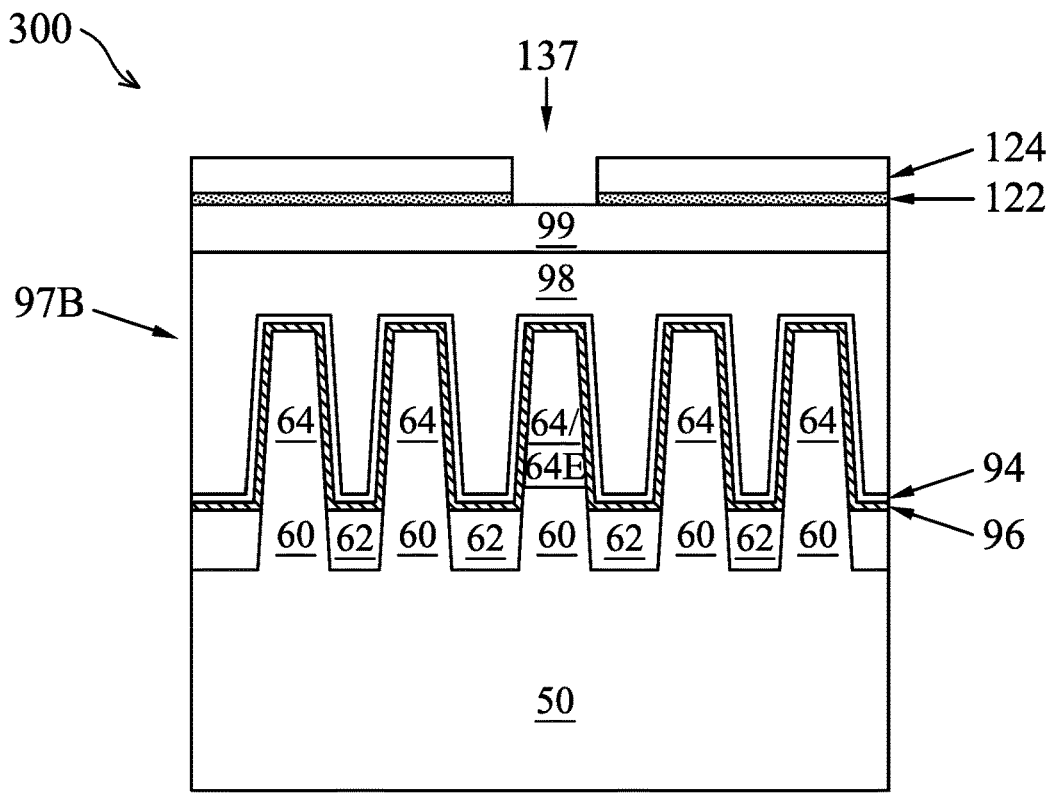

Next, in FIGS. 31A and 31B, a hard mask layer 123 is formed over the sacrificial layer 99, and an opening 137 is formed in the hard mask layer 123. The opening 137 defines the cut area 55 which is the same as or similar to the cut area 55 illustrated in FIG. 9. The opening 137 is directly over the dummy fin 64E, as illustrated in FIG. 31B.

Figure 32A:
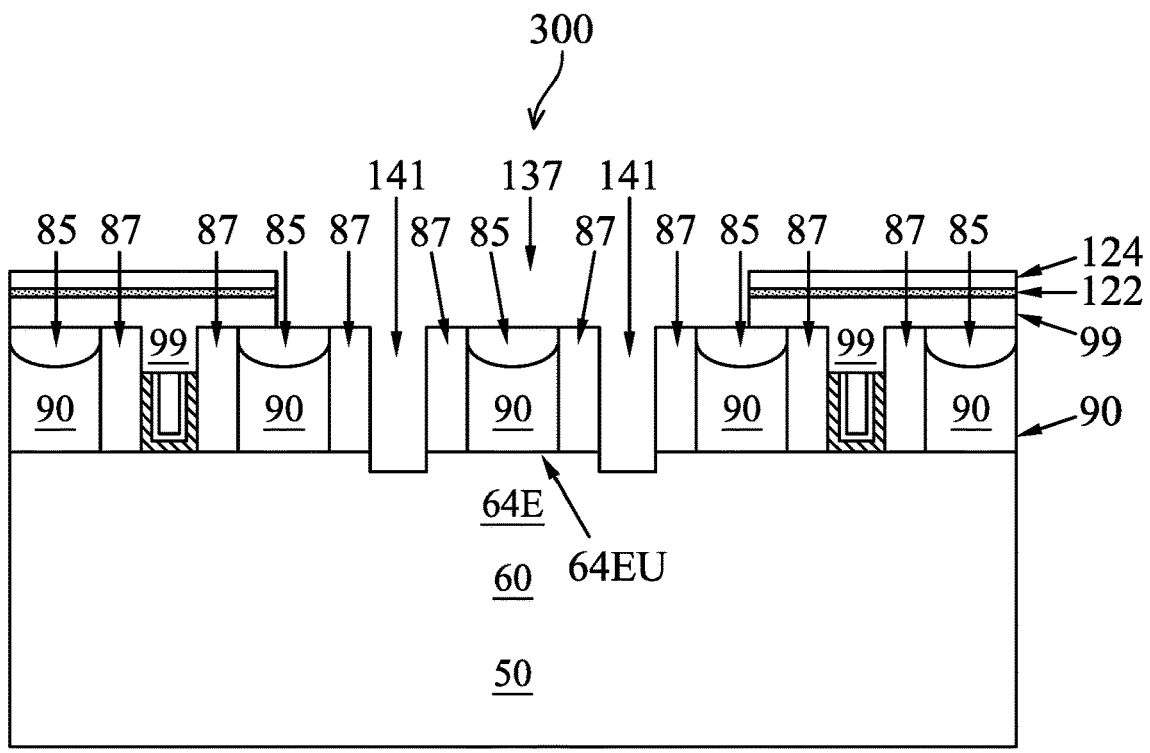
Figure 32B:
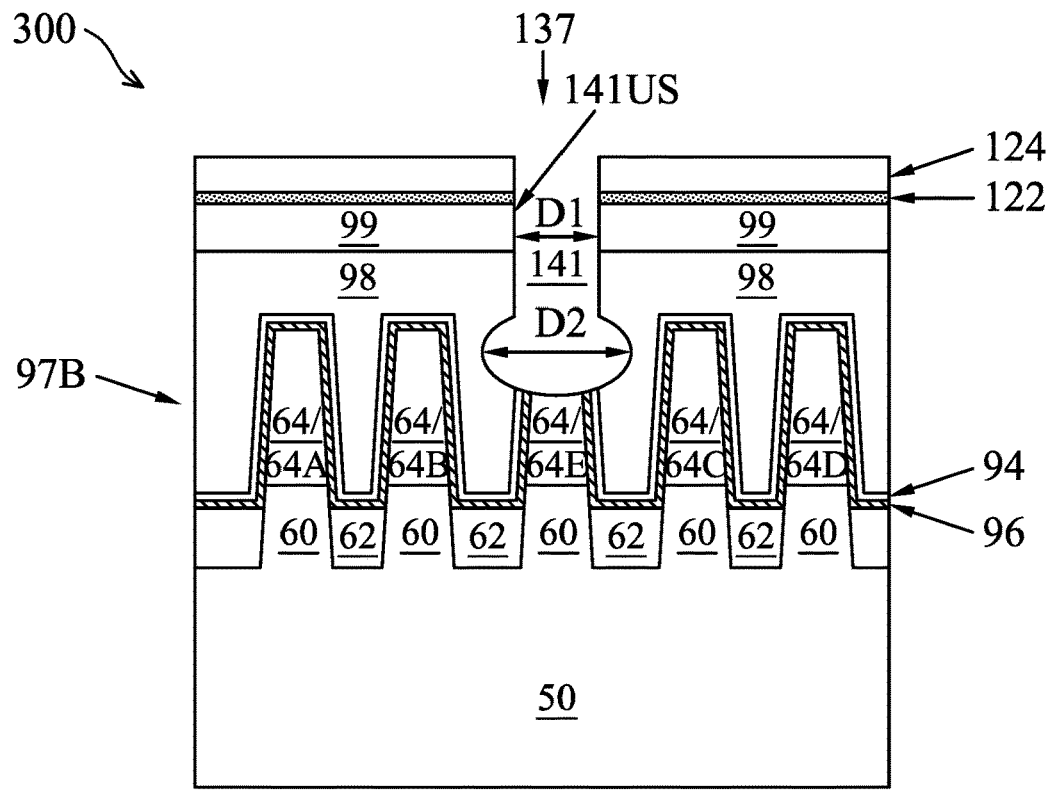

Next, as illustrated in FIGS. 32A and 32B, portions of the metal gates 97B/97C within the cut area 55 (see FIG. 9) and exposed by the opening 137 are removed by an etching process, and recesses 141 are formed in the metal gates 97B/97C. As illustrated in FIG. 32B, the recesses 141 is formed over (e.g., directly over) the dummy fin 64E, and extend into the metal gate 97B to expose at least a top portion of the dummy fin. The recess 141 has an upper portion with a width D1 and a lower portion with a width D2, where D2 is larger than D1. In other words, the recess 141 has an enlarged lower portion in the cross-sectional view of FIG. 13B. In some embodiments, the width D2 is larger than the width D1 by about 2 nm to about 15 nm. The shape and the dimension of the recess 141 are the same or similar to those discussed above with references to FIGS. 13A and 13B, thus details are not repeated.

In some embodiments, to form the recess 141 with the enlarged lower portion (see FIG. 32B), an etching process comprising multiple etching cycles is performed, where each etching cycle extends (e.g., deepens) the recess 141 deeper into the metal gate 97B. The etching process stops when a target depth of the recess 141 is achieved. In some embodiments, each etching cycle includes an oxidization step followed by an etching step. In the oxidization step, a protection layer is formed along sidewalls and a bottom of the recess 141 by converting (e.g., oxidizing) surface portions of the sacrificial layer 99 (e.g., amorphous silicon) exposed by the recess 141 into an oxide. For example, an oxidization process may be performed by supplying an oxygen-containing plasma to the recess 141, which oxygen-containing plasma reacts with (e.g., oxidizes) the surface portions of the amorphous silicon, and converts the surface portions of the amorphous silicon into silicon oxide. Therefore, the converted silicon oxide acts as the protection layer in the illustrated embodiment. The oxidization process may also oxidize surface portions of the metal gate 97B exposed by the recess 141 to form metal oxide (e.g., copper oxide). In the etching step, a suitable etching process, such as a plasma etching process, is performed to remove the portions of the metal gate 97B under the opening 137. Parameters of the etching process are controlled such that the upper portion of the recess 141 has substantially straight sidewalls 141US, and the lower portion of the recess 141 is enlarged compared to the upper portion.

Details of the oxidization step and the etching step in an etching cycle are now described. In the oxidization step, a plasma process using a gas comprising oxygen (e.g., $O_2$) is performed. A flow rate of the oxygen may be between about 20 sccm to about 400 sccm. A carrier gas, such as helium, may be used in the plasma process. A flow rate of helium may be between about 60 sccm and about 120 sccm. A temperature of the plasma process may be between about 60° C. and about 120° C., and a pressure of the plasma process may be between about 5 mTorr and about 30 mTorr.

In the etching step, a suitable etching process, such as plasma etching, is performed to extend the recess 141 deeper into the metal gate 97B. The etching gas used in the etching step is selective to the material(s) of the metal gate 97B, and does not substantially attack the gate spacers 87, the dielectric material 85, and the first ILD 90. In some embodiments, the plasma etching uses an etching gas comprising chlorine (e.g., $Cl_2$, or $SiCl_4$). Carrier gas, such as argon and/or helium, may be used in the plasma etching process. In some embodiments, a flow rate for the chlorine-containing gas (e.g., $SiCl_4$) is between about 3 sccm and about 100 sccm, and a flow rate for helium is between about 30 sccm and about 200 sccm. In some embodiments, the etching gas may further include oxygen (e.g., $O_2$) with a flow rate between about 3 sccm to about 100 sccm. A temperature of the plasma etching may be between about 45° C. and about 120° C., and a pressure of the plasma etching may be between about 15 mTorr and about 100 mTorr. A bias voltage of the plasma etching may be between about 50 V and about 1500 V.

In some embodiments, the protection layer formed by the oxidization process protects the sidewall profile (e.g., straight sidewalls) of the recess 141. Due to less or no protection layer being formed along sidewall portions of the metal gate 97B exposed by the recess 141, materials of the metal gate 97B at the bottom of the recess 141 are etched at a faster rate, thereby resulting in the enlarged lower portion of the recess 141. In some embodiments, the bias voltage of the plasma etching process in the etching step is tuned within a target range (e.g., between about 50 V and about 1500 V) to control the profile of the recess 141 formed. The bias voltage of the plasma etching is tuned to be high enough to maintain the anisotropicity of the plasma etching process, but not too high to avoid turning the plasma etching into a mostly physical etching process. In other words, if the bias voltage is too low (e.g., smaller than about 50 V), the plasma etching process losses its aniostropicity, and if the bias voltage is too high (e.g., higher than about 1500 V), the recess 141 will not have an enlarged lower portion. As a result of tuning the etching conditions, the recess 141 with the enlarged lower portion is formed.

Figure 33:
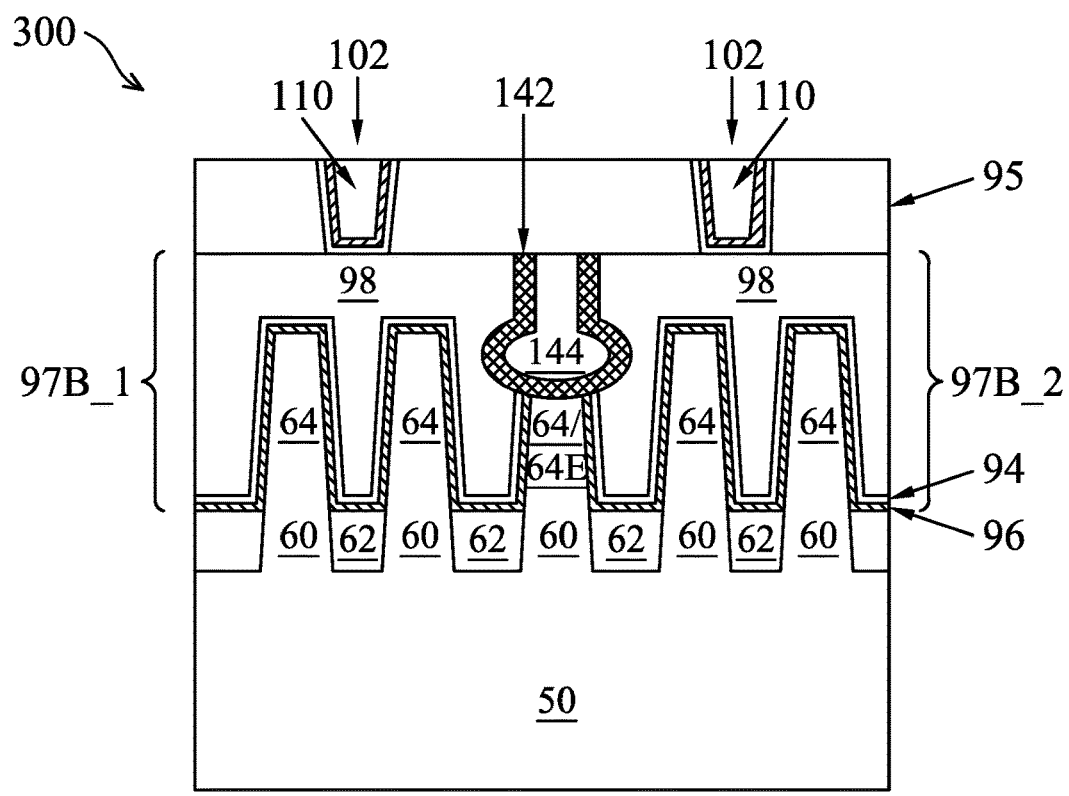
Figure 34:
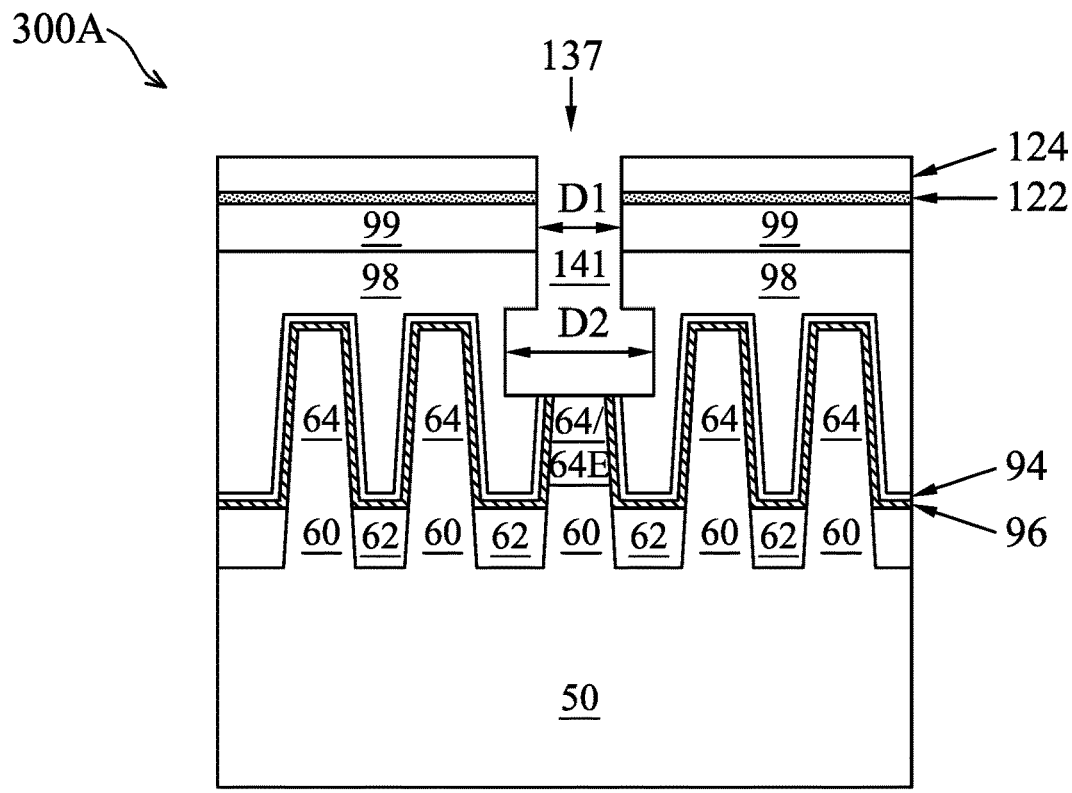
FIGS. 34-35 illustrate cross-sectional views of a FinFET device at various stages of fabrication, in accordance with an embodiment.
Figure 35:
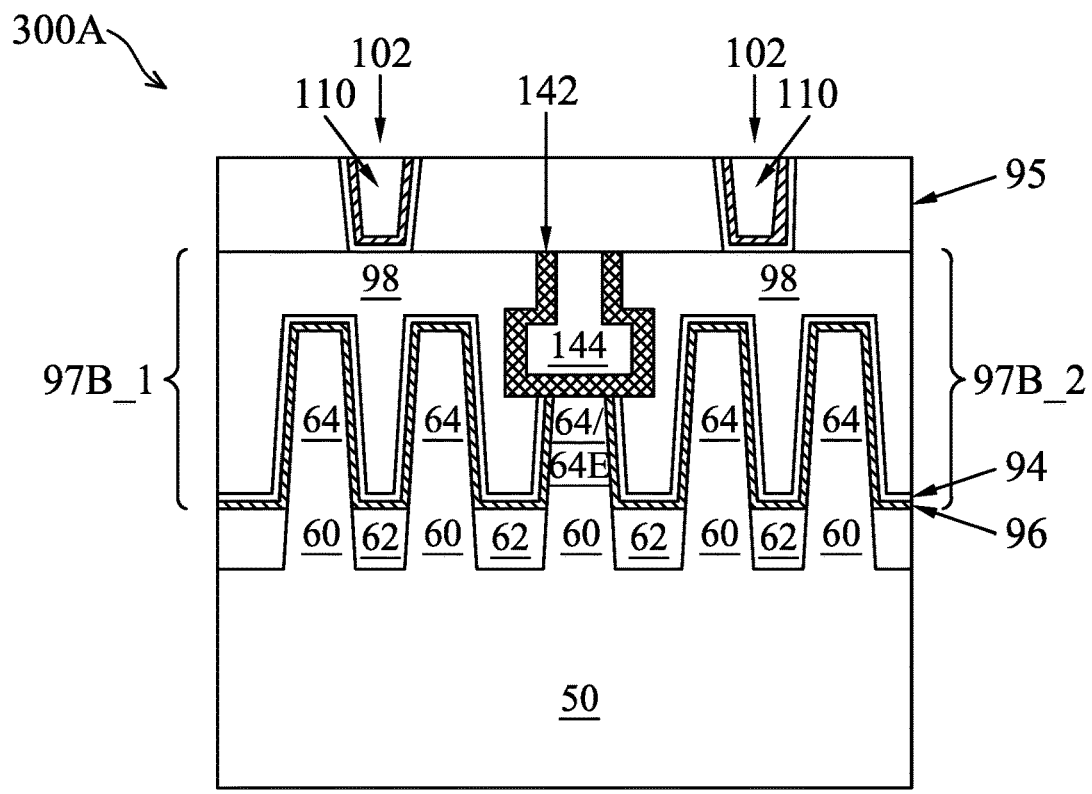

Next, in FIG. 33, the recess 141 is filled with one or more dielectric materials (e.g., 142, 144) to separate the metal gate 97B into two separate metal gates 97B_1 and 97B_2. Next, a planarization process, such as CMP, is performed to remove the hard mask layer (e.g., 122, 124) and the sacrificial layer 99. Next, the second ILD 95 is formed over the metal gates 97B_1 and 97B_2, and contacts 102 are formed to electrically couple to the metal gates 97B_1 and 97B_2. Details are similar to those discussed above with reference to FIG. 16A-16C, thus not repeated here. Note that the corresponding cross-sectional view of the FinFET device 300 along cross-sections A-A and C-C are the same as those illustrated in FIGS. 16A and 16C, respectively, in some embodiments.

In the example of FIG. 32B, the upper portion of the recess 141 has substantially straight sidewalls 141US, and the lower portion of the recess 141 is enlarged and has curved sidewalls which resemble portions of a circle, an oval, or the like. The shape of the lower portion of the recess 141 illustrated in FIG. 32B is merely a non-limiting example, other shapes are also possible and are fully intended to be included within the scope of the present disclosure.

Figure 36:
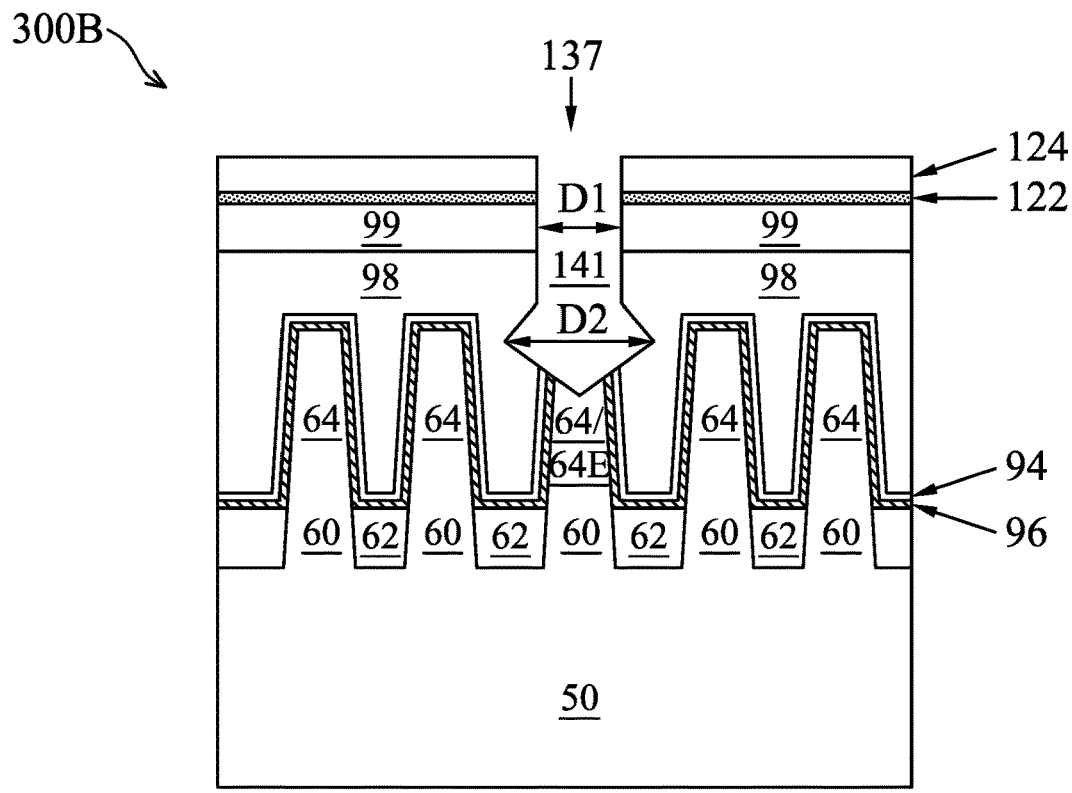
FIGS. 36-37 illustrate cross-sectional views of a FinFET device at various stages of fabrication, in accordance with an embodiment.
Figure 37:
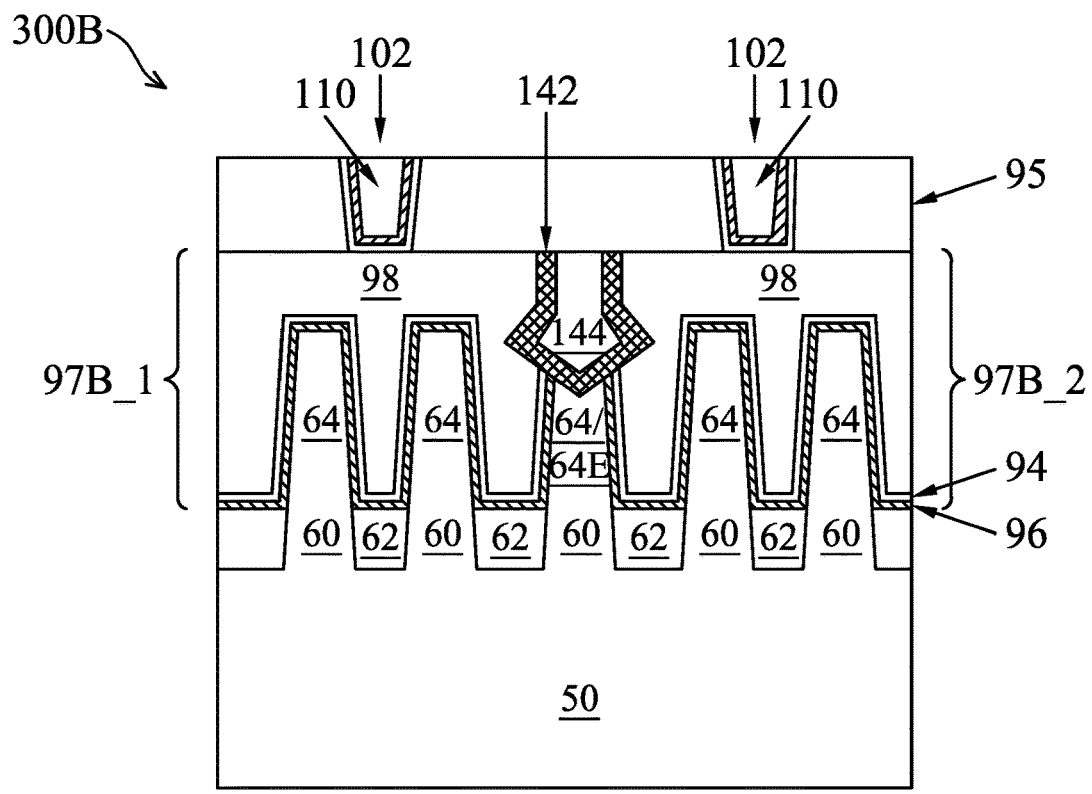
Figure 38:
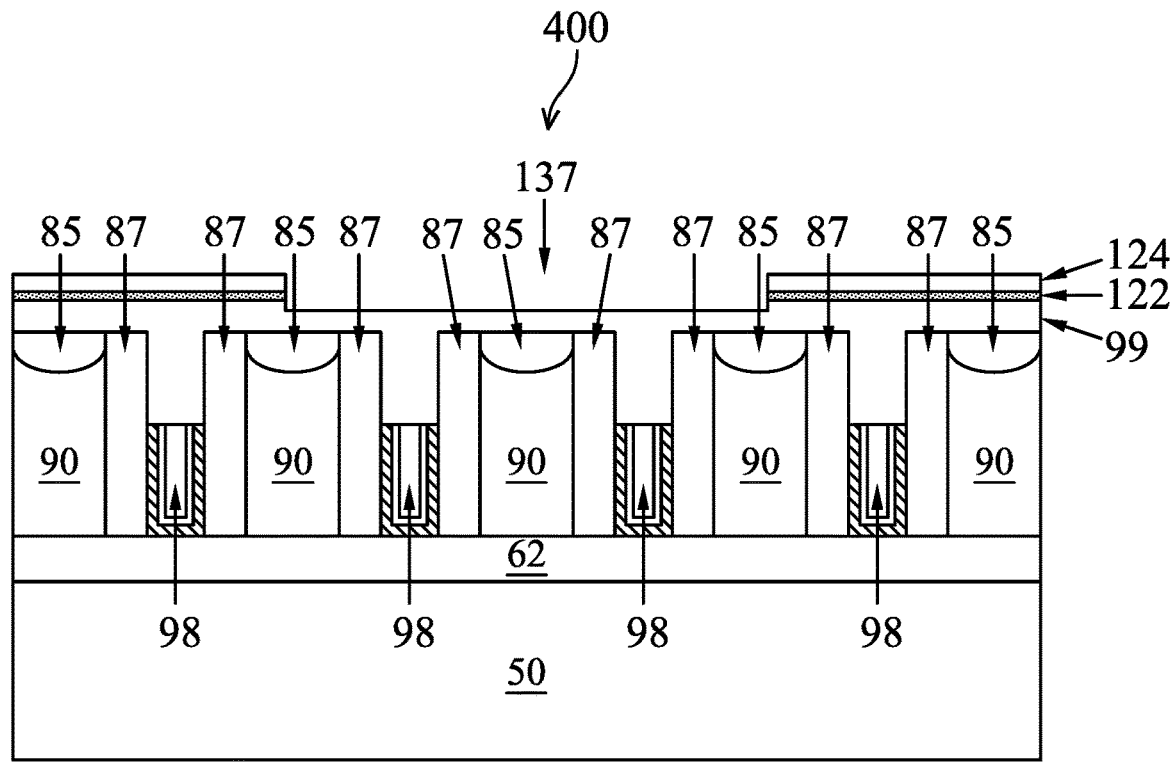
FIGS. 38, 39A, 39B, and 40 illustrate various views (e.g., cross-sectional view, plan view) of a FinFET device at various stages of fabrication, in accordance with an embodiment.

As examples, FIGS. 34-37 illustrate cross-sectional views of a FinFET device 300A along cross-section B-B, before and after the recess 141 is filled with one or more dielectric material (e.g., 142, 144), in accordance with an embodiment. In addition, FIGS. 36-37 illustrate cross-sectional views of a FinFET device 300B, before and after the recess 141 is filled with one or more dielectric material (e.g., 142, 144), in accordance with an embodiment. The FinFET device 300A and 300B are similar to the FinFET device 100, but with the recess 141 having a rectangular cross-section and a (partial) diamond-shaped cross-section, respectively.

FIGS. 38, 39A, 39B, and 40 illustrate cross-sectional views of a FinFET device 400 at various stages of fabrication, in accordance with an embodiment. The FinFET device 400 is similar to the FinFET device 300, but without the dummy fin 64E formed. As a result, to cut the metal gate 97B into two separate metal gates, the recess 141 is formed to extend through the metal gate 97B until portions of the isolation regions 62 is exposed. Details are the same or similar as those discussed above, thus are not repeated.

Figure 39A:
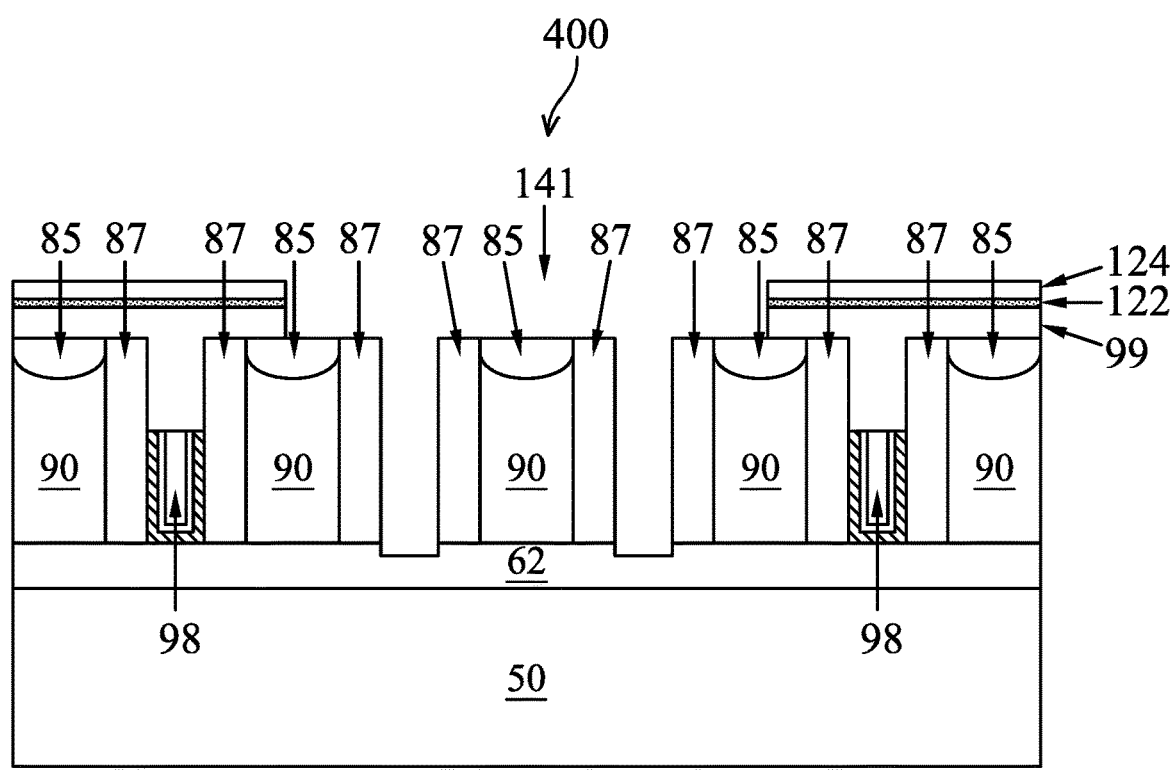
Figure 39B:
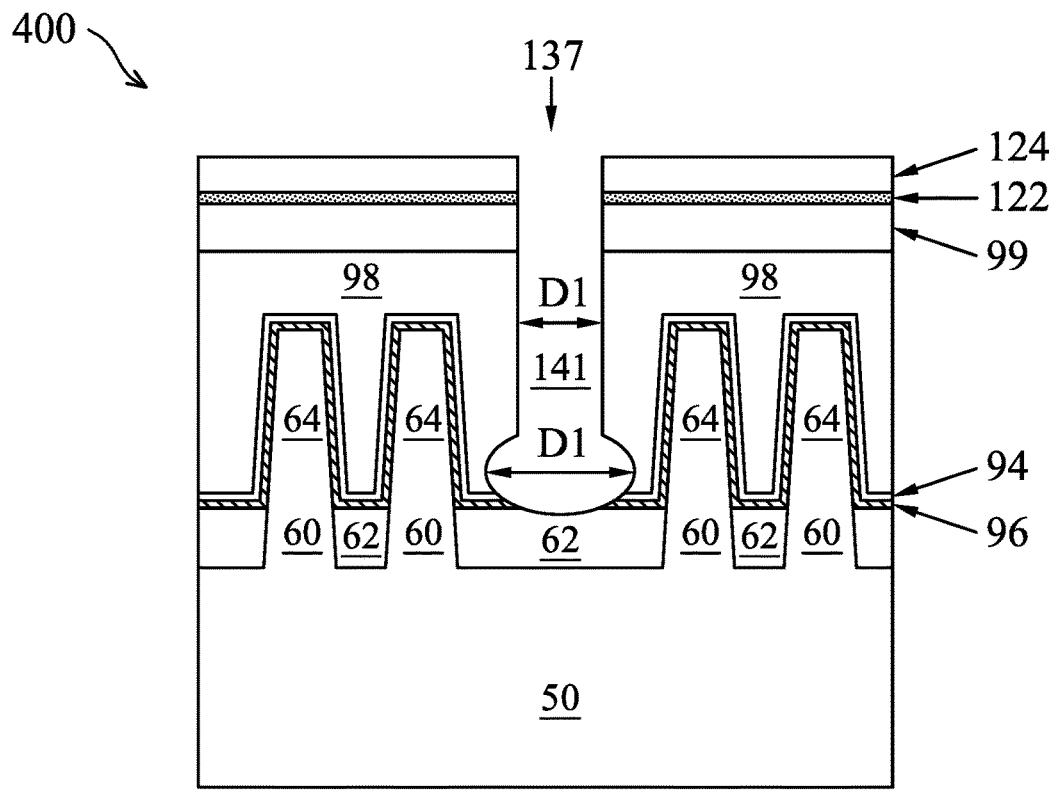
Figure 40:
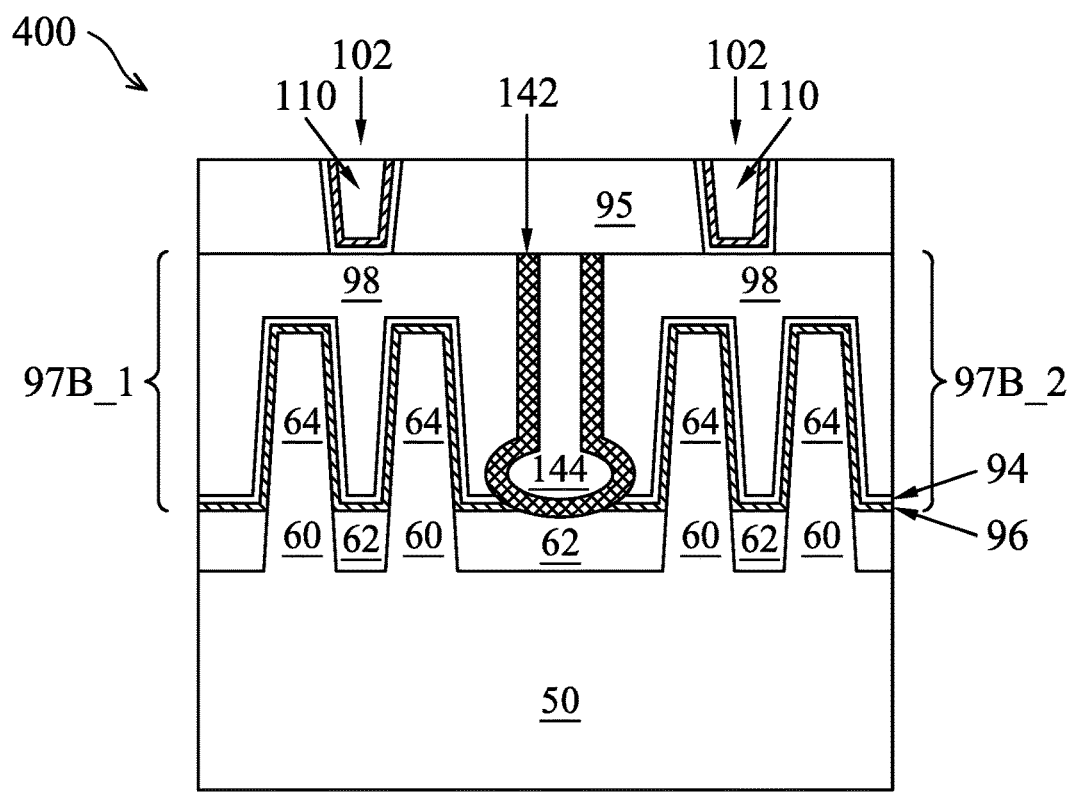

In FIG. 39B, the upper portion of the recess 141 has substantially straight sidewalls 141US, and the lower portion of the recess 141 is enlarged and has curved sidewalls which resemble portions of a circle, an oval, or the like. The shape of the lower portion of the recess 141 illustrated in FIG. 39B is merely a non-limiting example, other shapes are also possible and are fully intended to be included within the scope of the present disclosure.

Figure 41:
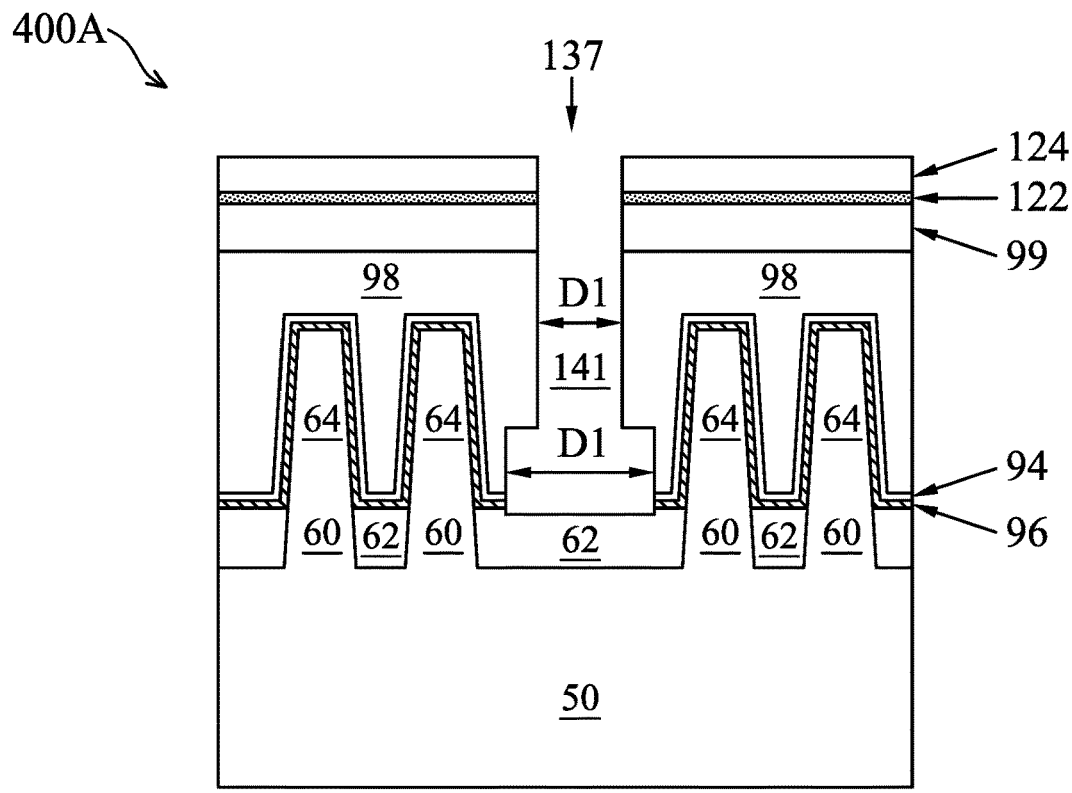
FIGS. 41-42 illustrate cross-sectional views of a FinFET device at various stages of fabrication, in accordance with an embodiment.
Figure 42:
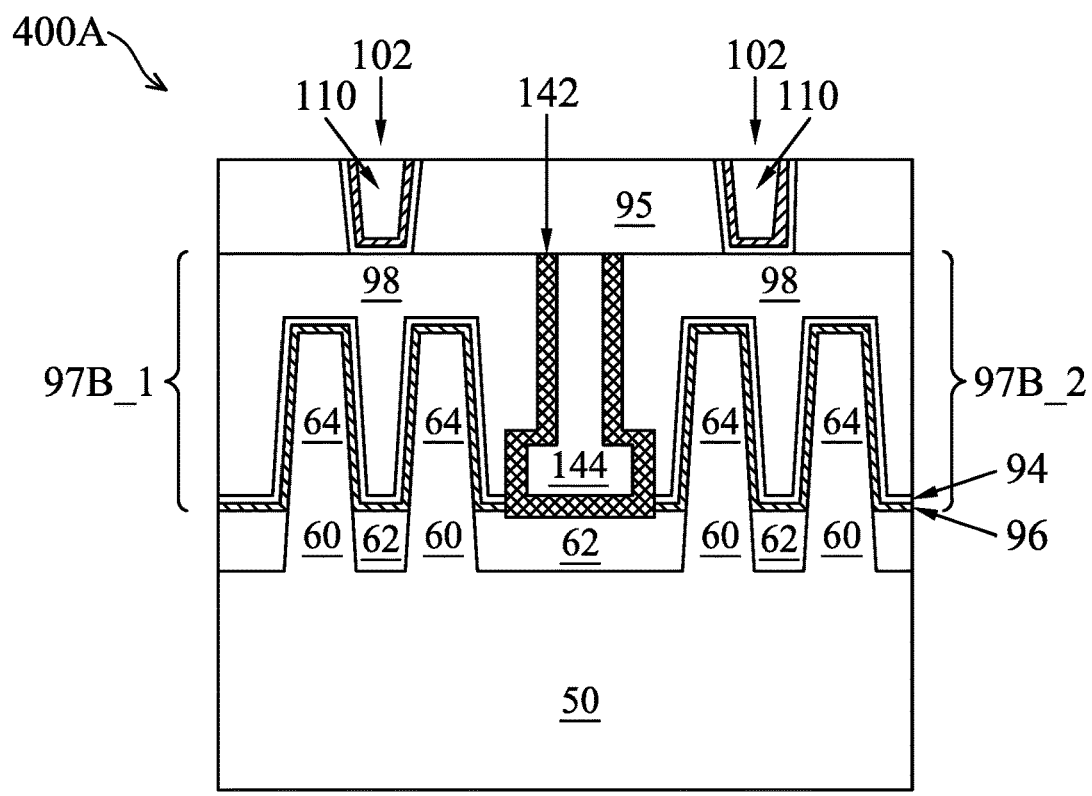
Figure 43:
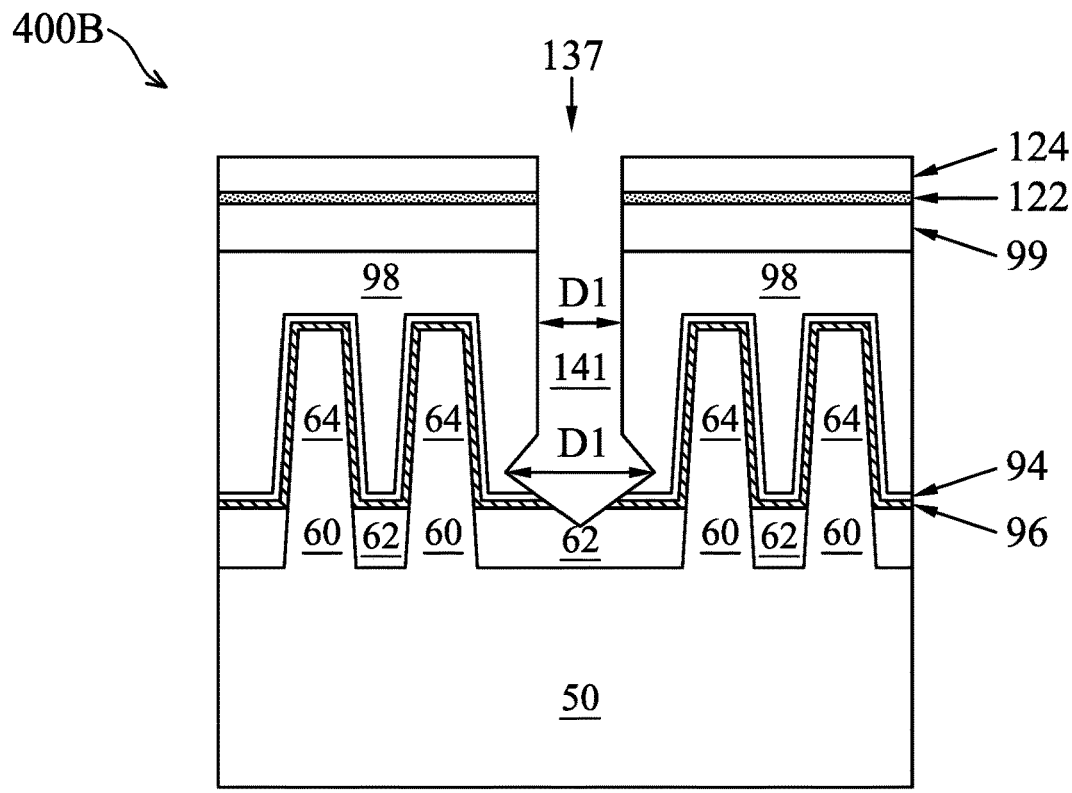
FIG. 43-44 illustrate cross-sectional views of a FinFET device at various stages of fabrication, in accordance with an embodiment.
Figure 44:
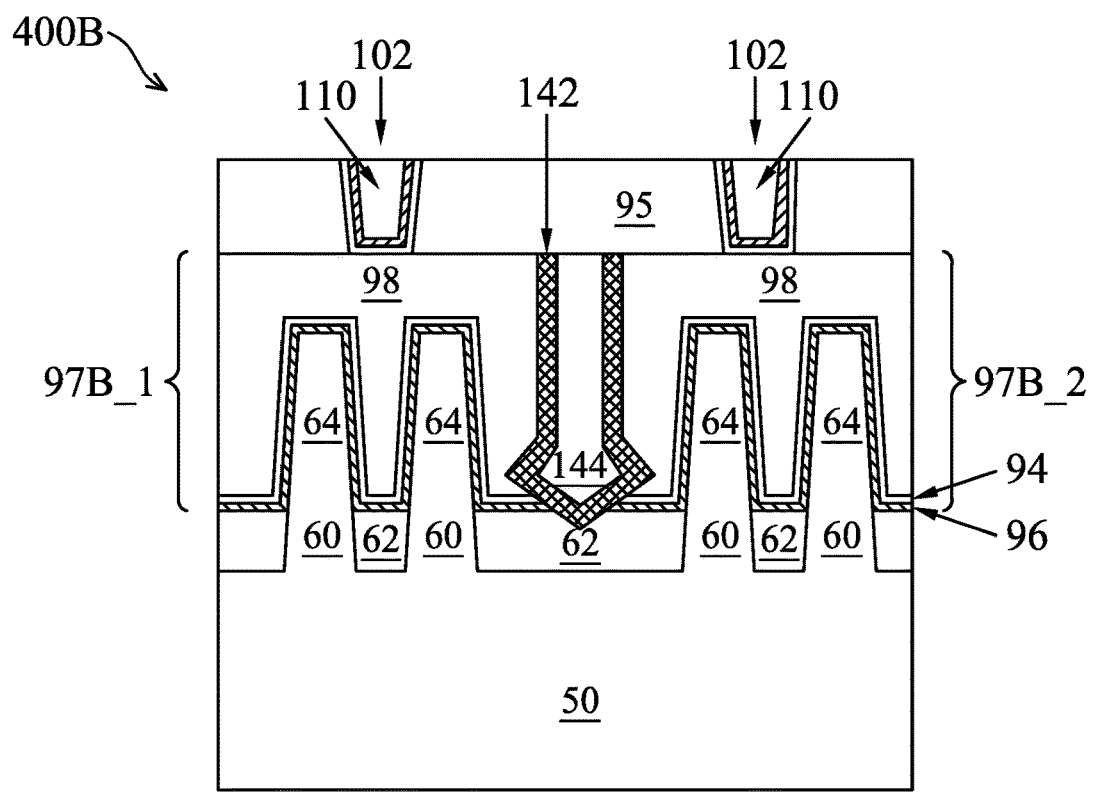

As examples, FIGS. 41-42 illustrate cross-sectional views of a FinFET device 400A along cross-section B-B, before and after the recess 141 is filled with one or more dielectric material (e.g., 142, 144), in accordance with an embodiment. In addition, FIGS. 43-44 illustrate cross-sectional views of a FinFET device 400B, before and after the recess 141 is filled with one or more dielectric material (e.g., 142, 144), in accordance with an embodiment. The FinFET device 400A and 400B are similar to the FinFET device 400, but with the recess 141 having a rectangular cross-section and a (partial) diamond-shaped cross-section, respectively.

Figure 45:
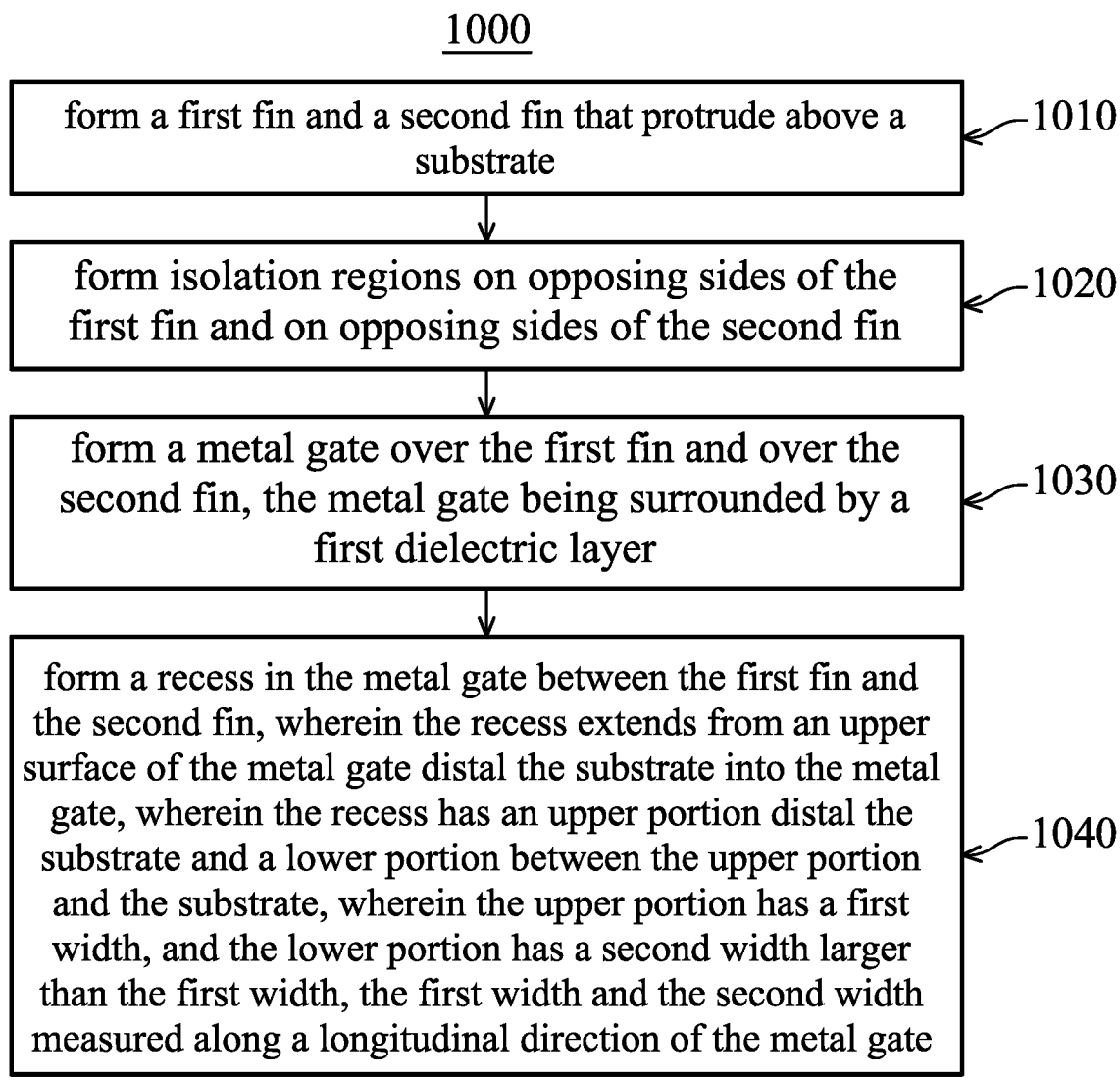
FIG. 45 illustrates a flow chart of a method of fabricating a semiconductor device, in accordance with some embodiments.

FIG. 45 illustrates a flow chart 1000 of a method of fabricating a semiconductor device, in accordance with some embodiments. It should be understood that the embodiment method shown in FIG. 45 is merely an example of many possible embodiment methods. One of ordinary skill in the art would recognize many variations, alternatives, and modifications. For example, various steps as illustrated in FIG. 45 may be added, removed, replaced, rearranged and repeated.

Referring to FIG. 45, at step 1010, a first fin and a second fin are formed that protrude above a substrate. At step 1020, isolation regions are formed on opposing sides of the first fin and on opposing sides of the second fin. At step 1030, a metal gate is formed over the first fin and over the second fin, the metal gate being surrounded by a first dielectric layer. At step 1040, a recess is formed in the metal gate between the first fin and the second fin, wherein the recess extends from an upper surface of the metal gate distal the substrate into the metal gate, wherein the recess has an upper portion distal the substrate and a lower portion between the upper portion and the substrate, wherein the upper portion has a first width, and the lower portion has a second width larger than the first width, the first width and the second width measured along a longitudinal direction of the metal gate.

Embodiments may achieve advantages. Various embodiments of the present disclosure form a recess in the metal gate with an enlarged lower portion during the cut metal gate process. The recess in the metal gate is then filled with one or more dielectric materials to separate the metal gate into two separate metal gates. The enlarged lower portion of the recess allows better removal of the materials of the metal gate at the bottom of the recess during the cut metal gate process, thus avoiding or reducing electrical short between the two separate gates formed by the cut metal gate process.

In an embodiment, a method of forming a semiconductor device includes forming a first fin and a second fin that protrude above a substrate; forming isolation regions on opposing sides of the first fin and on opposing sides of the second fin; forming a metal gate over the first fin and over the second fin, the metal gate being surrounded by a first dielectric layer; and forming a recess in the metal gate between the first fin and the second fin, wherein the recess extends from an upper surface of the metal gate distal the substrate into the metal gate, wherein the recess has an upper portion distal the substrate and a lower portion between the upper portion and the substrate, wherein the upper portion has a first width, and the lower portion has a second width larger than the first width, the first width and the second width measured along a longitudinal direction of the metal gate. In an embodiment, forming the metal gate comprises: forming a dummy gate over the first fin and over the second fin; forming the first dielectric layer around the dummy gate; and replacing the dummy gate with the metal gate. In an embodiment, the method further comprises filling the recess with a dielectric material, wherein after filling the recess with the dielectric material, the metal gate is separated into a first metal gate over the first fin and a second metal gate over the second fin. In an embodiment, the recess extends from the upper surface of the metal gate to an opposing lower surface of the metal gate, wherein the recess exposes at least a portion of the isolation regions. In an embodiment, the method further comprises forming a third fin between the first fin and the second fin, wherein the recess is formed over the third fin, and is formed to extend from the upper surface of the metal gate to the third fin. In an embodiment, forming the recess comprises: forming a patterned mask layer over the metal gate and over the first dielectric layer, the patterned mask layer having an opening over a portion of the metal gate between the first fin and the second fin; and performing an etching process using the patterned mask layer as an etching mask to form the recess. In an embodiment, performing the etching process comprises performing a plurality of etching cycles, wherein each of the plurality of etching cycles comprises: forming a protection layer along sidewalls of the metal gate exposed by the recess; and etching the metal gate using an etchant. In an embodiment, forming the protection layer comprises depositing the protection layer over the sidewalls of the metal gate. In an embodiment, depositing the protection layer comprises depositing the protection layer using a first precursor comprising silicon and a second precursor comprising oxygen, wherein etching the metal gate comprising etching the metal gate using an etching gas comprising boron trichloride. In an embodiment, the method further comprises, before forming the recess in the metal gate: recessing the upper surface of the metal gate below an upper surface of the first dielectric layer; and forming a sacrificial layer over the recessed upper surface of the metal gate and over the upper surface of the first dielectric layer. In an embodiment, performing the etching process comprises performing a plurality of etching cycles, wherein each of the plurality of etching cycles comprises: converting portions of the sacrificial layer exposed by the recess into a protection layer; and etching the metal gate using an etchant. In an embodiment, the sacrificial layer comprises amorphous silicon, and the protection layer comprises silicon oxide, wherein etching the metal gate comprising etching the metal gate using an etching gas comprising chlorine.

In an embodiment, a method of forming a semiconductor device includes forming a first dielectric layer around a dummy gate structure, the dummy gate structure disposed over a first fin and a second fin; replacing the dummy gate structure with a metal gate structure; forming a patterned mask layer over the metal gate structure and the first dielectric layer, wherein the patterned mask layer has an opening over the metal gate structure; performing an etching process to from a recess aligned with the opening of the pattern mask layer, wherein the etching process comprises a plurality of etching cycles, wherein each of the plurality of etching cycles comprises: forming a protection layer in the recess; and removing portions of the metal gate structure using an etchant that is selective to materials of the metal gate structure; and filling the recess with a second dielectric material. In an embodiment, the recess extends through the metal gate structure and exposes a portion of an isolation region between the first fin and the second fin. In an embodiment, the dummy gate structure is also disposed over a dummy fin between the first fin and the second fin, wherein the recess is formed over the dummy fin, and a lower portion of the recess exposes a top portion of the dummy fin. In an embodiment, the recess extends from an upper surface of the metal gate structure into the metal gate structure, wherein along a longitudinal direction of the metal gate structure, an upper portion of the recess proximate the upper surface of the metal gate is narrower than a lower portion of the recess in the metal gate structure.

In an embodiment, a semiconductor device includes a first fin over a substrate; a second fin over the substrate and adjacent to the first fin; a first metal gate over the first fin; a second metal gate over the second fin, wherein a first longitudinal direction of the first metal gate is along a same line as a second longitudinal direction of the second metal gate; and a dielectric structure disposed between and contacting the first metal gate and the second metal gate, the dielectric structure having an upper portion and a lower portion, the lower portion disposed between the upper portion and the substrate, wherein the lower portion extends beyond lateral extents of the upper portion along the first longitudinal direction. In an embodiment, the semiconductor device further comprises shallow trench isolation (STI) regions adjacent to the first fin and the second fin, wherein the lower portion of the dielectric structure contacts the STI regions. In an embodiment, the semiconductor device further comprises a dummy fin between the first fin and the second fin, wherein the lower portion of the dielectric structure contacts a top portion of the dummy fin. In an embodiment, the lower portion and the upper portion of the dielectric structure have a same width measured along a direction perpendicular to the first longitudinal direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a first fin and a second fin that protrude above a substrate;
    forming a metal gate structure over the first fin and over the second fin, the metal gate structure being surrounded by a first dielectric layer;
    recessing an upper surface of the metal gate structure;
    forming a sacrificial layer over the recessed upper surface of the metal gate structure and over the first dielectric layer; and
    after forming the sacrificial layer, forming a recess in the metal gate structure between the first fin and the second fin, wherein the recess has an upper portion distal from the substrate and has a lower portion between the upper portion and the substrate, wherein the upper portion has a first width, and the lower portion has a second width larger than the first width, the first width and the second width measured along a longitudinal direction of the metal gate structure.

2. The method of claim 1, further comprising:
    filling the recess with a dielectric material; and
    after filling the recess, removing the sacrificial layer.

3. The method of claim 1, wherein the upper portion of the recess and the lower portion of the recess have a same width measured along a direction perpendicular to the longitudinal direction of the metal gate structure.

4. The method of claim 1, wherein the recess is formed to extend through the metal gate structure and into an isolation region between the first fin and the second fin, wherein the first fin and the second fin protrude above the isolation region.

5. The method of claim 1, further comprising, before forming the metal gate structure, forming a dummy fin between the first fin and the second fin using a dielectric material, wherein the metal gate structure is formed over the first fin, the second fin, and the dummy fin.

6. The method of claim 5, wherein the recess is formed in the metal gate structure over the dummy fin, wherein the recess extends from an upper surface of the metal gate structure distal from the substrate into the dummy fin.

7. The method of claim 1, wherein forming the recess comprises:
   forming a patterned mask layer over the sacrificial layer, the patterned mask layer having an opening exposing the sacrificial layer between the first fin and the second fin; and
   performing an etching process using the patterned mask layer as an etching mask to extend the opening into the sacrificial layer and the metal gate structure.

8. The method of claim 7, wherein performing the etching process comprises performing a plurality of etching cycles, wherein each of the plurality of etching cycles comprises:
   converting exterior portions of the sacrificial layer exposed by the opening into a protection layer; and
   performing an anisotropic etching process to extend the opening.

9. The method of claim 8, wherein the anisotropic etching process is a plasma etching process.

10. The method of claim 8, wherein the sacrificial layer is formed of amorphous silicon, and the protection layer comprises silicon oxide.

11. The method of claim 10, wherein converting exterior portions of the sacrificial layer comprises oxidizing the exterior portions of the sacrificial layer.

12. A method of forming a semiconductor device, the method comprising:
   forming a first dielectric layer around a dummy gate structure, the dummy gate structure disposed over a first fin, a second fin, and a dummy fin between the first fin and the second fin;
   replacing the dummy gate structure with a replacement gate structure;
   forming a patterned mask layer over the replacement gate structure and the first dielectric layer, wherein the patterned mask layer has an opening overlying the dummy fin;
   performing an etching process to form a recess aligned with the opening of the patterned mask layer, wherein the recess extends into the replacement gate structure and exposes a top portion of the dummy fin; and
   filling the recess with a dielectric material.

13. The method of claim 12, wherein performing the etching process comprises performing a plurality of etching cycles, wherein each of the plurality of etching cycles comprises:
   forming a protection layer in the recess; and
   removing portions of the replacement gate structure using an etchant that is selective to materials of the replacement gate structure.

14. The method of claim 13, wherein forming the protection layer comprises depositing the protection layer on sidewalls and a bottom of the recess.

15. The method of claim 13, further comprising, before forming the patterned mask layer:
   recessing the replacement gate structure; and
   forming a sacrificial layer on the recessed replacement gate structure.

16. The method of claim 15, wherein forming the protection layer comprises converting exterior portions of the sacrificial layer into the protection layer.

17. The method of claim 12, wherein the recess extends from an upper surface of the replacement gate structure into the replacement gate structure, wherein along a longitudinal direction of the replacement gate structure, an upper portion of the recess proximate to the upper surface of the replacement gate structure is narrower than a lower portion of the recess in the replacement gate structure.

18. A method of forming a semiconductor device, the method comprising:
   forming a first fin and a second fin over a substrate;
   forming a dummy fin between the first fin and the second fin using a first dielectric material;
   forming a gate structure over the first fin, the second fin, and the dummy fin; and
   forming a dielectric structure in the gate structure between the first fin and the second fin, wherein the dielectric structure separates the gate structure into a first gate structure over the first fin and a second gate structure over the second fin, wherein the dielectric structure has an upper portion and a lower portion, the lower portion disposed between the upper portion and the substrate, wherein the lower portion extends beyond lateral extents of the upper portion along a longitudinal direction of the gate structure, wherein the lower portion of the dielectric structure contacts a top portion of the dummy fin.

19. The method of claim 18, wherein forming the dielectric structure comprises:
   forming a recess in the gate structure over the dummy fin; and
   filling the recess with a second dielectric material.

20. The method of claim 18, wherein the lower portion and the upper portion of the dielectric structure have a same width measured along a direction perpendicular to the longitudinal direction of the gate structure.

* * * * *